(12) United States Patent
Kim et al.

(10) Patent No.: US 9,287,004 B2
(45) Date of Patent: Mar. 15, 2016

(54) SEMICONDUCTOR MEMORY DEVICE AND SYSTEM HAVING REDUNDANCY CELLS

(71) Applicants: Su-a Kim, Seongnam-si (KR); Young-soo Sohn, Seoul (KR); Dae-hyun Kim, Hwaseong-si (KR)

(72) Inventors: Su-a Kim, Seongnam-si (KR); Young-soo Sohn, Seoul (KR); Dae-hyun Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 531 days.

(21) Appl. No.: 13/670,792

(22) Filed: Nov. 7, 2012

(65) Prior Publication Data

US 2013/0117602 A1    May 9, 2013

Related U.S. Application Data

(60) Provisional application No. 61/556,597, filed on Nov. 7, 2011.

(30) Foreign Application Priority Data

Aug. 27, 2012  (KR) ................ 10-2012-0093879
Aug. 27, 2012  (KR) ................ 10-2012-0093883

(51) Int. Cl.
| | |
|---|---|
| *G06F 11/20* | (2006.01) |
| *G06F 12/00* | (2006.01) |
| *G11C 29/04* | (2006.01) |
| *G11C 29/00* | (2006.01) |
| *G11C 7/10* | (2006.01) |

(52) U.S. Cl.
CPC .............. *G11C 29/04* (2013.01); *G11C 29/808* (2013.01); *G11C 29/81* (2013.01); *G11C 29/848* (2013.01); *G11C 7/1045* (2013.01)

(58) Field of Classification Search
CPC ........... G11B 20/1883; G11B 2220/20; G11B 2020/1893; G11C 29/44; G11C 29/4401; G11C 29/04; G11C 29/848; G11C 29/81; G11C 7/1045; G11C 29/808
USPC ........................................................ 714/710
See application file for complete search history.

(56) References Cited

U.S. PATENT DOCUMENTS

| | | |
|---|---|---|
| 5,371,706 A | 12/1994 | Krentz et al. |
| 5,473,573 A | 12/1995 | Rao |
| 5,583,822 A | 12/1996 | Rao |

(Continued)

OTHER PUBLICATIONS

U.S. Office Action dated Mar. 28, 2014 for related U.S. Appl. No. 13/670,822.

(Continued)

*Primary Examiner* — Albert Decady
*Assistant Examiner* — Kyle Vallecillo
(74) *Attorney, Agent, or Firm* — Harness, Dickey & Pierce, P.L.C.

(57) ABSTRACT

In one embodiment, the memory device includes a memory cell array having at least a first memory cell group, a second memory cell group and a redundancy memory cell group. The first memory cell group includes a plurality of first memory cells associated with a first data line, the second memory cell group includes a plurality of second memory cells associated with a second data line, and the redundancy memory cell group includes a plurality of redundancy memory cells associated with a redundancy data line. A data line selection circuit is configured to provide a data path between an input/output node and one of the first data line, the second data and the redundancy data line.

51 Claims, 50 Drawing Sheets

(56) References Cited

U.S. PATENT DOCUMENTS

| | | | |
|---|---|---|---|
| 5,659,509 A * | 8/1997 | Golla et al. | 365/200 |
| 5,747,869 A | 5/1998 | Prall et al. | |
| 6,141,267 A | 10/2000 | Kirihata et al. | |
| 6,243,306 B1 | 6/2001 | Kirihata | |
| 6,295,237 B1 * | 9/2001 | Pochmuller | 365/201 |
| 6,414,896 B1 | 7/2002 | Kim et al. | |
| 2001/0056557 A1 | 12/2001 | Kawagoe et al. | |
| 2002/0120887 A1 | 8/2002 | Hughes et al. | |
| 2004/0174764 A1 | 9/2004 | Matsuoka et al. | |
| 2004/0261049 A1 | 12/2004 | Mohr et al. | |
| 2006/0187721 A1 | 8/2006 | Freebern | |
| 2007/0030742 A1 | 2/2007 | Lunde et al. | |
| 2008/0259701 A1 | 10/2008 | Gajjewar et al. | |
| 2009/0103379 A1 | 4/2009 | Zhang et al. | |
| 2009/0273991 A1 * | 11/2009 | Song | 365/191 |
| 2009/0273992 A1 * | 11/2009 | Kim et al. | 365/193 |
| 2009/0303814 A1 | 12/2009 | Fekih-Romdhane | |
| 2011/0002179 A1 * | 1/2011 | Kim et al. | 365/193 |
| 2011/0035644 A1 * | 2/2011 | Madan | 714/758 |
| 2012/0195144 A1 | 8/2012 | Ide et al. | |
| 2013/0007544 A1 * | 1/2013 | Nemazie et al. | 714/723 |

OTHER PUBLICATIONS

U.S. Office Action dated Oct. 1, 2014 for related U.S. Appl. No. 13/670,822.

* cited by examiner

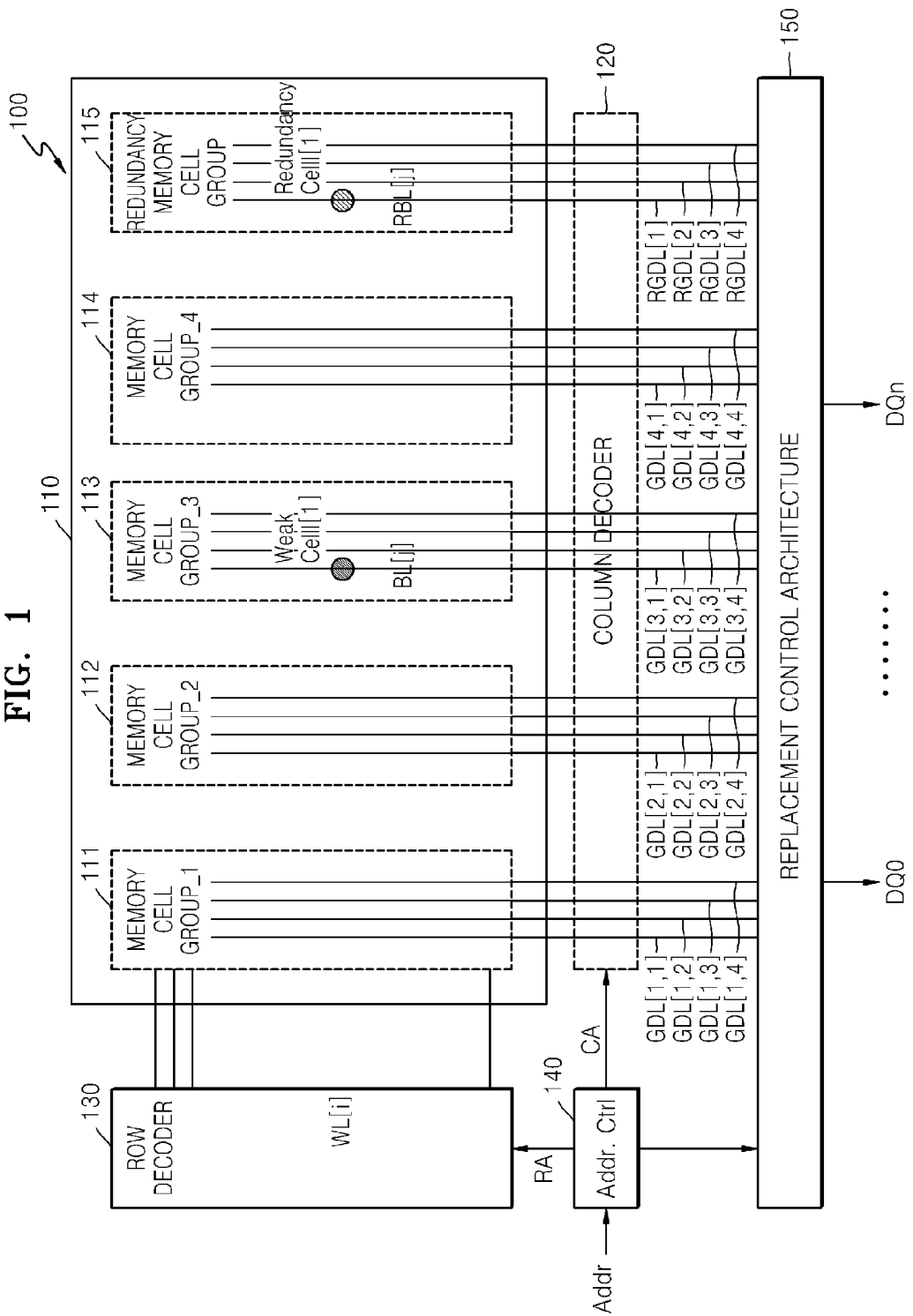

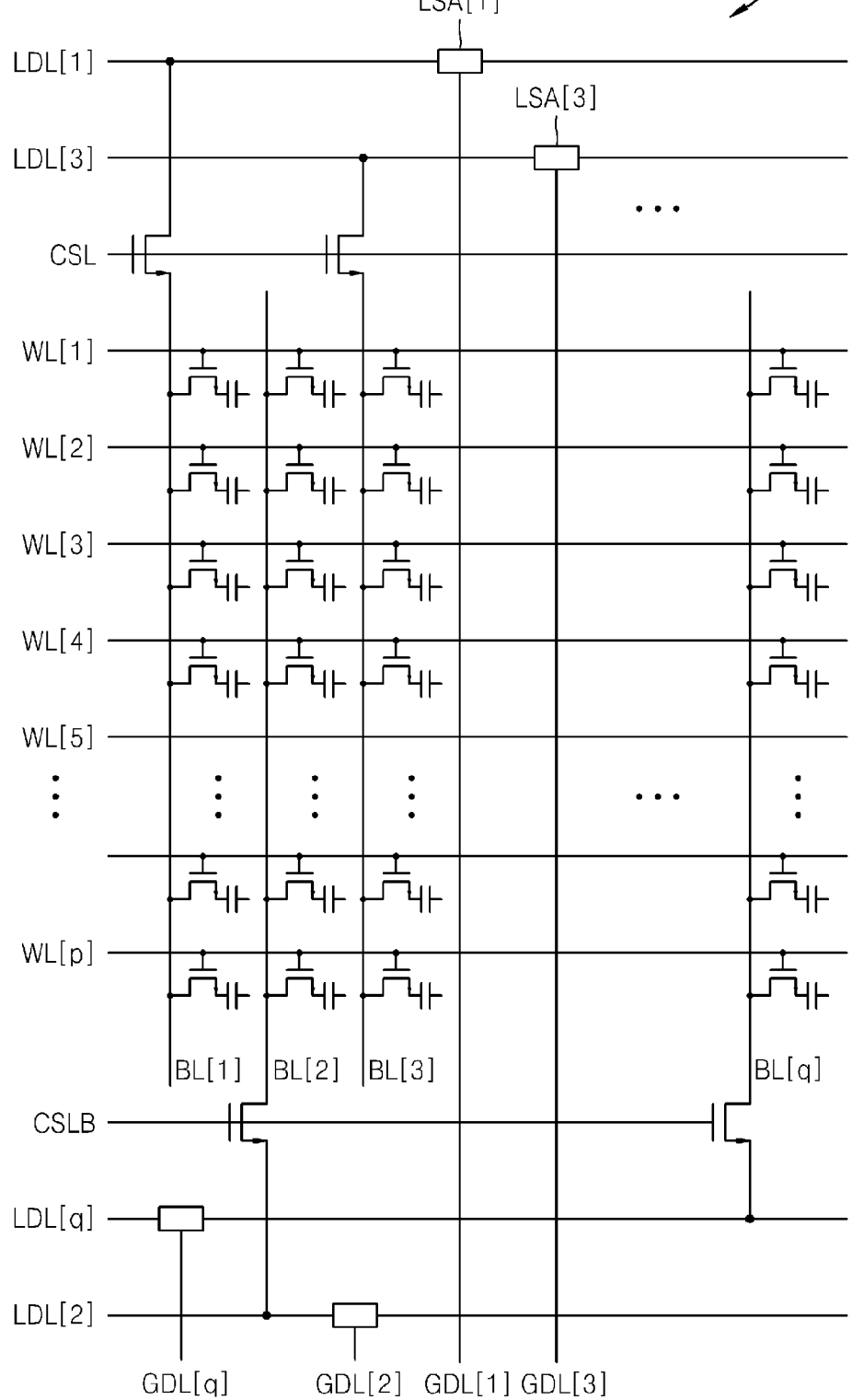

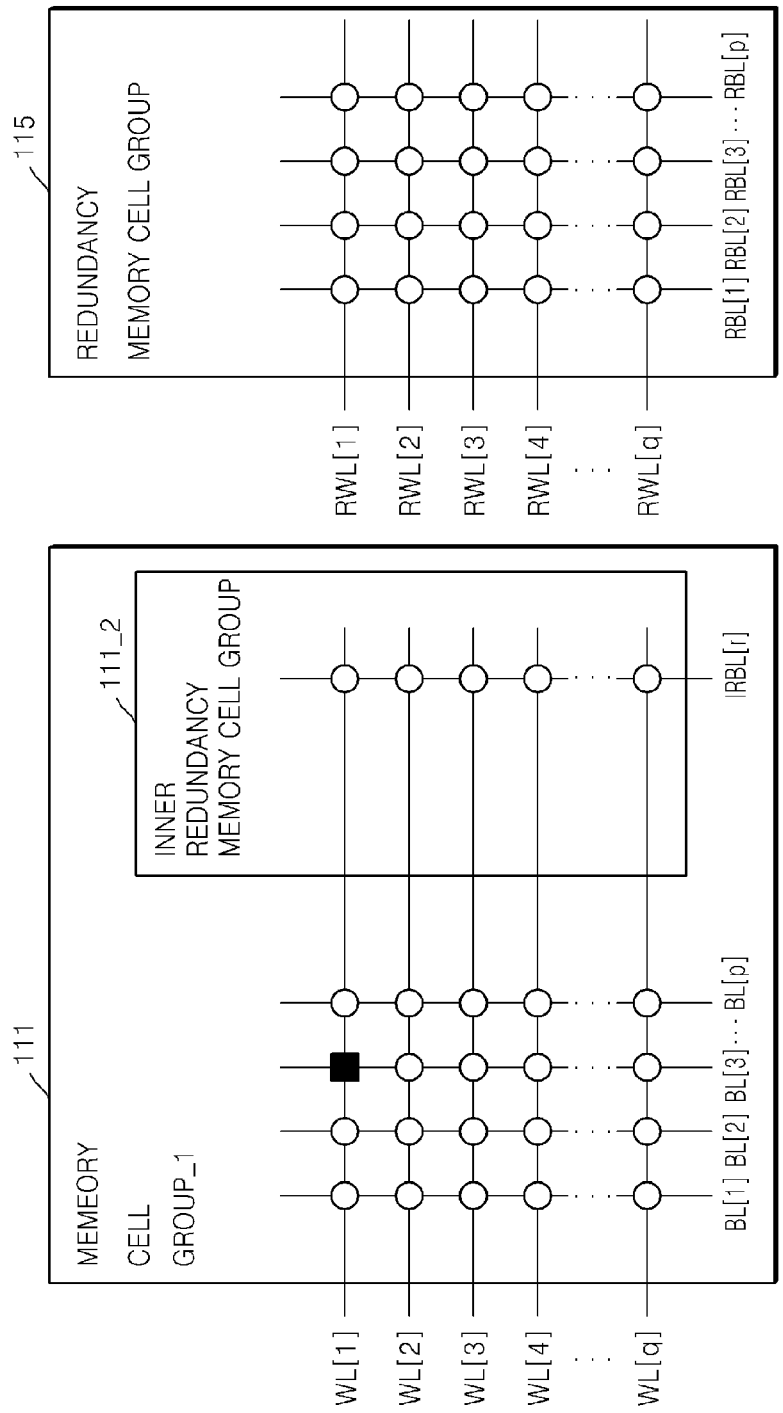

FIG. 7B

| Fail | SEL | | | | | | CONTROL CODE/SIGNAL | | | | | | | |
|------|----|----|------|----|----|----|-----|-----|-----|-----|-----|-----|-----|-----|
|      | MF | X4 | CA11 | F2 | F1 | F0 | DQ0 | DQ1 | DQ2 | DQ3 | DQ4 | DQ5 | DQ6 | DQ7 |
| None | 0  | –  | –    | –  | –  | –  | 0   | 0   | 0   | 0   | 0   | 0   | 0   | 0   |
| MCG1 | 1  | 0  | –    | 0  | 0  | 0  | 1   | 0   | 0   | 0   | 0   | 0   | 0   | 0   |
| MCG2 | 1  | 0  | –    | 0  | 0  | 1  | 1   | 1   | 0   | 0   | 0   | 0   | 0   | 0   |
| MCG3 | 1  | 0  | –    | 0  | 1  | 0  | 1   | 1   | 1   | 0   | 0   | 0   | 0   | 0   |
| MCG4 | 1  | 0  | –    | 0  | 1  | 1  | 1   | 1   | 1   | 1   | 0   | 0   | 0   | 0   |
| MCG5 | 1  | 0  | –    | 1  | 0  | 0  | 1   | 1   | 1   | 1   | 1   | 0   | 0   | 0   |
| MCG6 | 1  | 0  | –    | 1  | 0  | 1  | 1   | 1   | 1   | 1   | 1   | 1   | 0   | 0   |
| MCG7 | 1  | 0  | –    | 1  | 1  | 0  | 1   | 1   | 1   | 1   | 1   | 1   | 1   | 0   |
| MCG8 | 1  | 0  | –    | 1  | 1  | 1  | 1   | 1   | 1   | 1   | 1   | 1   | 1   | 1   |

FIG. 7C

| Fail | MF | X4 | CA11 | F2 | F1 | F0 | DQ0 | DQ1 | DQ2 | DQ3 | DQ4 | DQ5 | DQ6 | DQ7 |
|---|---|---|---|---|---|---|---|---|---|---|---|---|---|---|
| None | 0 | – | – | – | – | – | 0 | 0 | 0 | 0 | 0 | 0 | 0 | 0 |
| DQ0 | 1 | 1 | 0 | 0 | 0 | 0 | 1 | 0 | 0 | 0 | 0 | 0 | 0 | 0 |
| DQ1 | 1 | 1 | 0 | – | – | – | 0 | 0 | 0 | 0 | 0 | 0 | 0 | 0 |
| DQ2 | 1 | 1 | 0 | 0 | 1 | 0 | 1 | 0 | 1 | 0 | 0 | 0 | 0 | 0 |
| DQ3 | 1 | 1 | 0 | – | – | – | 0 | 0 | 0 | 0 | 0 | 0 | 0 | 0 |
| DQ4 | 1 | 1 | 0 | 1 | 0 | 0 | 1 | 0 | 1 | 0 | 1 | 0 | 0 | 0 |
| DQ5 | 1 | 1 | 0 | – | – | – | 0 | 0 | 0 | 0 | 0 | 0 | 0 | 0 |
| DQ6 | 1 | 1 | 0 | 1 | 1 | 0 | 1 | 0 | 1 | 0 | 1 | 0 | 1 | 0 |
| DQ7 | 1 | 1 | 0 | – | – | – | 0 | 0 | 0 | 0 | 0 | 0 | 0 | 1 |

(a)

| Fail | MF | X4 | CA11 | F2 | F1 | F0 | DQ0 | DQ1 | DQ2 | DQ3 | DQ4 | DQ5 | DQ6 | DQ7 |
|---|---|---|---|---|---|---|---|---|---|---|---|---|---|---|
| None | 0 | – | – | – | – | – | 0 | 0 | 0 | 0 | 0 | 0 | 0 | 0 |
| DQ0 | 1 | 1 | 1 | – | – | – | 0 | 0 | 0 | 0 | 0 | 0 | 0 | 0 |
| DQ1 | 1 | 1 | 1 | 0 | 0 | 1 | 0 | 1 | 0 | 0 | 0 | 0 | 0 | 0 |
| DQ2 | 1 | 1 | 1 | – | – | – | 0 | 0 | 0 | 0 | 0 | 0 | 0 | 0 |
| DQ3 | 1 | 1 | 1 | 0 | 1 | 1 | 0 | 1 | 0 | 1 | 0 | 0 | 0 | 0 |
| DQ4 | 1 | 1 | 1 | – | – | – | 0 | 0 | 0 | 0 | 0 | 0 | 0 | 0 |
| DQ5 | 1 | 1 | 1 | 1 | 0 | 1 | 0 | 1 | 0 | 1 | 0 | 1 | 0 | 0 |
| DQ6 | 1 | 1 | 1 | – | – | – | 0 | 0 | 0 | 0 | 0 | 0 | 0 | 0 |
| DQ7 | 1 | 1 | 1 | 1 | 1 | 1 | 0 | 1 | 0 | 1 | 0 | 1 | 0 | 1 |

(b)

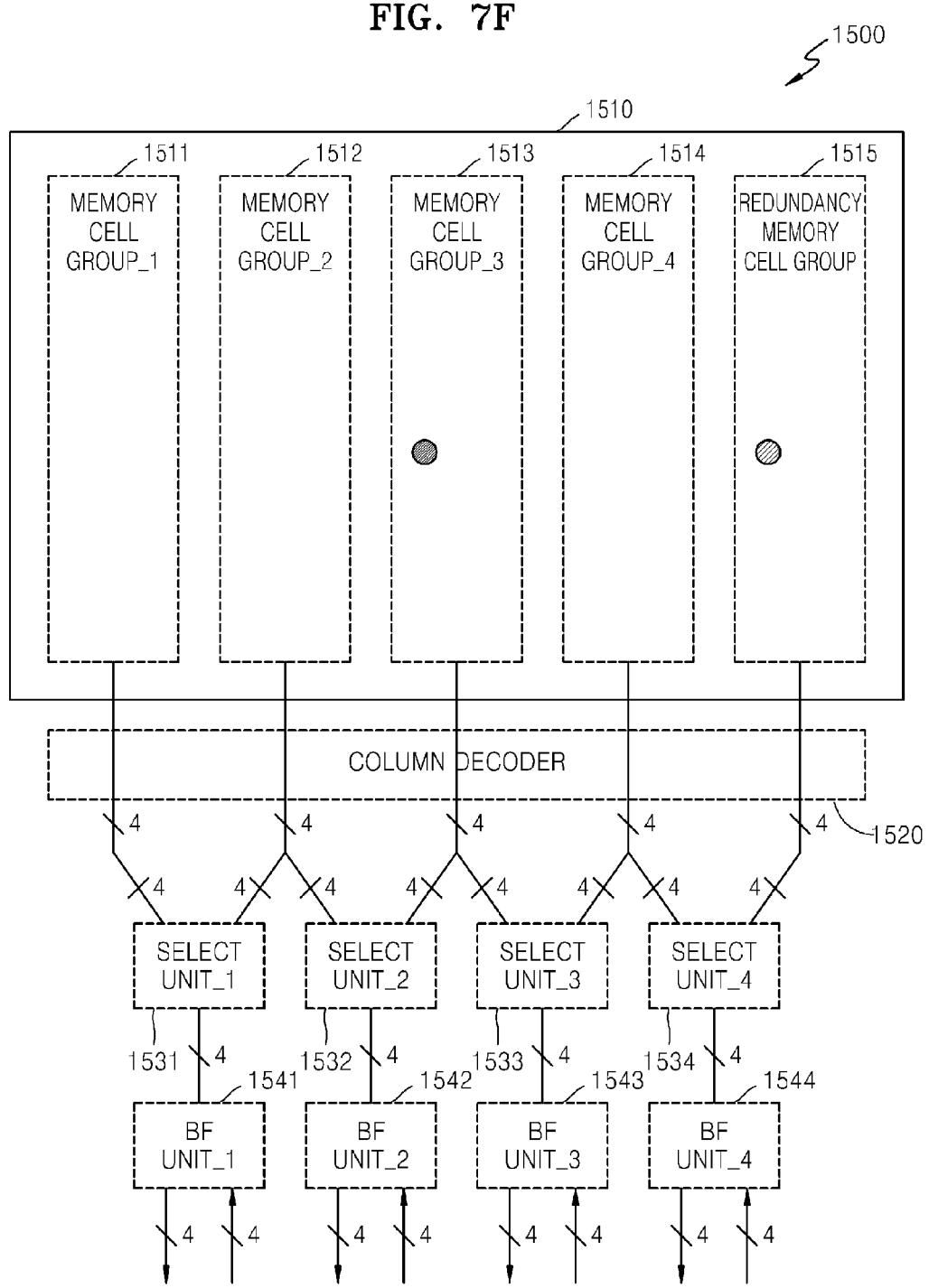

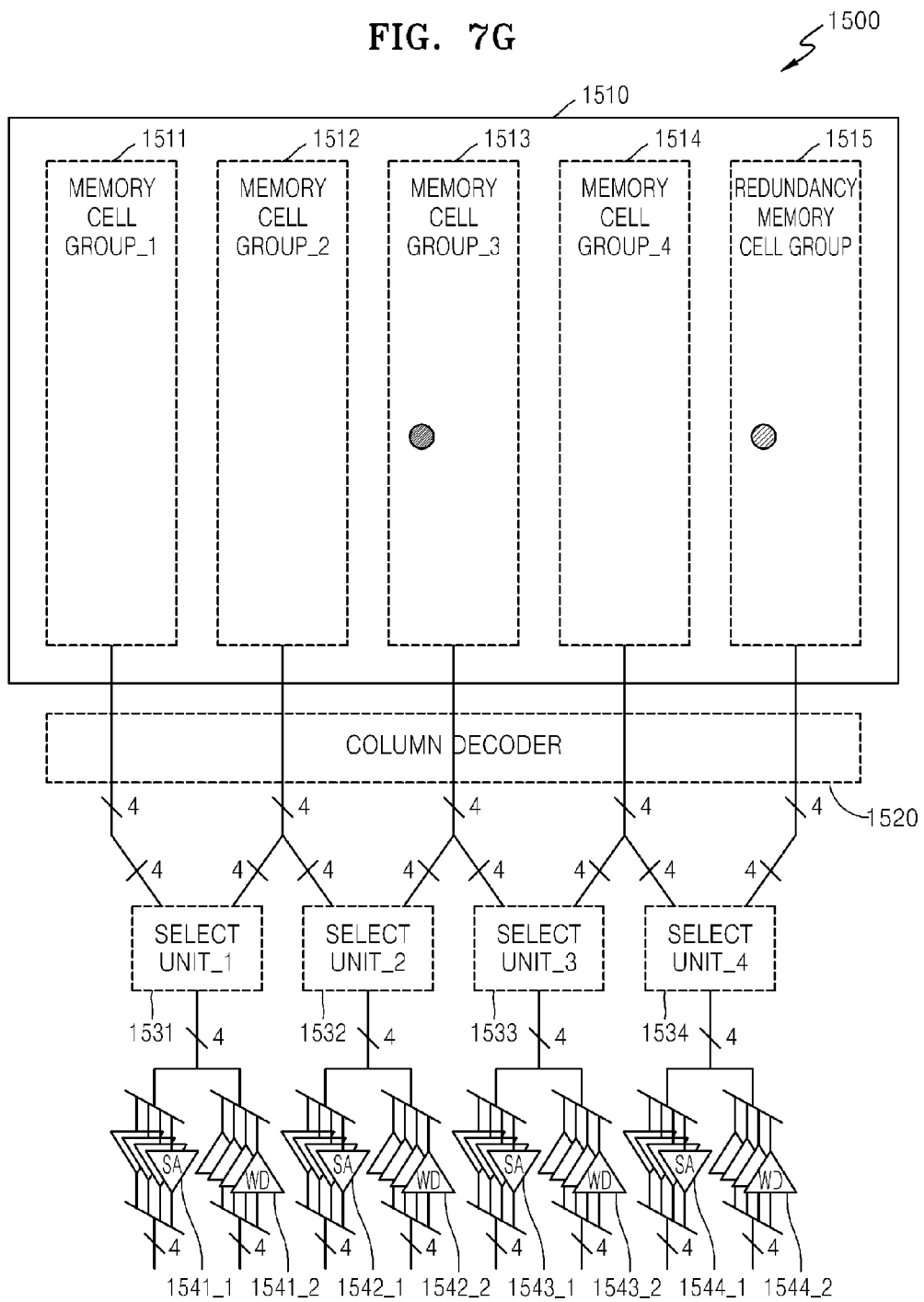

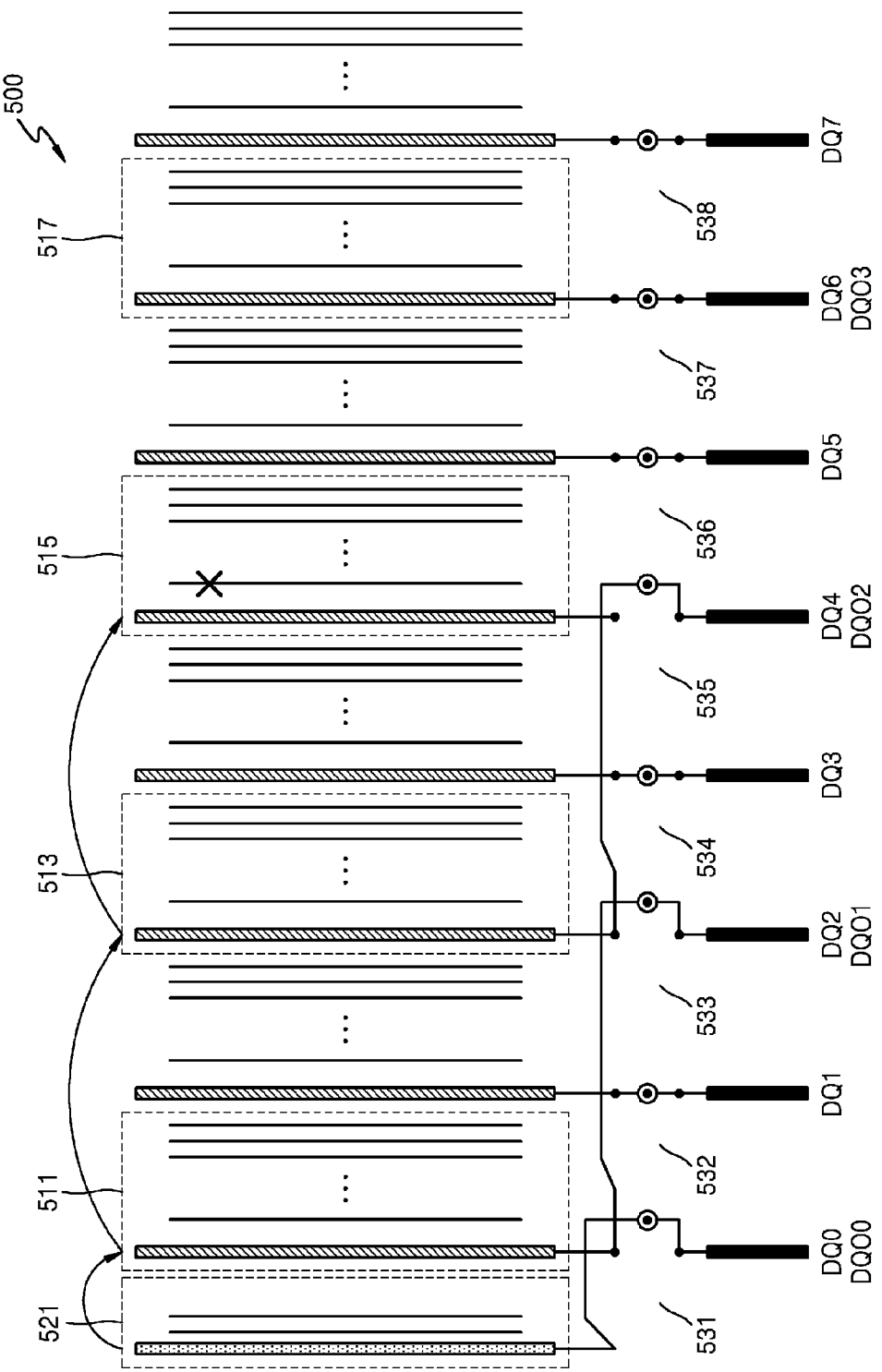

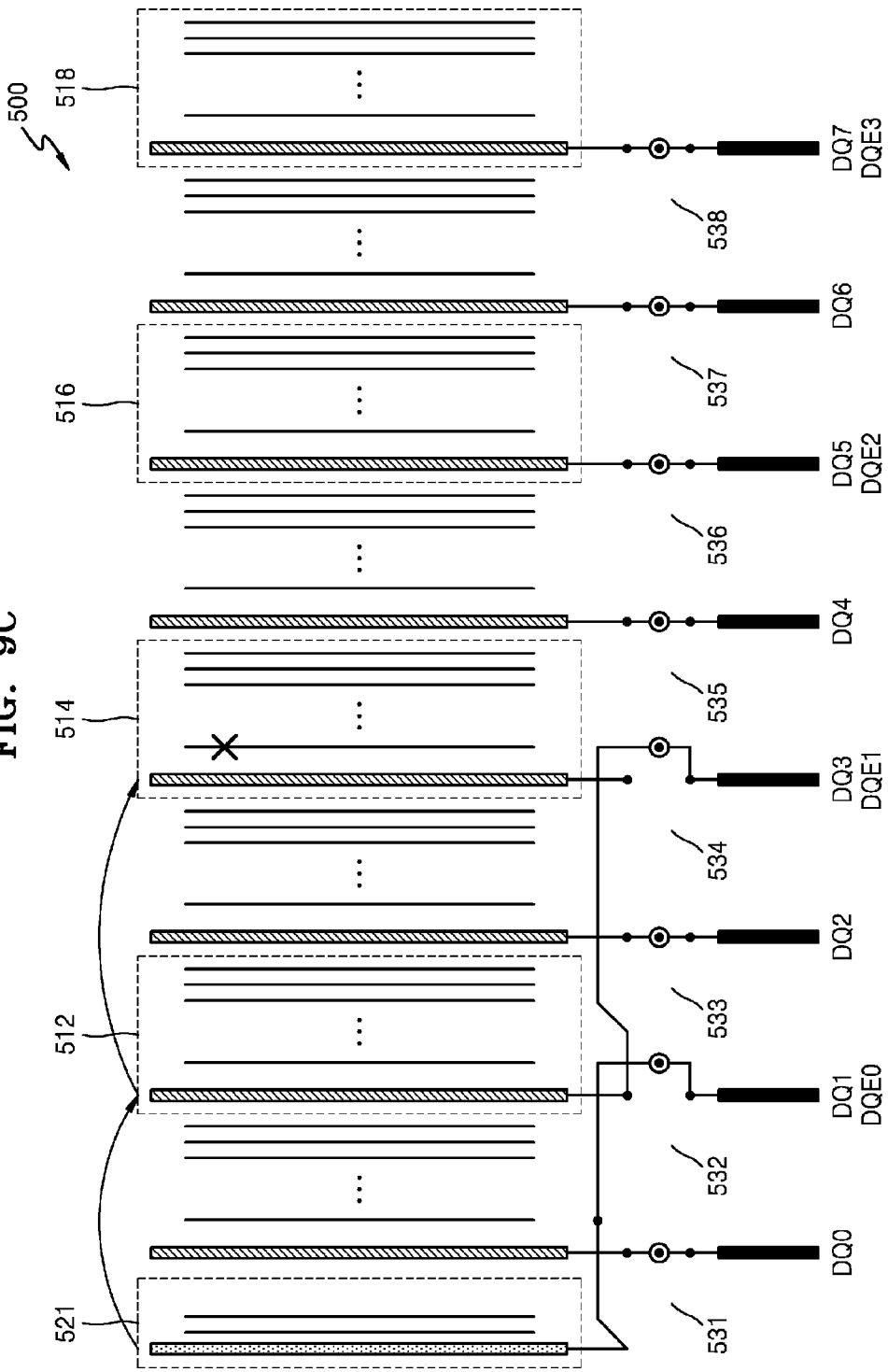

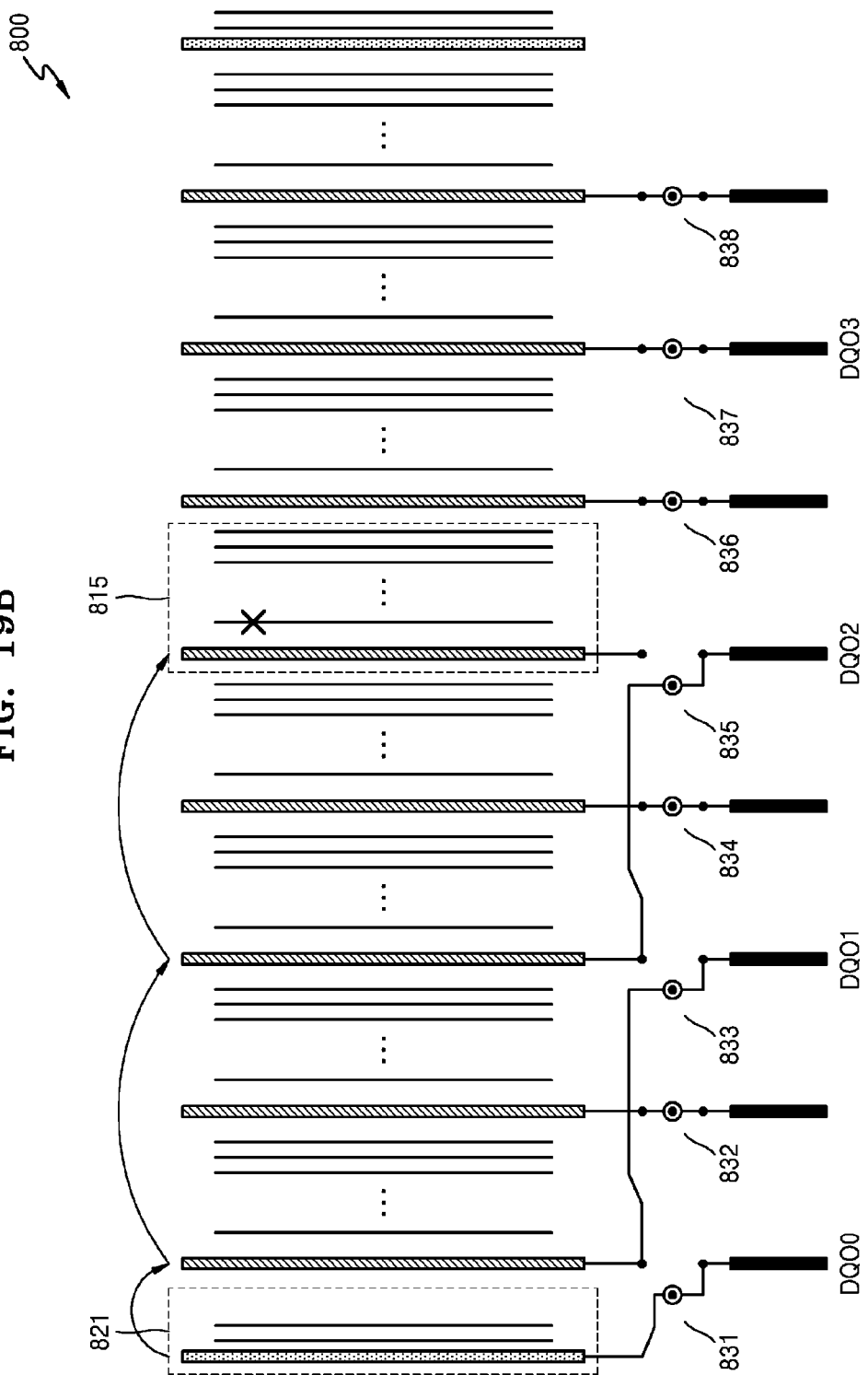

SEMICONDUCTOR MEMORY DEVICE AND SYSTEM HAVING REDUNDANCY CELLS

CROSS-REFERENCE TO RELATED APPLICATIONS

This application claims the benefit of U.S. Patent Application No. 61/556,597, filed on Nov. 7, 2011, in the US Patent Office and Korean Patent Nos. 10-2012-0093879 and 10-2012-0093883, filed on Aug. 27, 2012 and Aug. 27, 2012, in the Korean Intellectual Property Office, the disclosures of all of which are incorporated herein in their entirety by reference.

BACKGROUND

The inventive concepts relate to a semiconductor memory device, and more particularly, to a semiconductor memory device and/or system having redundancy cells, and/or methods associated therewith.

A consistent increase in the size of semiconductor memories has caused a gradual increase in a defective cell occurrence probability. According to the existing methods of repairing such a defective cell, when a defective cell occurrence probability increases, redundancy resources are limited due to the limitation in flexibility of a repair unit. In addition, if a group unit of redundancy cells replaced due to an increase in memory density is constant, the number of replaced redundancy cells increases, causing an increase in a chip size.

SUMMARY

At least one embodiment relates to a memory device.

In one embodiment, the memory device includes a memory cell array having at least a first memory cell group, a second memory cell group and a redundancy memory cell group. The first memory cell group includes a plurality of first memory cells associated with a first data line, the second memory cell group includes a plurality of second memory cells associated with a second data line, and the redundancy memory cell group includes a plurality of redundancy memory cells associated with a redundancy data line. A data line selection circuit is configured to provide a data path between an input/output node and one of the first data line, the second data and the redundancy data line.

In one embodiment, the memory device further includes selection control logic configured to control the data line selection circuit based on a selected output data width for the memory device.

In one embodiment, the selection control logic is configured to control the data line selection circuit based on the selected output data width for the memory device and whether a defective memory cell in one of the first and second memory cell groups is detected.

In one embodiment, memory device further includes selection control logic configured to control the data line selection circuit based on whether a defective memory cell in one of the first and second memory cell groups is detected.

In one embodiment, the data line selection circuit includes a multiplexer configured to provide a transfer path between the input/output node and one of the first data line, the second data line and the redundancy data line.

In one embodiment, the memory cell array includes first to nth memory cell groups, where n is greater than or equal to 2, each of the first to nth memory cell groups is associated with first to nth data lines. Here, the data line selection circuit is configured to provide data paths between (i) the redundancy data line and the first to nth data lines and (ii) first to nth input/output nodes. In one embodiment, the data line selection circuit includes first to nth selection units, each of the first to nth selection units configured to selectively provide a data path between a connection node and one of a set of selection nodes. The connection node of each of the first to nth selection units is associated with a respective one of the first to nth input/output nodes. The first selection unit has at least one selection node connected to the redundancy data line and has at least another selection node connected to the first data line. The second selection unit has one selection node connected to the redundancy data line, has at least another selection node connected to the first data line and has yet another selection node connected to the second data line. The ith selection unit has three selection nodes respectively connected to the (i−2)th data line, the (i−1th) data line and the ith data line where i is 3 to n. In one embodiment, selection control logic is configured to control the data line selection circuit based on the selected output data width for the memory device and whether a defective memory cell in one of the first to nth memory cell groups is detected.

For example, the selection control logic is configured to control the data line selection circuit to provide a data path between the ith memory cell group and the ith input/output node if the selected output data width is eight, wherein i is between 1 and 8. In one embodiment, the selection control logic is configured to replace access via one of the first to eighth data lines with access via the redundancy data line if a detected defective memory cell exists in the one of the first to eight memory cell groups. For example, if the kth memory cell group includes the detected defective memory cell, then the selection control logic is configured to control the data line selection circuit such that the first though kth input/output nodes are connected to the redundancy data line and the first through (k−1)th data lines, and the (k+1)th to the eighth input/output nodes are connected the (k+1)th to eighth data lines.

As another example, the selection control logic controls the data lines selection circuit to provide a data path between the mth data line and the mth input/output node if the selected output data width is four, wherein m is 1, 3, 5 and 7 in the odd operation mode and m is 2, 4, 6 and 8 in the even operation mode. For instance, the selection control logic is configured to replace access via one of the first, third, fifth and seventh data lines with access via the redundancy data line if a detected defective memory cell exists in the one of the first, third, fifth and seventh memory cell groups in the odd operation mode; and the selection control logic is configured to replace access via one of the second, fourth, sixth and eighth data lines with access via the redundancy data line if a detected defective memory cell exists in the one of the second, fourth, sixth and eighth memory cell groups in the even operation mode.

In another embodiment, the selection control logic is configured to control the data line selection circuit to provide a data path between the ith memory cell group and the ith input/output node if the selected output data width is sixteen, wherein i is between 1 and 16. For example, the selection control logic is configured to replace access via one of the first to sixteen data lines with access via the redundancy data line if a detected defective memory cell exists in the one of the first to sixteenth memory cell groups.

In a further embodiment, the selection control logic is configured to control the data line selection circuit to provide a data path between the ith memory cell group and the ith input/output node if the selected output data width is one of 32 and 64, wherein i is between 1 and one of 32 and 64. For example, the selection control logic is configured to replace access via one of the first to pth data lines with access via the redundancy data line if a detected defective memory cell exists in the one of the first to pth memory cell groups, where p is one of 32 and 64.

In one embodiment, the memory cell array includes first and second redundancy memory cell groups. The first redundancy memory cell group includes a plurality of first redundancy memory cells associated with a first redundancy data line, and the second redundancy memory cell group includes a plurality of second redundancy memory cells associated with a second redundancy data line. Here, the data line selection circuit is configured to provide data paths between (i) the first and second redundancy data lines and the first to nth data lines and (ii) the first to nth input/output nodes.

In one embodiment, each of the first to nth selection units includes a 3:1 multiplexer.

In one embodiment, at least one of the first to nth data lines is connected to a sense amplifier arranged in a lengthwise direction of the memory cell array, and the redundancy data lines is connected to a sense amplifier arranged in a widthwise direction of the memory cell array.

In one embodiment, memory device includes a memory cell array having at least first through nth memory cell groups and first and second redundancy memory cell groups, where n is greater than or equal to four. The first through nth memory cell groups are associated with respective first through nth data lines, the first redundancy memory cell group is associated with a first redundancy data line and the second redundancy memory cell group is associated with a second redundancy data line. A data line selection circuit is configured to replace access to one of the first through nth memory cell groups via a respective one of the first through nth data lines with access to the first redundancy memory cell group via the first redundancy data line; and the data line selection circuit is configured to simultaneously replace access to another of the first through nth memory cell groups via a respective one of the first through nth data lines with access to the second redundancy memory cell group via the second redundancy data line.

In one embodiment, the memory device further includes selection control logic configured to control the data line selection circuit based on the selected output data width for the memory device and whether a defective memory cell in one of the first to nth memory cell groups is detected.

In one embodiment, the selection control logic is configured to control the data line selection circuit to provide a data path between the ith memory cell group and the ith input/output node if the selected output data width is eight, wherein i is between 1 and 8, and n is at least 8.

In one embodiment, the selection control logic is configured to replace access via one of the first to mth data lines with access via the first redundancy data line if a detected defective memory cell exists in the one of the first to mth memory cell groups, and the selection control logic is configured to replace access via one of the (m+1)th to nth data lines via the second redundancy data if a detected defective memory cell exists in one of the (m+1)th to nth memory cell groups.

In one embodiment, the selection control logic controls the data lines selection circuit to provide a data path between the mth data line and the mth input/output node if the selected output data width is four, wherein m is 1, 3, 5 and 7 in the odd operation mode and m is 2, 4, 6 and 8 in the even operation mode.

In one embodiment, wherein the selection control logic is configured to simultaneously replace access via two of the first, third, fifth and seventh data lines with access via the first and second redundancy data lines if a detected defective memory cell exists in the two of the first, third, fifth and seventh memory cell groups in the odd operation mode; and the selection control logic is configured to replace access via two of the second, fourth, sixth and eighth data lines with access via the first and second redundancy data lines if a detected defective memory cell exist in the two of the second, fourth, sixth and eighth memory cell groups in the even operation mode.

In one embodiment, the selection control logic is configured to control the data line selection circuit to provide a data path between the ith memory cell group and the ith input/output node if the selected output data width is sixteen, wherein i is between 1 and 16, and n is at least 16.

In one embodiment, the selection control logic is configured to simultaneously replace access via two of the first to sixteen data lines with access via the first and second redundancy data lines if a detected defective memory cell exists in the one of the first to sixteenth memory cells.

In one embodiment, the selection control logic is configured to control the data line selection circuit to provide a data path between the ith memory cell group and the ith input/output node if the selected output data width is one of 32 and 64, wherein i is between 1 and one of 32 and 64, and n is at least one of 32 and 64.

In one embodiment, the selection control logic is configured to replace access via two of the first to pth data lines with access via the first and second redundancy data line if a detected defective memory cell exists in the one of the first to pth data lines, where p is one of 32 and 64.

In one embodiment, the data line selection circuit include first to nth selection units, each of the first to nth selection units associated with one of the first to nth input/output nodes, and each of the first to nth selection units includes a 3:1 multiplexer.

In one embodiment, at least one of the first to nth data lines is connected to a sense amplifier arranged in a lengthwise direction of the memory cell array, and at least one of the first to nth data lines is connected to a sense amplifier arranged in a widthwise direction of the memory cell array.

In one embodiment, memory device includes a memory array having a plurality of memory cell groups and a redundancy memory cell group. Each memory cell group is associated with a respective data line, and the redundancy memory cell group is associated with a redundancy data line. The memory device further includes a plurality of input/output nodes, and a data line selection circuit configured to provide data paths between the plurality of input/output nodes and the data lines and the redundancy data line. The data line selection circuit includes a selection unit associated with each of the plurality of input/output nodes. Each selection unit associated with only two of the redundancy data line and the data lines. The data line selection circuit configured to provide data paths between odd ones of the plurality of input/output nodes and odd ones of the data lines in an odd mode of operation, and configured to provide data paths between even ones of the plurality of input/output nodes and even ones of the data lines in an even mode of operation. The data line selection circuit configured to replace access via one of the data lines with access via the redundancy data line such that a detected defective memory cell in one of the plurality of memory cell groups is replaced with one of the plurality of redundancy memory cells regardless of the even and odd operating mode.

In one embodiment, the plurality of memory cell groups includes first to nth memory cell groups associated with first to nth data lines, the plurality of input/output nodes includes first to nth input/output nodes, and the plurality of selection units includes first to nth selection units. Each of the first to nth selection units configured to provide a data path between a connection node and one of two selection nodes. The connection node of each of the first to nth selection units is associated with a respective one of the first to nth input/output nodes. The first selection unit has one of the two selection nodes associated with the redundancy data line and another of the two selection nodes associated with the first data line. The second selection unit has one of the two selection nodes associated with the redundancy data line and another of the two selection nodes associated with the second data line. The ith selection unit has one of the two selection nodes associated with the (i−2)th data line and another of the two selection nodes associated with the ith data line.

In one embodiment, each of the first to nth selection units is a 2:1 multiplexer.

In one embodiment, the memory device includes an even/odd selection unit connected to the redundancy data line and configured to provide a data path between the redundancy data line and one of an even redundancy data line and an odd redundancy data line based on the even and odd operating mode. The first selection unit has one of the two selection nodes associated with the odd redundancy data line, and the second selection unit has one of the two selection nodes associated with the even redundancy data line.

In one embodiment, the even/odd selection unit includes a demultiplexer.

In one embodiment, the even/odd selection unit includes a first switch selectively connecting the redundancy data line and the odd redundancy data line, and the even/odd selection unit includes a second switch selectively connecting the redundancy data line and the even redundancy data line.

In one embodiment, the memory device includes selection control logic configured to control the data line selection circuit and the even/odd selection unit based on whether the even or odd operation mode has been selected.

In one embodiment, the selection control logic is configured to control the data line selection circuit based on whether the even or odd operation mode has been selected and whether a defective memory cell in one of the first to nth memory cell groups is detected.

In one embodiment, the selection control logic includes a storage device storing a mode indicator indicating whether the even or odd operation mode has been selected.

In one embodiment, the memory device includes selection control logic configured to control the data line selection circuit based on a selected output data width for the memory device and whether a defective memory cell in one of the first to nth memory cell groups is detected.

In one embodiment, the selection control logic controls the data lines selection circuit to provide a data path between the mth data line and the mth input/output node if the selected output data width is eight, and m is 1 to 8. Here, the selection control logic controls the data lines selection circuit to provide a data path between the kth data line and the kth input/output node if the selected output data width is four, wherein k is 1, 3, 5 and 7 in the odd operation mode and k is 2, 4, 6 and 8 in the even operation mode.

In one embodiment, the memory device includes a first memory cell array including a first plurality of memory cell groups and a first redundancy memory cell group. Each of the first plurality of memory cell groups is associated with respective first data lines, and the first redundancy memory cell group is associated with one of the first data lines. The memory device further includes a second memory cell array including a second plurality of memory cell groups and a second redundancy memory cell group. Each of the second plurality of memory cell group is associated with respective second data lines, and the second redundancy memory cell group is associated with one of the second data lines. The data line selection circuit is configured to selectively provide data paths between the first data lines and a first set of a plurality of input/output nodes, and is configured to selectively provide data paths between the second data lines and a second set of the plurality of input/output nodes. The data line selection circuit is configured to selectively replace a detected defective memory cell in the first plurality of memory groups with a redundancy memory cell in the second redundancy memory cell group.

In one embodiment, the memory device further includes a first column decoder associated with the first memory cell array, a second column decoder associated with the second memory cell array, and a row decoder associated with both the first and second memory cell array.

In one embodiment, the data line selection circuit includes a plurality of selection units. Each selection unit is associated with one of the plurality of input/output nodes, and at least one of the selection units is associated with an input/output node of the first set connected to at least one of the first data lines and connected to the second data line associated with the second redundancy memory cell group.

In one embodiment, at least one of the selection units associated with an input/output node of the second set is connected to at least one of the second data lines and connected to the first data line associated with the first redundancy memory cell group.

In one embodiment, the data line selection circuit is configured to selectively replace a detected defective memory cell in the second plurality of memory groups with a redundancy memory cell in the first redundancy memory cell group.

In one embodiment, the first set of the plurality of input/output nodes for the first array and the second set of the plurality of input/output nodes for the second array share same input/output nodes.

In one embodiment, the first and second memory cell arrays are on different chips.

At least one embodiment relates to system such as a computer system, memory card, electronic device, wireless phone, etc. including the memory device according to one of the example embodiments.

At least one embodiment relates to a method of replacing defective memory cells.

In one embodiment of a method, the method is applied to a memory cell array having at least a first memory cell group, a second memory cell group and a redundancy memory cell group. The first memory cell group includes a plurality of first memory cells associated with a first data line, the second memory cell group includes a plurality of second memory cells associated with a second data line, and the redundancy memory cell group includes a plurality of redundancy memory cells associated with a redundancy data line. The method includes providing a data path between an input/output node and one of the first data line, the second data and the redundancy data line.

In another embodiment of a method, the method is applied to a memory cell array having at least first through nth memory cell groups and first and second redundancy memory cell groups, where n is greater than or equal to four. The first through nth memory cell groups are associated with respective first through nth data lines, the first redundancy memory cell group is associated with a first redundancy data line and the second redundancy memory cell group is associated with a second redundancy data line. The method includes replacing access to one of the first through nth memory cell groups via a respective one of the first through nth data lines with access to the first redundancy memory cell group via the first redundancy data line; and simultaneously replacing access to another of the first through nth memory cell groups via a respective one of the first through nth data lines with access to the second redundancy memory cell group via the second redundancy data line.

In a further embodiment of a method, the method is applied to a memory array having a plurality of memory cell groups and a redundancy memory cell group. Each memory cell group is associated with a respective data line, and the redundancy memory cell group is associated with a redundancy data line. The method includes providing data paths between (1) a plurality of input/output nodes and (2) the data lines and the redundancy data line using a plurality of selection units. Each selection unit is associated with one of the plurality of input/output nodes, and each selection unit is associated with only two of the redundancy data line and the data lines. The providing includes providing data paths between odd ones of the plurality of input/output nodes and odd ones of the data lines in an odd mode of operation, providing data paths between even ones of the plurality of input/output nodes and even ones of the data lines in an even mode of operation, and replacing access via one of the data lines with access via the redundancy data line such that a detected defective memory cell in one of the plurality of memory cell groups is replaced with one of the plurality of redundancy memory cells regardless of the even and odd operating mode.

In a still further embodiment of a method, the method is applied to a first memory cell array and a second memory cell array. The first memory cell array includes a first plurality of memory cell groups and a first redundancy memory cell group. Each of the first plurality of memory cell groups is associated with respective first data lines, and the first redundancy memory cell group is associated with one of the first data lines. The second memory cell array includes a second plurality of memory cell groups and a second redundancy memory cell group. Each of the second plurality of memory cell groups is associated with respective second data lines, and the second redundancy memory cell group is associated with one of the second data lines. The method includes selectively replacing a detected defective memory cell in the first plurality of memory groups with a redundancy memory cell in the second redundancy memory cell group.

BRIEF DESCRIPTION OF THE DRAWINGS

Exemplary embodiments of the inventive concepts will be more clearly understood from the following detailed description taken in conjunction with the accompanying drawings in which:

FIG. 1 is a block diagram of a semiconductor memory device according to an embodiment of the inventive concepts;

FIG. 2 is a circuit diagram of a first memory cell group in the semiconductor memory device of FIG. 1;

FIGS. 3A to 3F are diagrams for describing methods of replacing a defective cell with a redundancy cell;

FIGS. 7A to 7C are a block diagram and tables for describing generation of a control signal for controlling a data line selection block;

FIGS. 7F and 7G are block diagrams of a semiconductor memory device according to another embodiment of the inventive concepts;

FIGS. 9A to 9C are circuit diagrams for describing operations of a semiconductor memory device of FIG. 8;

FIGS. 19A to 19C are circuit diagrams for describing operations of the semiconductor memory device of FIG. 18;

DETAILED DESCRIPTION OF THE EMBODIMENTS

Figure 3A:
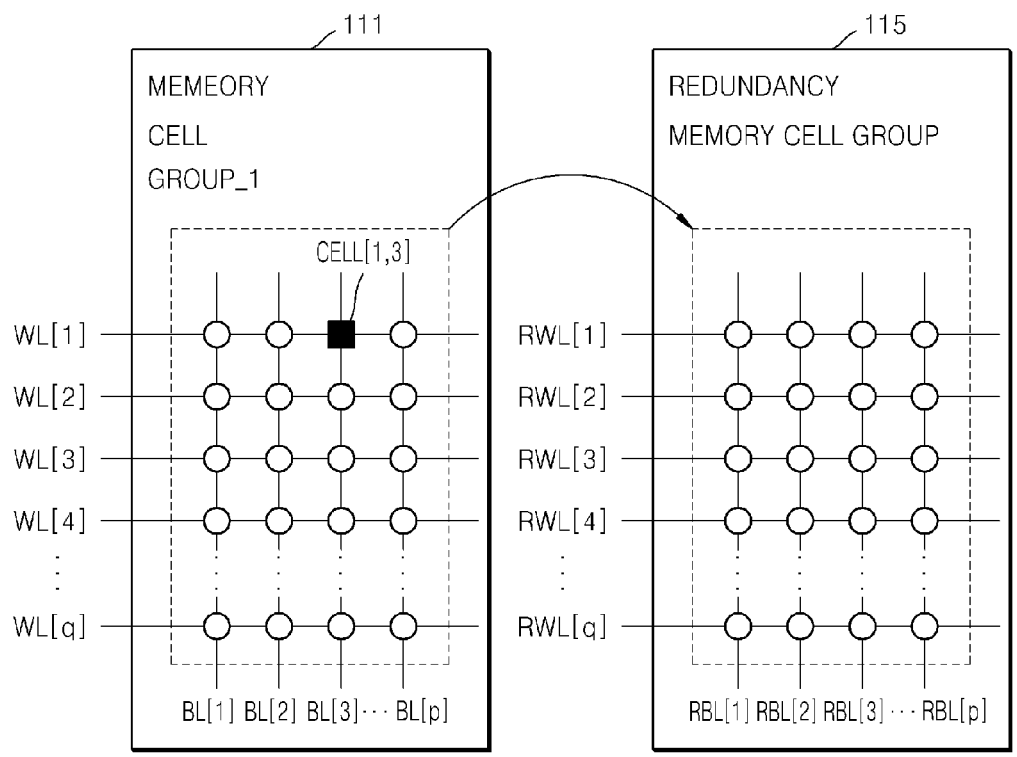

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring to FIG. 1, the semiconductor memory device 100 may include a memory cell array 110, a column decoder 120, a row decoder 130, an address controller 140, and replacement control architecture 150.

The semiconductor memory device 100 may be a dynamic random access memory (DRAM) device. However, the semiconductor memory device 100 is not limited thereto and may include a plurality of memories of different types, such as a random-access memory (RAM), a read only memory (ROM), a synchronous dynamic random access memory (SDRAM), a NAND flash memory, a NOR flash memory, a Phase-Change Random Access Memory (PRAM), a Magnetic Random Access memory (MRAM), a Resistive Random Access Memory (ReRAM), and a Ferroelectric Random Access Memory (FRAM), which may be provided as internal semiconductor integrated circuits in computers and other electronic devices.

The memory cell array 110 may include a plurality of memory cell groups. For example, the memory cell array 110 may include a first memory cell group 111, a second memory cell group 112, a third memory cell group 113, and a fourth memory cell group 114. The memory cell array 110 may further include a redundancy cell group 115.

A fault may occur in at least one of memory cells included in the first to fourth memory cell groups 111, 112, 113, and 114. In the specification, a defective cell may be referred to as a single bit or a weak cell. A weak cell in the first to fourth memory cell groups 111, 112, 113, and 114 may be replaced with a redundancy cell included in the redundancy cell group 115 by the replacement control architecture 150.

Each of the first to fourth memory cell groups 111, 112, 113, and 114 may be defined in various ways. For example, the memory cell array 110 may include a plurality of memory banks or memory blocks, wherein each of the first to fourth memory cell groups 111, 112, 113, and 114 may be defined as a memory bank or a memory block. Alternatively, each of the first to fourth memory cell groups 111, 112, 113, and 114 may be defined as an area for inputting and outputting data through a different data line. In detail, memory cells included in each of the first to fourth memory cell groups 111, 112, 113, and 114 may be connected to global data lines through bit lines (not shown) and local data lines (not shown). For example, data in memory cells included in the first memory cell group 111 may be transferred through first to fourth global data lines GDL[1,1], GDL[1,2], GDL[1,3], and GDL[1,4] in a first group. Likewise, data in memory cells included in the second memory cell group 112 may be transferred through first to fourth global data lines GDL[2,1], GDL[2,2], GDL[2,3], and GDL[2,4] in a second group, data in memory cells included in the third memory cell group 113 may be transferred through first to fourth global data lines GDL[3,1], GDL[3,2], GDL[3, 3], and GDL[3,4] in a third group, and data in memory cells included in the fourth memory cell group 114 may be transferred through first to fourth global data lines GDL[4,1] GDL[4,2], GDL[4,3], and GDL[4,4] in a fourth group.

Data in redundancy cells included in the redundancy cell group 115 may also be transferred through bit lines (e.g., redundancy bit lines (not shown)), local data lines (e.g., redundancy data lines (not shown)), and global data lines (e.g., first to fourth redundancy global data lines RGDL[1], RGDL[2], RGDL[3], and RGDL[4]). The same row and corresponding column as one of the accessed memory cell groups is accessed via the redundancy global bit lines RGBL. FIG. 1 shows an example in which the first to fourth redundancy global data lines RGDL[1], RGDL[2], RGDL[3], and RGDL[4] are arranged to correspond to the number of global data lines corresponding to each memory cell group 111, 112, 113, or 114. However, the number of global data lines and the number of redundancy global data lines are only illustrative, and the number of global data lines may also be changed in correspondence with the number of columns belonging to each memory cell group 111, 112, 113, or 114. For example, the first memory cell group 111 may be connected to 1, 2, 8, or more global data lines. Accordingly, the redundancy cell group 115 may be connected to 1, 2, 8, or more redundancy global data lines.

FIG. 2 is a circuit diagram of the first memory cell group 111 in the semiconductor memory device 100 of FIG. 1. The second to fourth memory cell groups 112, 113, and 114 may be configured in the same or similar manner to the first memory cell group 111 shown in FIG. 2. The redundancy cell group 115 may also be configured in the same or similar manner to the first memory cell group 111 shown in FIG. 2.

Referring to FIG. 2, the first memory cell group 111 may include memory cells connected to first to pth word lines WL[1], WL[2] WL[3]. WL[p] and first to qth bit lines BL[1] BL[2], BL[3] . . . , BL[q]. Writing to or reading from the first memory cell group 111 may be performed using a general semiconductor memory device write or read method. For example, the row decoder 130 decodes a row address RA input from the address controller 140. The decoded row address RA may enable the first to pth word lines WL[1] to WL[p] in the memory cell array 110. The column decoder 120 decodes a column address CA input from the address controller 140. The decoded column address CA may enable a selection operation of the first to qth bit lines BL[1] to BL[q] in the memory cell array 110 through a column selection line.

Data may be written or read by enabling the first to pth word lines WL[1] to WL[p] and the first to qth bit lines BL[1] to BL[q]. Data applied to the first to qth bit lines BL[1] to BL[q] is transferred to first to qth local data lines LDL[1], LDL[2], LDL[3] . . . , LDL[q] in response to a column selection operation, and data amplified by first to qth local sense amplifiers LSA[1], LSA[2], LSA[3] . . . , LSA[q] is transferred to first to qth global data lines GDL[1], GDL[2], GDL[3] . . . , GDL[q].

Data lines for transferring data in the redundancy cell group 115 may also have the local data line and global data line structure. Referring back to FIG. 1, data in the redundancy cell group 115 may be transferred through the first to fourth redundancy global data lines RGDL[1], RGDL[2], RGDL[3], and RGDL[4] over bit lines and redundancy local data lines connected to the redundancy cells. The local data lines connected to the first memory cell group 111 may be separated from the redundancy local data lines connected to the redundancy cell group 115, and the first to fourth global data lines GDL[1,1] to GDL[1,4] in the first group that are connected to the first memory cell group 111 may be separated from the first to fourth redundancy global data lines RGDL[1] to RGDL[4] connected to the redundancy cell group 115. According to an embodiment of the inventive concepts, a repair unit may be flexibly adjusted in relation to a range between single cell repair and cell group repair when a weak cell occurs, instead of repair of the entire bit lines or the entire word lines.

For example, as shown in FIG. 1, when a weak cell Weak Cell[1] occurs at an intersection of a word line WL[i] and a bit line BL[j], the weak cell Weak Cell[1] may be replaced with a redundancy cell Redundancy Cell[1]. That is, data to be written to or read from the weak cell Weak Cell[1] may be written to or read from the redundancy cell Redundancy Cell[1]. According to an embodiment of the inventive concepts, a repair operation of a weak cell is performed by arranging separate local data lines and global local data lines in correspondence with the redundancy cell group 115 and replacing a data line connected to the weak cell with a data line connected to a redundancy cell. For example, repair may be performed by replacement of a global data line. By doing so, only one redundancy cell group 115 may be arranged in correspondence with the first to fourth memory cell groups 111, 112, 113, and 114, and a bit unit repair or a group unit repair may be performed by using the redundancy cell group 115.

FIGS. 3A to 3F are diagrams for describing methods of replacing the Weak Cell[1] with the Redundancy Cell[1]. For convenience of description, only a case where a weak cell occurs in the first memory cell group 111 is described. The replacement control architecture 150 for effecting the replacement schemes of FIGS. 3A-3F will be described in detail after the description of the replacement schemes of FIGS. 3A-3F.

FIG. 3A is a diagram for describing replacement between memory cell groups. For example, when a weak cell CELL[1, 3] occurs in the first memory cell group 111, the first memory cell group 111 may be replaced with the redundancy cell group 115. That is, when the weak cell CELL[1, 3] occurs in the first memory cell group 111, an address with respect to the first memory cell group 111 including the weak cell CELL[1,3] may be processed by determining the address with respect to the first memory cell group 111 as an address with respect to the redundancy cell group 115. As will be appreciated, in this replacement scheme, normal or non-defective memory cells may be replaced along with the defective memory cell by redundancy memory cells.

Figure 3B:
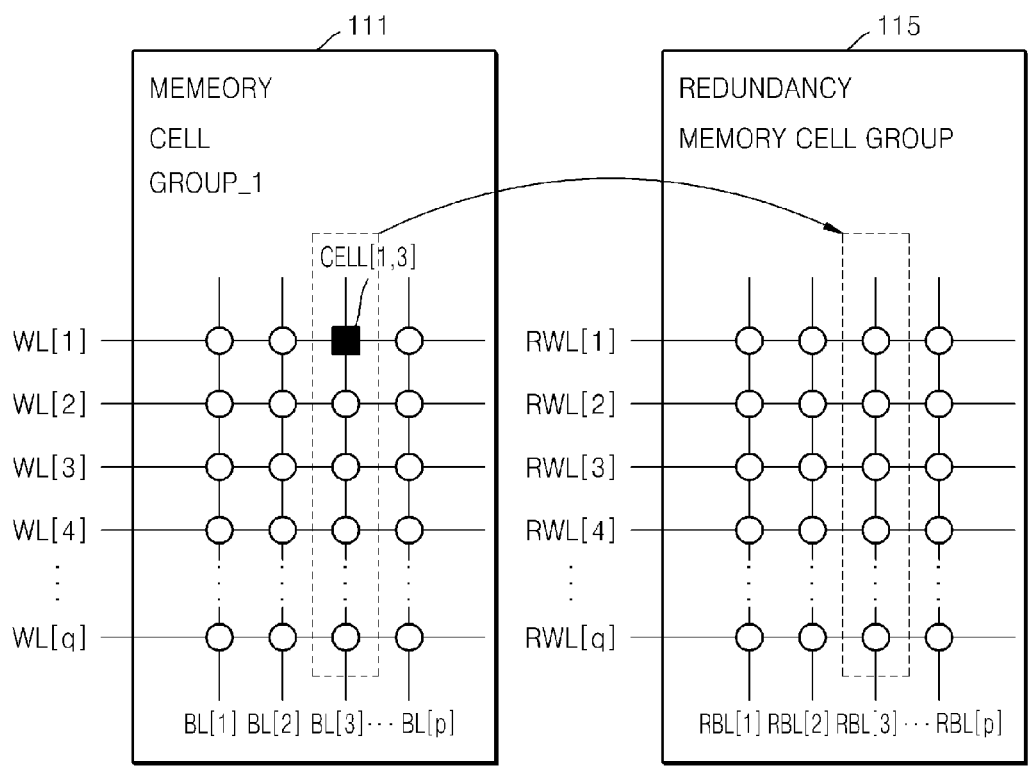

FIG. 3B is a diagram for describing replacement between bit lines. For example, when a fault occurs in the cell CELL[1, 3] connected to the third bit line BL[3] in the first memory cell group 111, cells connected to the third bit line BL[3] may be replaced with cells connected to one (e.g., a third redundancy bit line RBL[3]) of first to pth redundancy bit lines RBL[1] to RBL[q] connected to the redundancy cell group 115. That is, a column address CA with respect to the third bit line RBL[3] may be processed by determining the column address CA with respect to the third bit line RBL[3] as a column address CA with respect to one of the first to pth bit lines RBL[1] to RBL[q] connected to the redundancy cell group 115. As will be appreciated, in this replacement scheme, normal or non-defective memory cells may be replaced along with the defective memory cell by redundancy memory cells.

Figure 3C:
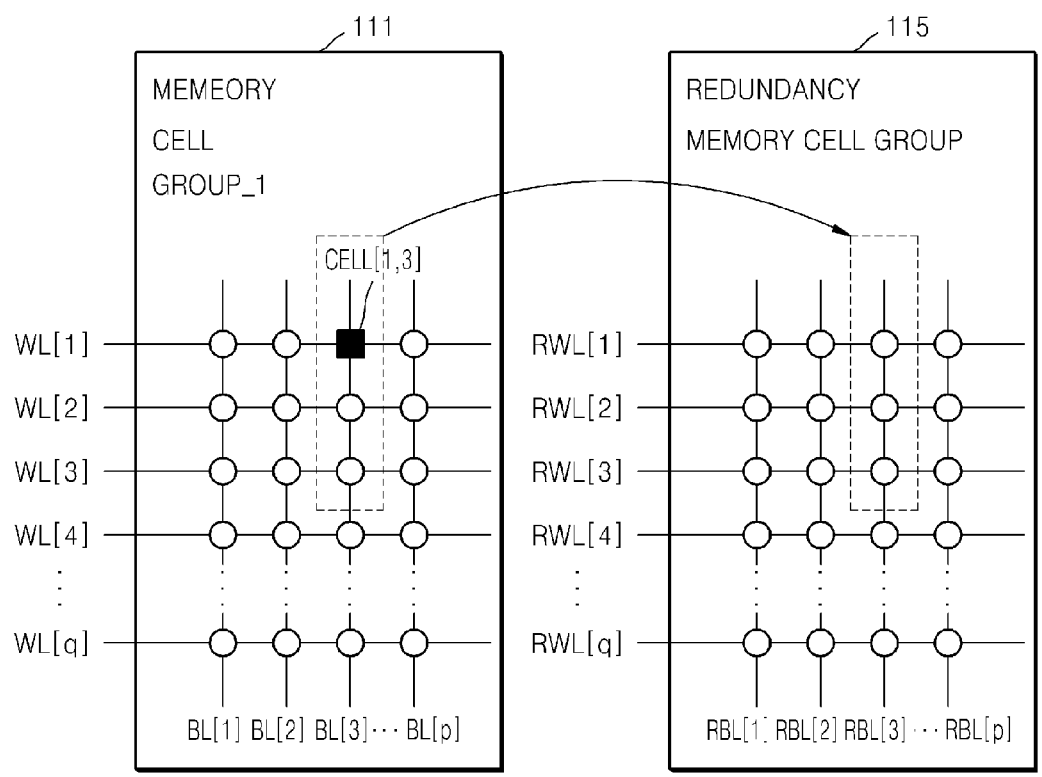

FIG. 3C is a diagram for describing replacement between portions of bit lines (e.g., segments of bit lines). A single bit line may be divided into two or more segments, each segment being connected to at least one memory cell. For example, the weak cell CELL[1, 3] occurs in a segment of cells connected to the third bit line RBL[3] in the first memory cell group 111, the segment of the cells connected to the third bit line RBL[3] that includes the weak cell CELL[1, 3] may be replaced with a segment of cells connected to one of the first to pth redundancy bit lines RBL[1] to RBL[q] connected to the redundancy cell group 115. In addition, when the weak cell CELL [1, 3] occurs in a specific segment of the third bit line RBL[3] in the first memory cell group 111, the segment in which the weak cell CELL[1, 3] has occurred may be replaced with a corresponding segment connected to one of the first to pth bit lines RBL[1] to RBL[q] connected to the redundancy cell group 115. That is, a column address CA with respect to the third bit line RBL[3] may be processed by determining the column address CA with respect to the third bit line RBL[3]

as a column address CA with respect to one of the first to pth bit lines RBL[1] to RBL[q] connected to the redundancy cell group 115 and determining at least some bits of a row address RA as word lines connected to the redundancy cell group 115. For example, when all bits of the row address RA are used for comparison, a segment may include one memory cell, and when the most significant bit (MSB) is ignored (don't care), a segment may include memory cells corresponding to half of memory cells connected to a single bit line. As will be appreciated, in this replacement scheme, normal or non-defective memory cells may be replaced along with the defective memory cell by redundancy memory cells. As will be further appreciated, the memory cells of the column not in the segment, may be accessed (read from and written to) in the normal manner.

Figure 3D:
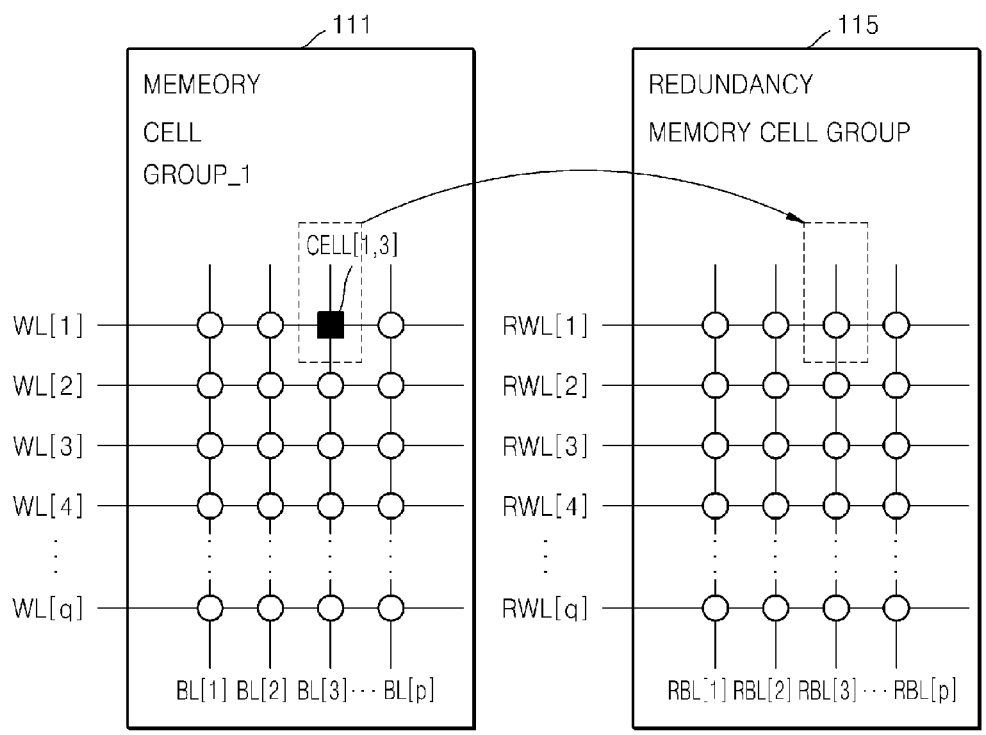

FIG. 3D is a diagram for describing replacement between memory cells. For example, when the weak cell CELL[1, 3] occurs in the first memory cell group 111, the weak cell CELL[1, 3] may be replaced with a redundancy cell. That is, repair may be performed in a single memory cell unit by determining and processing a column address CA and a row address RA with respect to the weak cell CELL[1, 3] as a column address CA and a row address RA with respect to a redundancy cell. As will be further appreciated, the memory cells of the column not selected for replacement, may be accessed (read from and written to) in the normal manner.

Figure 3E:
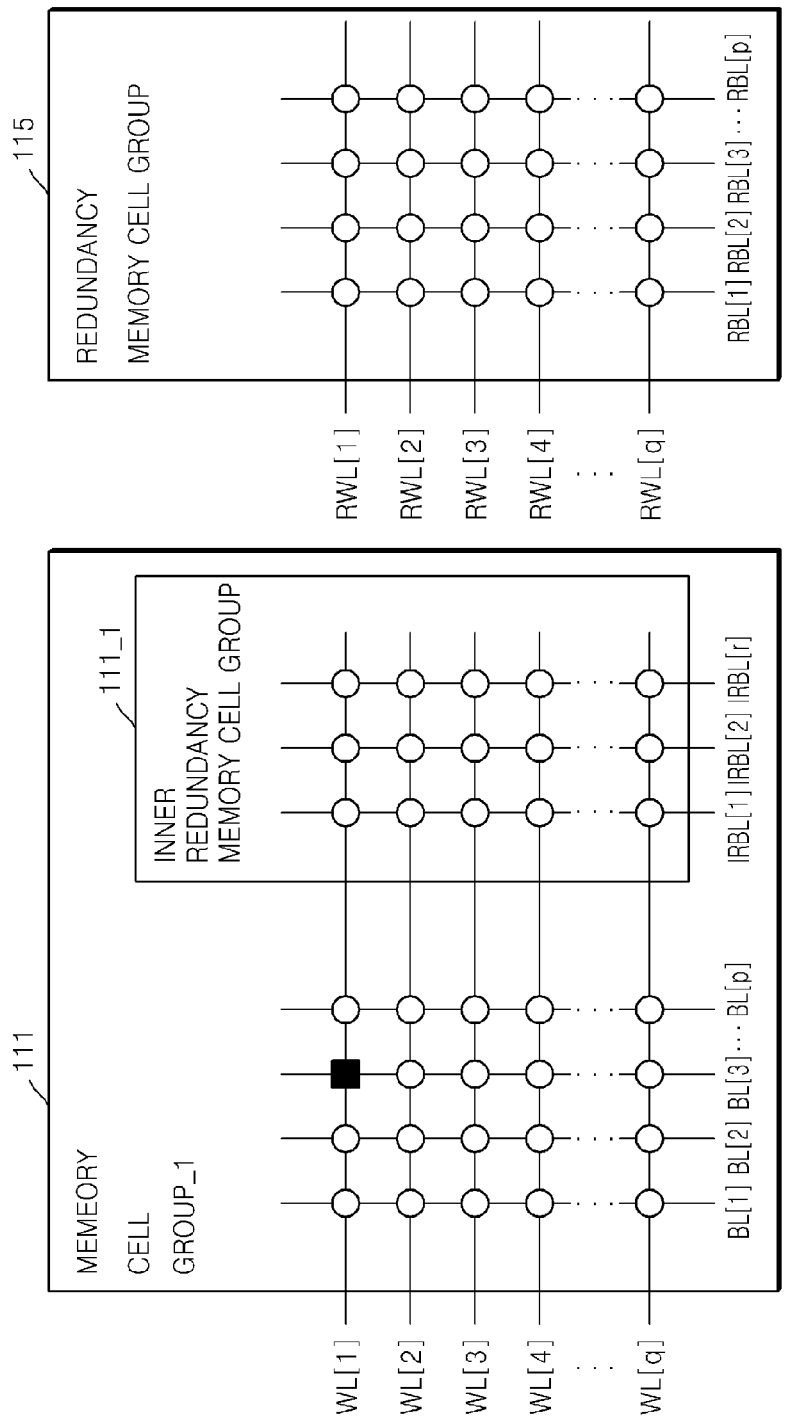

According to another embodiment of the inventive concepts, in the semiconductor memory device 100, an internal redundancy memory cell group for internally performing repair in each of the first to fourth memory cell groups 111, 112, 113, and 114 may be included in the first to fourth memory cell groups 111, 112, 113, and 114, and the separate redundancy memory cell group 115 may be arranged for repair with respect to the first to fourth memory cell groups 111, 112, 113, and 114. For example, as shown in FIG. 3E, the first memory cell group 111 may include an internal redundancy memory cell group 111_1 therein, and first to rth redundancy bit lines IRBL[1] to IRBL[r] may be arranged in correspondence with the internal redundancy memory cell group 111_1. Accordingly, weak cells in the first memory cell group 111 may be first repaired by using the internal redundancy memory cell group 111_1 included in the first memory cell group 111, and when additional weak cells occur, repair using the redundancy memory cell group 115 may be performed.

Similarly, as shown in FIG. 3F, the first memory cell group 111 may include an internal redundancy memory cell group 111_2 therein, and the internal redundancy memory cell group 111_2 may include redundancy cells connected to a single redundancy bit line IRBL[r].

The repair operations of a weak cell that are shown in FIGS. 3E and 3F may be performed in various ways. For example, in FIG. 3E, the first to rth redundancy bit lines IRBL[1] to IRBL[r] in the internal redundancy memory cell group 111_1 may be connected to the same data lines (e.g., local data lines) as the first to pth bit lines BL[1] to BL[q] in the first memory cell group 111, and repair may be performed by replacement in a group unit of one or more bit lines. In addition, the redundancy memory cell group 115 may be connected to separate data lines (e.g., local data lines and global data lines), and repair may be performed by replacement in a data line (e.g., global data line) unit with the first memory cell group 111. However, this is only illustrative, and separate data lines may be arranged in correspondence with the internal redundancy memory cell group 111_1, and repair may be performed by replacement in a data line unit.

With respect to the above discussed replacement schemes, it will be understood that the example embodiments are not limited to a memory cell array having four memory cell groups as shown in FIG. 1. Instead, more or less than four memory cell groups may be included in the memory cell array.

Figure 4:
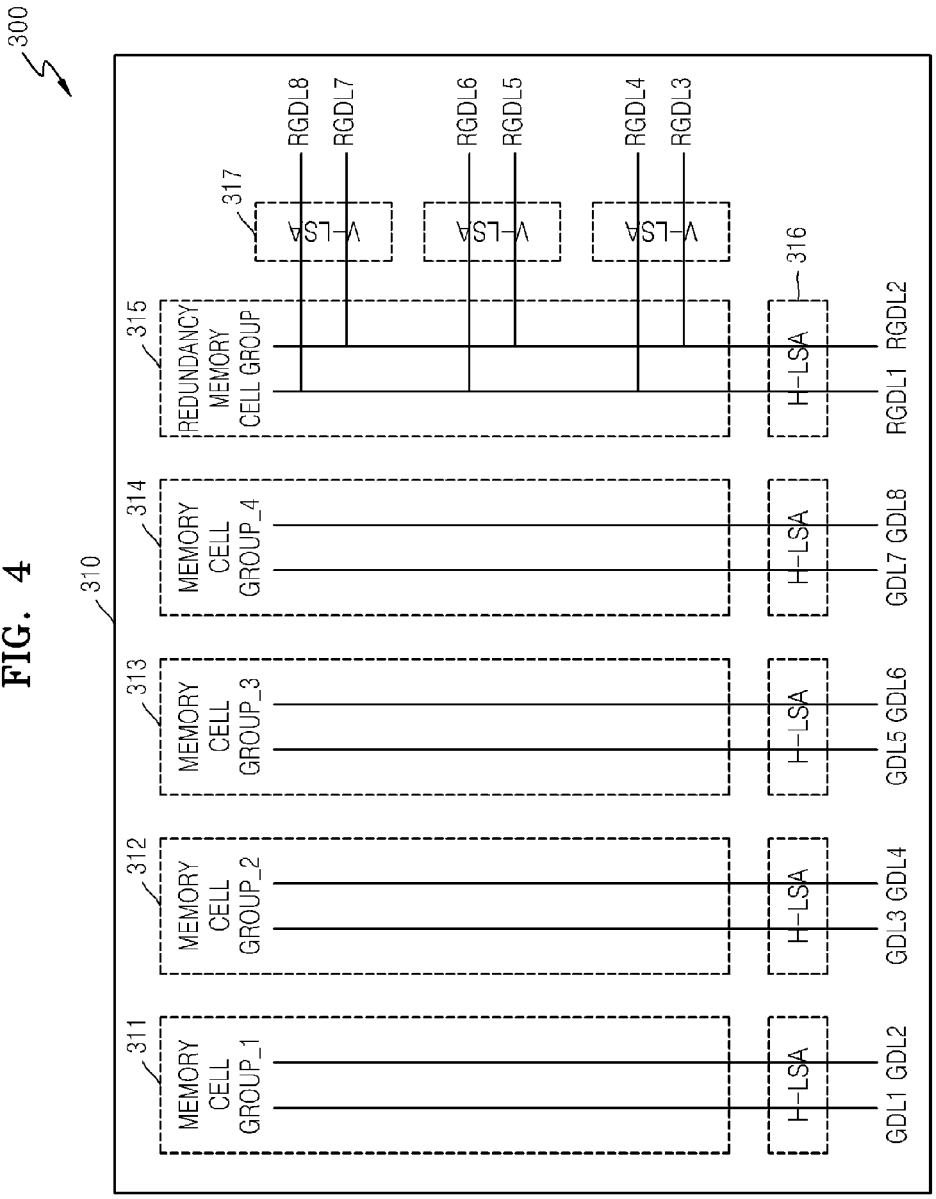
FIG. 4 is a block diagram of a memory array according to another embodiment of the inventive concepts.

FIG. 4 is a block diagram of a memory array according to another embodiment of the inventive concepts, which may be combined with any of the embodiments described herein. As shown in FIG. 4, a memory cell array 310 has a plurality of memory cell groups, e.g., first to fourth memory cell groups 311 to 314, and a redundancy memory cell group 315.

Referring to FIG. 4, each of the first to fourth memory cell groups 311 to 314 may be connected to at least one global data line, and for example, the first memory cell group 311 is connected to first and second global data lines GDL1 and GDL2, the second memory cell group 312 is connected to third and fourth global data lines GDL3 and GDL4, the third memory cell group 313 is connected to fifth and sixth global data lines GDL5 and GDL6, and the fourth memory cell group 314 is connected to seventh and eighth global data lines GDL7 and GDL8. The first to eighth global data lines GDL1 to GDL8 are connected to local data lines (not shown) via local sense amplifiers (LSA). A plurality of horizontal LSAs (H-LSAs) 316 may be horizontally arranged in a lengthwise direction of the memory cell array 310 (e.g., a width direction in FIG. 4), and the first to eighth global data lines GDL1 to GDL8 may be connected to the plurality of H-LSAs 316.

The redundancy memory cell group 315 may be connected to at least one redundancy global data line, and for example, FIG. 4 shows that first to eighth redundancy global data lines RGDL1 to RGDL8 are connected to the redundancy memory cell group 315. According to the current embodiment, redundancy local data lines and redundancy global data lines may be arranged in correspondence with the redundancy memory cell group 315, and accordingly, LSAs corresponding to the first to eighth redundancy global data lines RGDL1 to RGDL8 may be arranged.

Since the redundancy memory cell group 315 has a smaller area than the other memory cell groups 311 to 314, an area for arranging the LSAs may be limited. Therefore, at least one vertical LSA (V-LSA) 317 may be further arranged in a width-wise direction of the memory cell array 310 (e.g., a vertical direction in FIG. 4) in addition to the H-LSA 316 in correspondence with the redundancy memory cell group 315. Accordingly, a space overhead for arranging the LSAs may be minimized.

Figure 5:
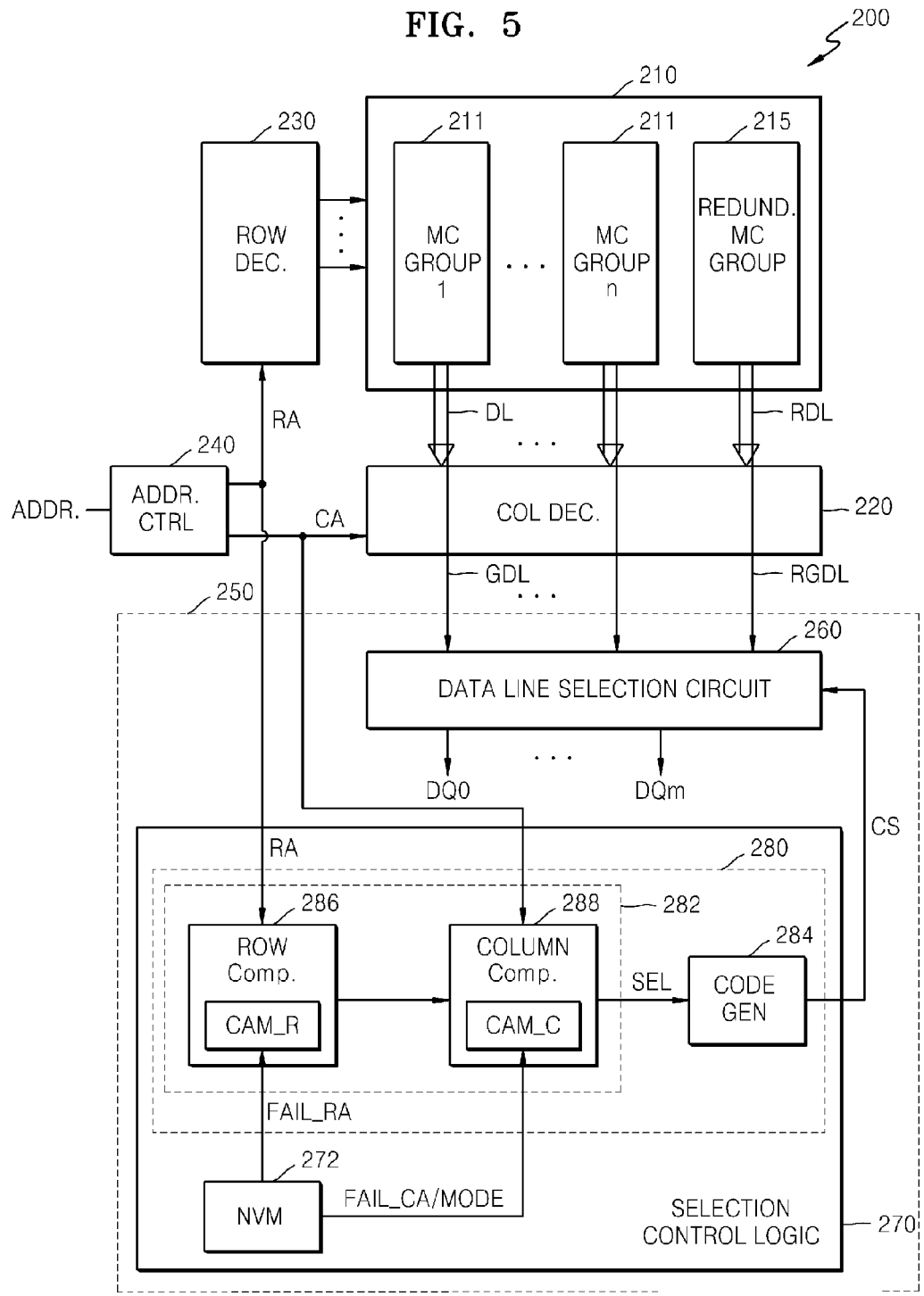
FIG. 5 is a block diagram of a semiconductor memory device according to another embodiment illustrating the replacement control architecture in detail.

FIG. 5 is a block diagram of a semiconductor memory device according to another embodiment that illustrates the replacement control architecture in detail.

Referring to FIG. 5, the semiconductor memory device 200 may include a memory cell array 210, a column decoder 220, a row decoder 230, an address controller 240, and replacement control architecture 250. Other components that may be included in the semiconductor memory device 200 are not shown.

The memory cell array 210 may be configured in the same or similar manner to the memory cell array 110 shown in FIG. 1. For example, the memory cell array 210 may include n memory cell groups 211 and may further include a redundancy memory cell group 215 for repairing weak cells occurring in the n memory cell groups 211. Here, n may be one or greater than one (e.g., 4, 8, 16, 32, 64 . . . ).

The address controller 240 receives an address Adds from the outside and outputs a row address RA and a column address CA based on the received address Addr. The row decoder 230 decodes the row address RA to activate a word line of the memory cell array 210. The column decoder 220 decodes the column address CA to connect data lines of the memory cell groups 211 and the redundancy memory cell group 215 to respective global data lines and redundancy global data lines.

The replacement control architecture 250 includes a data line selection circuit 260 and selection control logic 270. The data line selection circuit 260 provides data paths between (1) global data lines and redundancy global data lines and (2) input/output nodes of the memory device. The input/output nodes DQ may be well-known input/output pads DQ0 . . . DQm as shown in FIG. 5. Here, m may be one or greater than one (e.g., 2, 4, 8, 16, 32, 64, etc.). Also, m may be equal to or different from n. Example embodiments of the data line selection circuit 260 will be described in greater detail below.

The selection control logic 270 includes a non-volatile memory 272 and control signal generation logic 280. The non-volatile memory 272 stores address information for defective cells in the memory array 210 and mode information. The mode information indicates the operating mode of the memory device 200 such as the data width (X8, X4 even, X4 odd, etc.). The address information includes row address information and column address information identifying rows and columns in the memory cell groups 211 including defective memory cells. For example, for single defective cell replacement as shown in FIG. 3D, the row and column address of the defective memory cell may be stored. For the partial column replacement scheme shown in FIG. 3C, bits of the row address may be dropped from the stored row address to expand the number of rows being addressed. For example, dropping the most significant row address bit results in half the column including the defective memory cell being designated. For column replacement as shown in FIG. 3B, "don't care" row address would be stored. And, for group replacement, the columns of the group, and "don't care" row addresses would be stored. Accordingly, by programming the non-volatile memory with address information, the replacement scheme is programmable and may be flexibly changed. For instance, single cell replacement may be used for one memory cell group, but partial column replacement used with another memory cell group. While the nonvolatile memory 260 is shown as part of the selection control logic 270, the nonvolatile memory 260 may be outside the semiconductor memory device 200 (e.g., a module board on which the semiconductor memory device 200 is mounted). Also, the non-volatile memory 260 may include nonvolatile storage devices, such as a fuse array and an anti-fuse array.

As shown in FIG. 5, the control signal generation logic 280 includes a comparator 282 and a code generator 284. The comparator 282 includes a row comparator 286 and a column comparator 288. The row comparator 286 includes a row address content addressable memory CAM_R, which may be one or more registers. During, for example start-up of the memory device, the non-volatile memory 272 loads the row address information FAIL_RA into the row address content addressable memory CAM_R. The row comparator 286 compares the row address from the address controller 240 with the row address information to determine whether the addressed row from the address controller 240 is included in the row address information. The row comparator 286 enables operation of the column comparator 288 if a positive determined is made.

The column comparator 288 includes a column address content addressable memory CAM_C, which may be one or more registers. During, for example start-up of the memory device, the non-volatile memory 272 loads the column address information FAIL_CA into the column address content addressable memory CAM_C. The non-volatile memory 272 also loads the mode information into the column address content addressable memory CAMS. If the row comparator 286 makes a positive determination, the column comparator 288 compares the column address from the address controller 240 with the column address information to determine whether the addressed column from the address controller 240 is included in the column address information. If a positive determination is made, the column comparator 288 generates a selection signal SEL associated therewith. The selection signal and its generation will be described in greater detail below after the description of the data line selection circuit 260. The control code generator 284 generates the control signal or code based on the selection signal. The control code generator 284 will be described in greater detail below after the description of the data line selection circuit 260.

The data line selection circuit 260 will now be described in greater detail with respect to FIGS. 6A-6D.

Figure 6A:
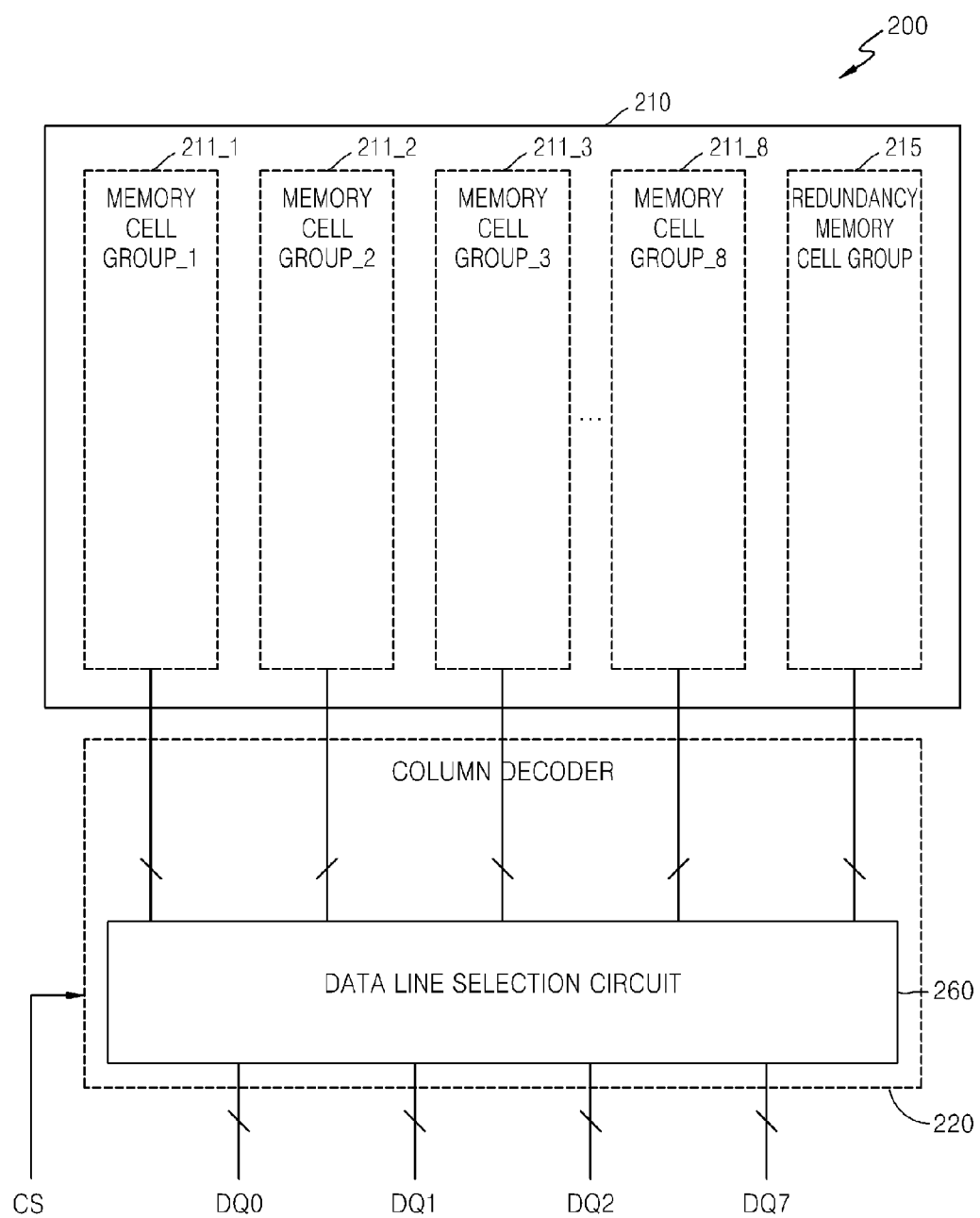
FIGS. 6A to 6D are block diagrams of a semiconductor memory device for describing the data line selection circuit in greater detail.

Referring to FIG. 6A, the semiconductor memory device 200 will be described as having the memory cell array 210 including first to eighth memory cell groups 211_1 to 211_8 for the purposes of explanation only. It will be understood that the is description equally applies to less than eight memory cell groups (e.g., 4) and greater than eight memory cell groups (e.g., 16). The memory cell array 210 further includes the redundancy memory cell group 215 for replacing defective cells occurring in the first to eighth memory cell groups 211_1 to 211_8. Also, FIGS. 6A-6D show an alternative where the data line selection circuit 260 may be included in the column decoder 220, but is still considered part of the selection control logic 270. Although the column decoder 220 includes the data line selection circuit 260 in FIG. 6A, the data line selection circuit 260 may be arranged outside the column decoder 220. Hereinafter, repeated descriptions will be omitted.

The semiconductor memory device 200 performs repair on the basis of a data line selection operation in the data line selection circuit 260. The data line selection circuit 260 is connected to global data lines of the first to eighth memory cell groups 211_1 to 211_8 and redundancy global data lines of the redundancy memory cell group 215 and inputs and outputs via first to eighth input/output nodes DQ0 to DQ7. For example, if data to be accessed is stored in normal cells, the data line selection circuit 260 normally outputs data in the first to eighth memory cell groups 211_1 to 211_8, otherwise if data in a defective cell is accessed, the data line selection circuit 260 controls data in the redundancy memory cell group 215 to be output instead of the data in the defective cell.

The data line selection operation described above may be performed on the basis of the control signal CS, which will be described in greater detail below.

An example of the data line selection operation in the semiconductor memory device 200 will now be described. It is assumed in the description of the current embodiment that a selection operation of global data lines is performed.

If data stored in normal cells is accessed, data in the first to eighth memory cell groups 211_1 to 211_8 is output to first to eighth input/output nodes DQ0 to DQ7 through the data line selection circuit 260. Otherwise, if a defective cell in, for example, the third memory cell group 211_3 is accessed, the data line selection circuit 260 performs a selection operation of the global data lines and the redundancy global data lines, for example, outputs data in the first and second memory cell groups 211_1 and 211_2 at the first and second input/output nodes DQ0 and DQ1 and outputs data in the fourth to eighth memory cell group 211_4 to 211_8 and the redundancy memory cell group 215 at the third to eighth input/output nodes DQ2 to DQ7, respectively.

Figure 6B:
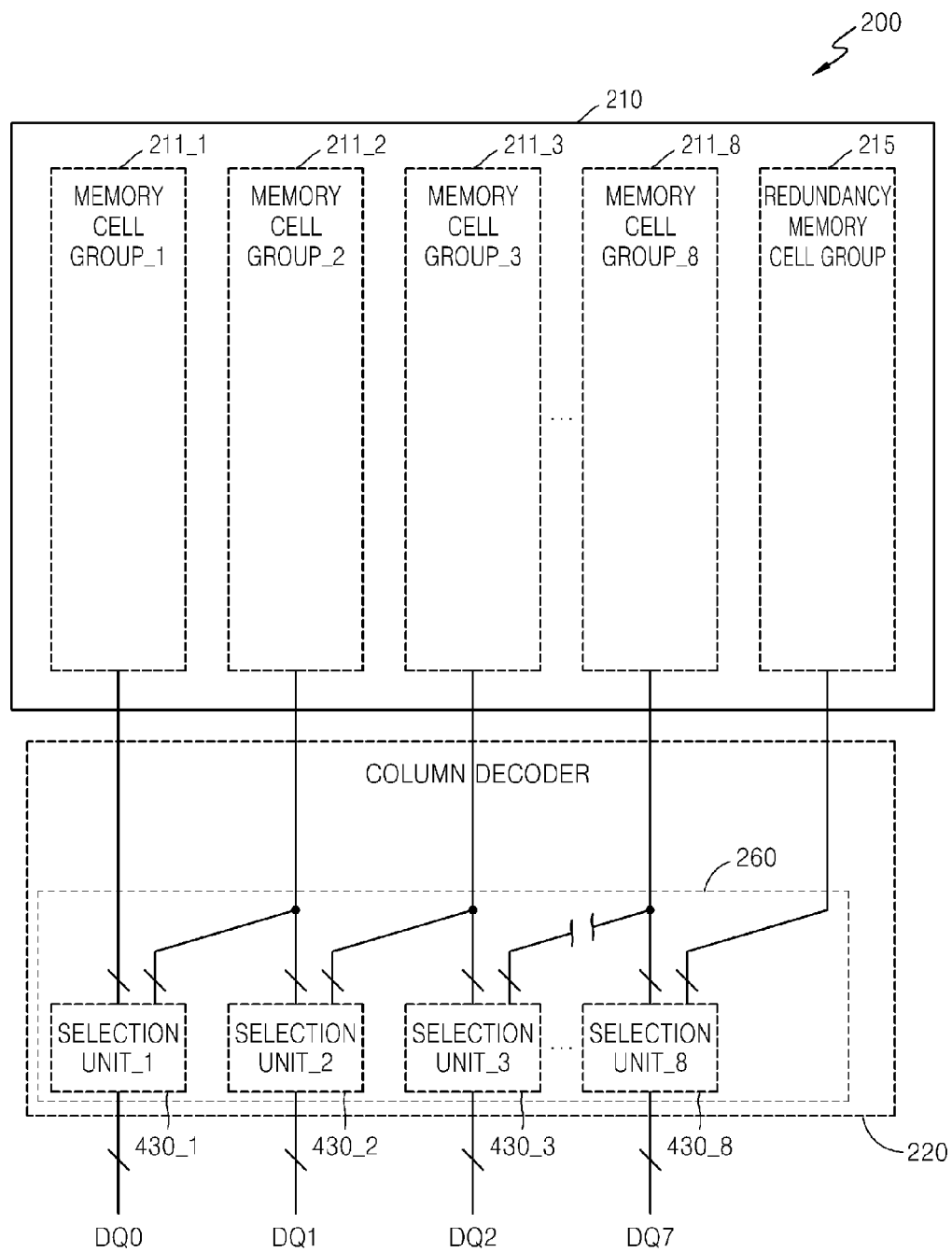

FIG. 6B is a block diagram of an example of the data line selection circuit 260 of FIG. 6A. As shown in FIG. 6B, the data line selection circuit 260 may include first to eighth selection units 430_1 to 430_8 corresponding to the memory cell groups 211 to 215.

A shifting operation of the global data lines is performed according to a selection operation of the first to eighth selection units 430_1 to 430_8. For example, in a normal operation, data transferred through the global data lines of the fourth memory cell group 211_4 is output at the fourth input/output node DQ3 through the fourth selection unit 430_4. During a data line shifting operation for repairing a defective memory cell, data transferred through the global data lines of the fourth memory cell group 211_4 is output at the third input/output node DQ2 through the third selection unit 430_3 assuming the defective cell is not in the fourth memory cell group 211_4. In addition, a data output of a defective cell is blocked, and instead, data in the redundancy memory cell group 215 is output at the eighth input/output node DQ7 through the redundancy global data lines and the eighth selection unit 430_8. On the basis of the shifting operation, even if any cell in any one of the first to eighth selection units 430_1 to 430_8 is defective, repair may be performed by the single redundancy memory cell group 215.

The recent specifications of semiconductor memory devices require that input and output data is output through only specific input and output pins according to a separately set data width option. For example, in a case of a semiconductor memory device having 16 input and output pins, data is input and output through the 16 input and output pins if an X16 data width option (or X16 data width mode) is set, and data is input and output through only 8 input and output pins if an X8 data width option is set. Similarly, if an X4 data width option is set, data is input and output through only 4 input and output pins.

If the X8 data width option is set, a memory is selected by a desired (or, alternatively, a predetermined) number of row and column addresses, and for example, a memory may be selected in response to first to thirteenth row addresses RA01 to RA13 and first to tenth column addresses CA01 to CA10. Otherwise if the X16 data width option is set, the thirteenth row address RA13 is ignored (don't care), and accordingly, double data compared to the X8 option may be input and output. Otherwise if the X4 data width option is set, an eleventh column address CA11 is further used, and accordingly, half the amount of data compared to the X8 data width option may be input and output.

In the example shown in FIG. 6B, since each of the first to eighth selection units 430_1 to 430_8 selects global data lines according to a 2:1 selection structure, a repair operation may be performed in a data width mode for outputting all of first to eighth data to DQ0 to DQ7.

Figure 6C:
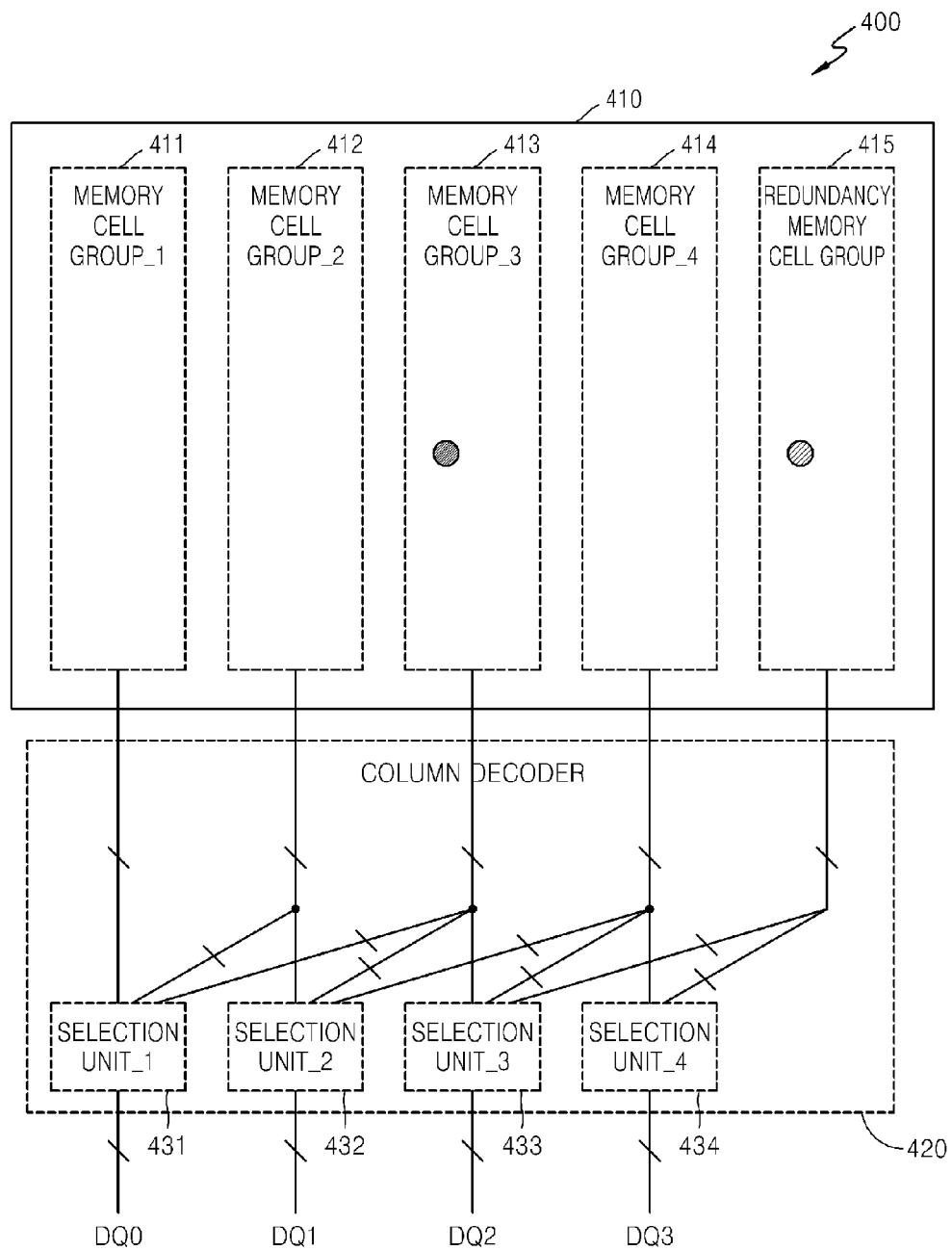

FIG. 6C is a block diagram of another example of the data line selection circuit 260 of FIG. 6A. FIG. 6C shows an example in which repair by a data line selection operation corresponding to various data width options is performed, and as shown in FIG. 6C, the data line selection circuit 260 may include first to fourth selection units 430_1 to 430_4 corresponding to first to fourth memory cell groups 211_1 to 211_4 and redundancy memory cell group 215.

Each of the first to fourth selection units 431 to 434 may be connected to at least two memory cell groups (including the redundancy memory cell group 215). For example, each of the first and second selection units 431 and 432 may be connected to global data lines of three memory cell groups, the third selection unit 433 may be connected to global data lines of two memory cell groups and the redundancy global data lines, and the fourth selection unit 434 may be connected to global data lines of one memory cell group and the redundancy global data lines. However, this is only illustrative, and each of the first to fourth selection units 431 to 434 may be implemented to have a same selection circuit structure.

As a simple example, when a defective cell in the third memory cell group 211_3 is accessed in an option for inputting and outputting first and third data at DQ0 and DQ2, data in the redundancy memory cell group 215 is provided as third data at DQ2 through the third selection unit 433, and data in the first memory cell group 211_1 is provided as first data at DQ0 through the first selection unit 431. In addition, when a defective cell in the second memory cell group 211_2 is accessed in an option for inputting and outputting second and fourth data at DQ1 and DQ3, data in the redundancy memory cell group 215 is provided as fourth data at DQ3 through the fourth selection unit 434, and data in the fourth memory cell group 211_4 is provided as second data at DQ1 through the second selection unit 432.

In addition, in a case of an option for inputting and outputting first and fourth data at DQ0 and DQ3, a repair operation may be performed by performing a shifting operation using the same method as in the connection structure of FIG. 6B.

Figure 6D:
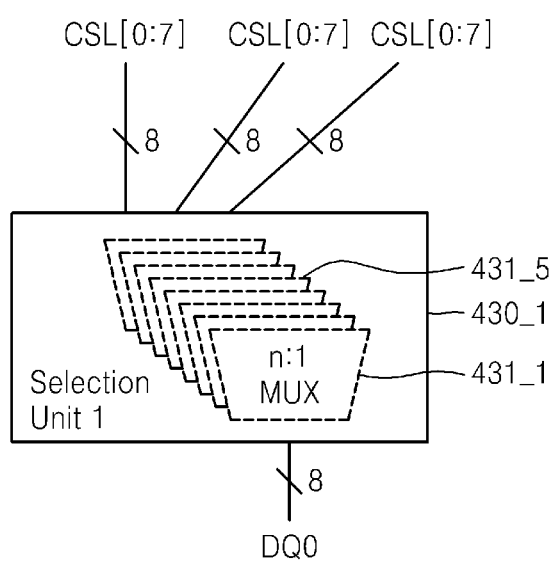

FIG. 6D is a block diagram of an example of a selection unit shown in FIG. 6C or FIG. 6B. Although FIG. 6D shows an example of the first selection unit 430_1 for convenience of description, the other selection units may also be implemented in the same or similar manner to the first selection unit 430_1.

As shown in FIG. 6D, the first selection unit 430_1 may include at least one n:1 multiplexer (MUX). When data in each memory cell group is transferred through eight global data lines, the first selection unit 430_1 may include eight MUXs. In addition, the MUXs may be implemented according to the number of global data line connections, and for example, 3:1 MUXs may be used when one of three data transferred through global data lines are selected as in FIG. 6C. As another example, 2:1 MUXs may be used when one of two data transferred through global data lines are selected as in FIG. 6B. According to the current embodiment, since various connection structures of global data lines and redundancy global data lines may be achieved, the number of MUXs included in a single selection unit may be variable, and other types of MUXs besides the 3:1 and 2:1 MUXs may be used.

In the structure of FIG. 6D, each MUX, for example, during a write operation may receive three data and selectively output any one of the three data. For example, data may be transferred through any one global data line according to a selected column selection line from among the global data lines connected to a memory cell group. When a first column selection line CSL0 is selected, data is input to a first MUX 431_1 through first global data lines of three memory cell groups, and the first MUX 431_1 outputs any one of the three data as first data DQ0. Similarly, when a fifth column selection line CSL4 is selected, data is input to a fifth MUX 431_5 through fifth global data lines of the three memory cell groups, and the fifth MUX 431_5 outputs any one of the three data as first data DQ0.

Furthermore, it will be understood that the MUXs create data paths between a connection node and one of a plurality of selection nodes. In the example of FIG. 6D, the connection node is connected with the input/output node DQ0, and the selection nodes are connected to global data lines and/or redundancy data line. Accordingly, regardless of the access mode (reading or writing), the MUX creates a data path to the selected global data line.

Figure 7A:
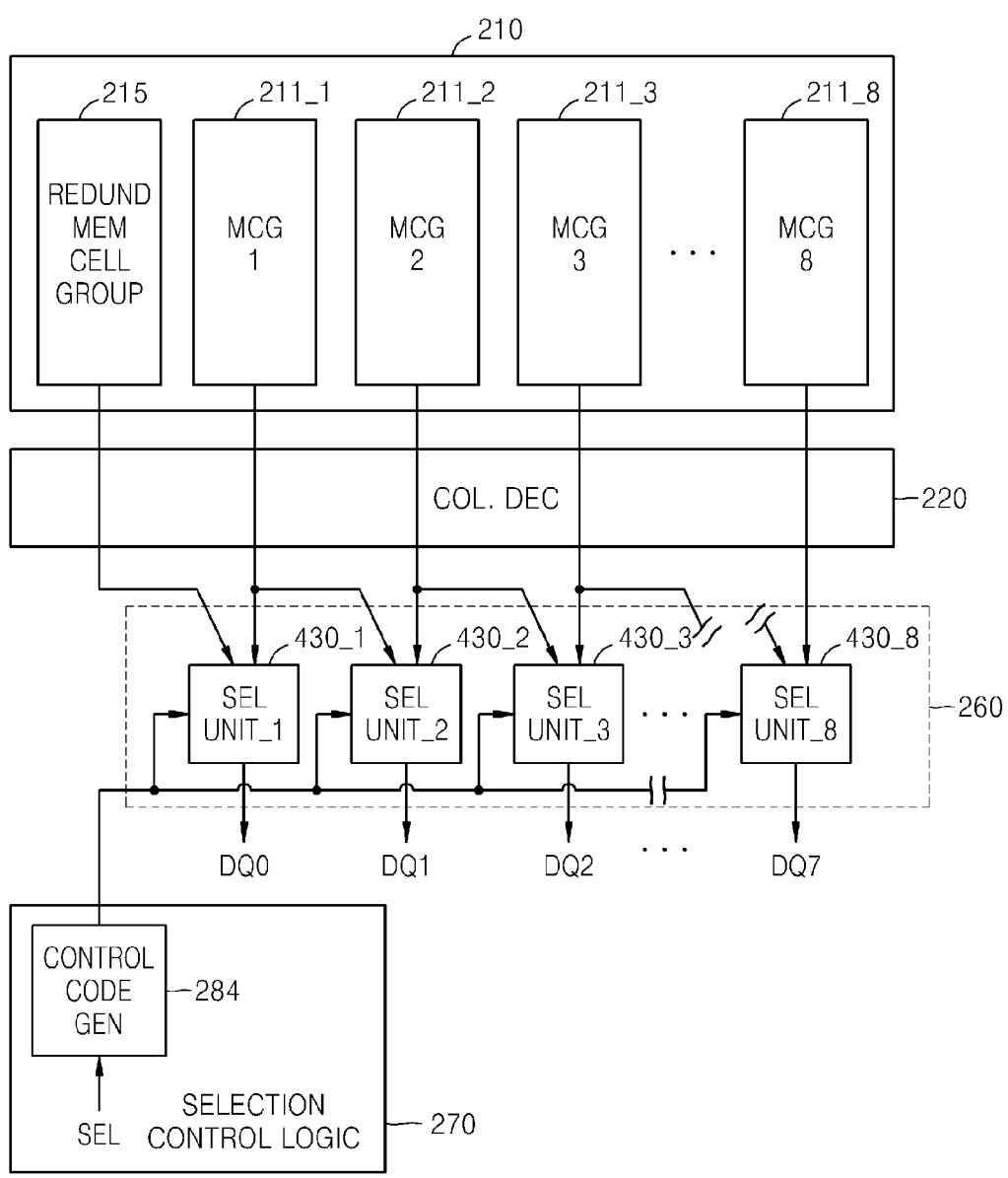

FIGS. 7A to 7C are a block diagram and tables for describing generation of a control signal for controlling the data line selection circuit 260.

FIG. 7A illustrates an embodiment of the memory device 200 the same as FIG. 1 and FIG. 6B, except that the redundancy memory cell group 215 is disposed next to first memory cell group 211_1 instead of the nth memory (e.g., eighth) memory cell group. Accordingly, the data line selection circuit 260 may include a plurality of selection units, e.g., the first to eighth selection units 430_1 to 430_8 as in FIG. 6B, for switching data lines (e.g., global data lines) connected to a plurality of memory cell groups, e.g., the first to eighth memory cell groups 211_1 to 211_8, and the redundancy memory cell group 215, except that the first selection unit 430_1 is connected to the global data lines for the redundancy memory cell group 215 and the first memory cell group 211_1, the second selection unit 430_2 is connected to the global data lines for the first and second memory cell groups 211_1 and 211_2, . . . , and the eighth selection unit is connected to the global data lines for the seventh and eighth memory cell groups 211_7 and 211_8.

The control code generator 284, in the selection control logic 270, for controlling the first to eighth selection units 430_1 to 430_8 is also shown. As shown in FIG. 5 and reshown in FIG. 7A, the control code generator 284 may receive the selection signal SEL and generate control codes in response thereto.

If an address Addr from the outside is not of a defective cell, the first to eighth selection units 430_1 to 430_8 normally output data without a shifting operation of data lines. Otherwise, if the address Addr from the outside is of a defective cell, data is blocked from being output through a data line connected to the defective cell by a shifting operation of data lines, and instead, the data is output through a data line connected to a redundancy cell.

FIGS. 7B and 7C show examples of the selection signal SEL and the control code or control signal CS, and particularly, examples in which the control code is implemented by a thermometer code, for the data line selection circuit embodiment of FIG. 7A.

The control code generator 284 may store information, as shown in FIGS. 7B and 7C, in a table. For example, the information shown in FIG. 7B may be stored when the semiconductor memory device 200 operates in the X8 data width option, and the information shown in FIG. 7C may be stored when the semiconductor memory device 200 operates in the X4 data width option. Referring to FIGS. 7B and 7C, a control code may be generated even when the semiconductor memory device 200 operates in another data width option, e.g., the X16 data width option. The information described above may be stored in a desired (or, alternatively a predetermined) storage unit (e.g., a nonvolatile storage unit such as nonvolatile memory 272) inside or outside the semiconductor memory device 200 and loaded in the control code generator 284 when the semiconductor memory device 200 operates, or may be nonvolatilely stored in the control code generator 280.

In addition, FIG. 7B shows an example in which data is input and output via first to eighth input/output nodes DQ0 to DQ7. First, the selection signal SEL as shown in FIG. 7B will be described. As shown, the selection signal SEL includes 5 bits in this embodiment—a master fuse MF bit, a X4 bit, a CA11 bit and F1, F2 and F3 bits. The MF bit indicates whether a defective memory cell was detected. A 0 indicates no defective memory cell, and a 1 indicates a defective memory cell. The X4 bit when 1 indicates the data width is 4, and when 0 indicates, in this example, the data width is 8. The CA11 bit indicates whether the X4 data width operating mode is an even operation mode or an odd operation mode. Because FIG. 7B does not illustrate X4 operation, the CA11 bit is "don't care" in this example. However, in the odd operating mode, data is input/output via the odd input/output nodes DQ, and in the even operating mode, data is input/output via the even input/output nodes DQ. The F1, F2, and F3 bits collectively identify one of the first to eighth memory cell group MCG1 (211_1) to MCG8 (211_8) including the defective memory cell.

The X4 bit and CA11 bit comprise the mode information received from the nonvolatile memory 272 by the column comparator 288. The column comparator 288 determines the MF bit and the F0, F1, and F2 bits based on whether a defective memory cell is detected. If the detection is positive, the MF bit is set to 1. Then, depending on the memory cell group including the defective memory cells, as indicated by the column address, the column comparator generates the F0, F1 and F2 bits to indicate the memory cell group as shown in FIG. 7B. The collection of the MF bit, the X4 bit, the CA11 bit, the F2 bit, the F1 bit and the F0 bit are output by the column comparator 288 as the selection signal SEL.

The code generator 284 maps the selection signal into a control code or control signal having a bit associated with each selection unit 430_1 to 430_8 of the data line selection circuit. In the table of FIG. 7B, the bits under the columns having the headings DQ0 to DQ7 are associated with the first to eighth selection units 430_1 to 430_8. A 0 indicates that the selection unit 430 did not perform a shift operation, while a 1 indicates the selection unit 430 did perform a shift operation. Accordingly, a 0 in the DQ1 column controls the second selection unit 430_2 to not perform a shift operation, and to provide a data path between the second memory cell group 211_2 and the second input/output node DQ1. By contrast, a 1 in the DQ1 column controls the second selection unit 211_2 to perform a shift operation and provide a data path between the first memory cell group 211_1 and the second input/output node DQ1.

For example, when an address input for access is of a normal cell, the MF bit may be 0, and in this case, a data line shifting operation is not performed. Also, since no defective cell exists, the remaining bits of the selection signal SEL are "don't care". Otherwise, when the input address is of a defective cell, a MF bit is set to 1, and in this case, a shifting operation of at least one data line is controlled according to a control code shown in FIG. 7B.

If a defective cell is detected in the fifth memory cell group 211_5, the selection units 430_1 to 430_5 corresponding to the first to fifth input/output nodes DQ0 to DQ4 may perform shifting of data lines to block data in the defective cell from being transferred through the data lines, and selection units 430_6 to 430_8 corresponding to the sixth to eighth input/output nodes DQ5 to DQ7 may normally output data without shifting data lines. Namely, the first selection unit 430_1 provides a data path from the redundancy global data line of the redundancy memory cell group 215 to the first input/output node DQ0, the second though fifth selection units 430_2 to 430_5 provide data paths from global data lines of the first to fourth memory cell groups 211_1 to 211_4 to the second to fifth input/output nodes DQ1 to DQ4, respectively, and the sixth to eighth selection units 430_6 to 430_8 provide data paths from the global data lines of the sixth to eighth memory cell groups 211_6 to 211_8 to the sixth to eighth input/output nodes DQ5 to DQ7, respectively.

As shown in FIG. 7C, when the semiconductor memory device 200 of FIG. 7A operates in the X4 option, a different table in the code generator 284 may be used. For example, the information indicating whether the X4 option is selected may be set as a logic high value (e.g., 1), and the information about the eleventh column address CA11 for an even/odd selection of data may be set. Namely, the mode information in the selection signal SEL indicates to use the X4 table in the code generator 284. In addition, since only four input and output units are used, a portion (e.g., F0) of the fuse information F0 to F2 related to the input and output unit information may be set any one of logic low and logic high (e.g., "don't care").

The thermometer code described above is an example of a control code for controlling the data line selection circuit 260, and the data line selection circuit 260 may be controlled by another control code generation method or controlled by thermometer codes set as different values.

Still further, it will be appreciated, that instead of the F0, F1 and F2 bits, the selection signal may instead include the control signal or code. Namely, the column comparator 288 may directly generate the control signal as the selection signal. In this embodiment, the code generator is not necessary, and the selection signal is applied to the data line selection circuit 260.

Figure 7D:
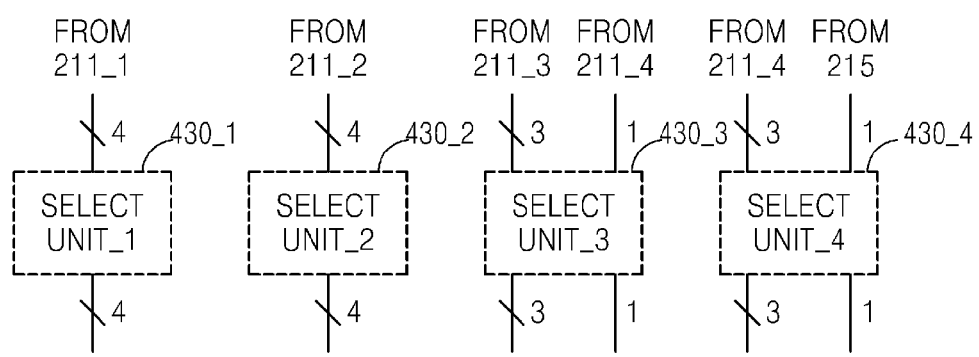
FIG. 7D shows an example of data line replacement.

FIG. 7D illustrates a modification to the above described embodiments. For the purposes of simplifying the explanation, the memory cell array 210 includes four memory cell groups 211_1 to 211_4 and the data line selection circuit 260 includes four selection units 430_1 to 4304. As shown, instead of shifting all of the redundant global bit lines of the redundant memory cell group to replace global bit lines of a memory cell group, less than all or even only one (as shown) redundant data line may be shifted.

Figure 7E:
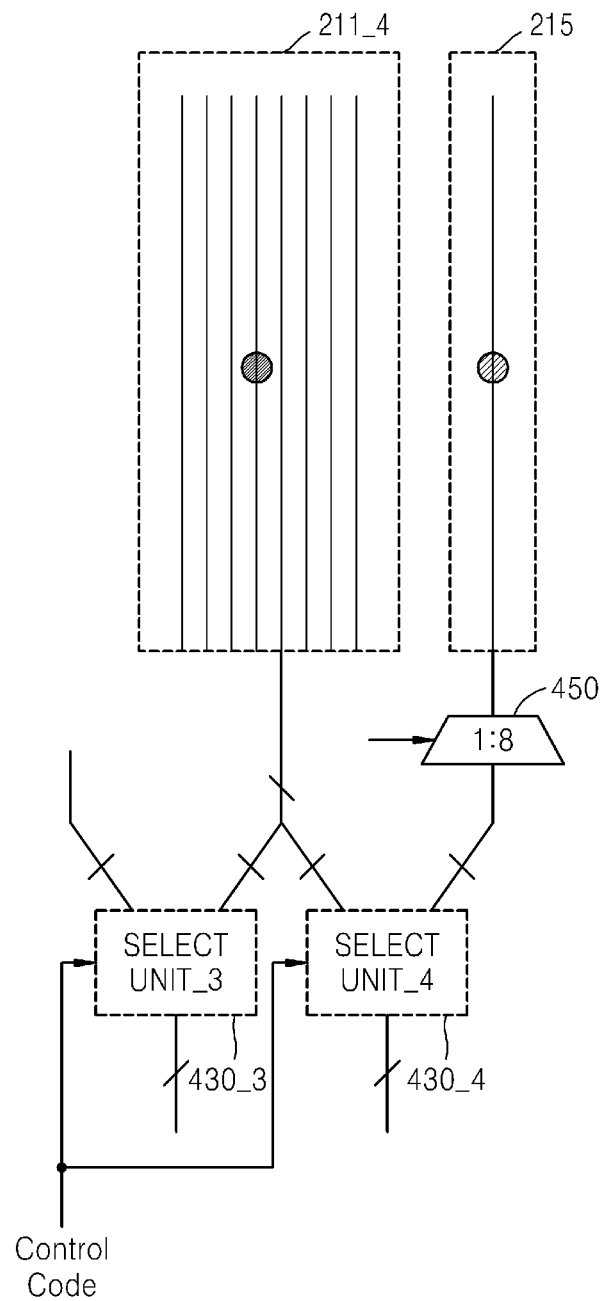
FIG. 7E is a block diagram illustrating an example in which a demultiplexer is installed for a redundancy memory cell group.

FIG. 7E is a block diagram illustrating an example in which a demultiplexer (DEMUX) is arranged for the redundancy memory cell group 215. In FIG. 7E, only the fourth memory cell group 211_4, the redundancy memory cell group 215, and the third and fourth selection units 430_3 and 430_4 are illustrated for convenience of explanation.

As illustrated in FIG. 7E, when 8 global data lines are included for the fourth memory cell group 211_4 and a single redundancy global data line is included for the redundancy memory cell group 215, a 1:8 DEMUX 450 may be arranged to demultiplex the data of the single redundancy global data line of the redundancy memory cell group 215. In other words, 8 MUXes may be disposed for each of the third and fourth selection units 430_3 and 430_4, and an output of the 1:8 DEMUX 450 may be provided to each of the 8 MUXes included in the fourth selection unit 430_4. The 1:8 DEMUX 450 may be controlled by the selection control logic 270 based on the determined location of a detected defective memory cell.

For example, when a memory cell connected to a fourth global data line of the fourth memory cell group 211_4 is a defective cell, data of the fourth memory cell group 211_4 may be output via first through third MUXes and fifth through eighth MUXes of the fourth selection unit 430_4. On the other hand, data of the redundancy memory cell group 215 may be output via a fourth MUX of the fourth selection unit 430_4. Moreover, as described above, switching operations of the third and fourth selection units 430_3 and 430_4 may be controlled according to control codes.

FIGS. 7F and 7G are block diagrams of a semiconductor memory device 1500 according to another embodiment of the inventive concept.

Referring to FIG. 7F, the semiconductor memory device 1500 may include a memory cell array 1510, a column decoder 1520, at least one selection unit, namely, first through fourth selection units 1531 through 1534, and at least one buffer unit, namely, first through fourth buffer units 1541 through 1544. For convenience of explanation, the first through fourth selection units 1531 through 1534 are arranged outside the column decoder 1520. Although not shown in FIGS. 7F and 7G, switching operations of the first through fourth selection units 1531 through 1534 may be controlled based on the aforementioned selection signal SEL or the control codes generated in response to the selection signal SEL.

The memory cell array 1510 may include a plurality of memory cell groups, namely, first through fourth memory cell groups 1511 through 1514. The memory cell array 1510 may further include a redundancy memory cell group 1515 for replacing defective cells generated in the first through fourth memory cell groups 1511 through 1514. The first through fourth selection units 1531 through 1534 may operate in the same or similar manner as the first through fourth selection units 430_1 through 430_8 of FIG. 6B. In other words, the first through fourth selection units 1531 through 1534 may perform selection with respect to global data lines connected to the first through fourth memory cell groups 1511 through 1514 and redundancy global data lines connected to the redundancy memory cell group 1515, and block input and output of the data of a defective cell and instead allow data of a redundancy cell to be input and output by selection of the global data lines.

Data may be input to and output to the first selection unit 1531 via the first buffer unit 1541. Similarly, data may be input to and output to the second through fourth selection units 1532 through 1534 via the second through fourth buffer units 1542 through 1544, respectively. FIG. 7G illustrates the first through fourth buffer units 1541 through 1544 in greater detail. As illustrated in FIG. 7G, the first through fourth buffer units 1541 through 1544 may include sense amplifiers (SAs) 1541_1 through 1544_1, respectively, and write drivers (WDs) 1541_2 through 1544, respectively. The SAs 1541_1 through 1544_1 amplify output data received via the first through fourth selection units 1531 through 1534, respectively, and provide amplified data to the outside, and the WDs 1541_2 through 15442 provide received data to data lines via the first through fourth selection units 1531 through 1534, respectively. The number of SAs 1541_1 through 1544_1 and the number of WDs 1541_2 through 1544_2 may be identical to that of global data lines.

Figure 7H:
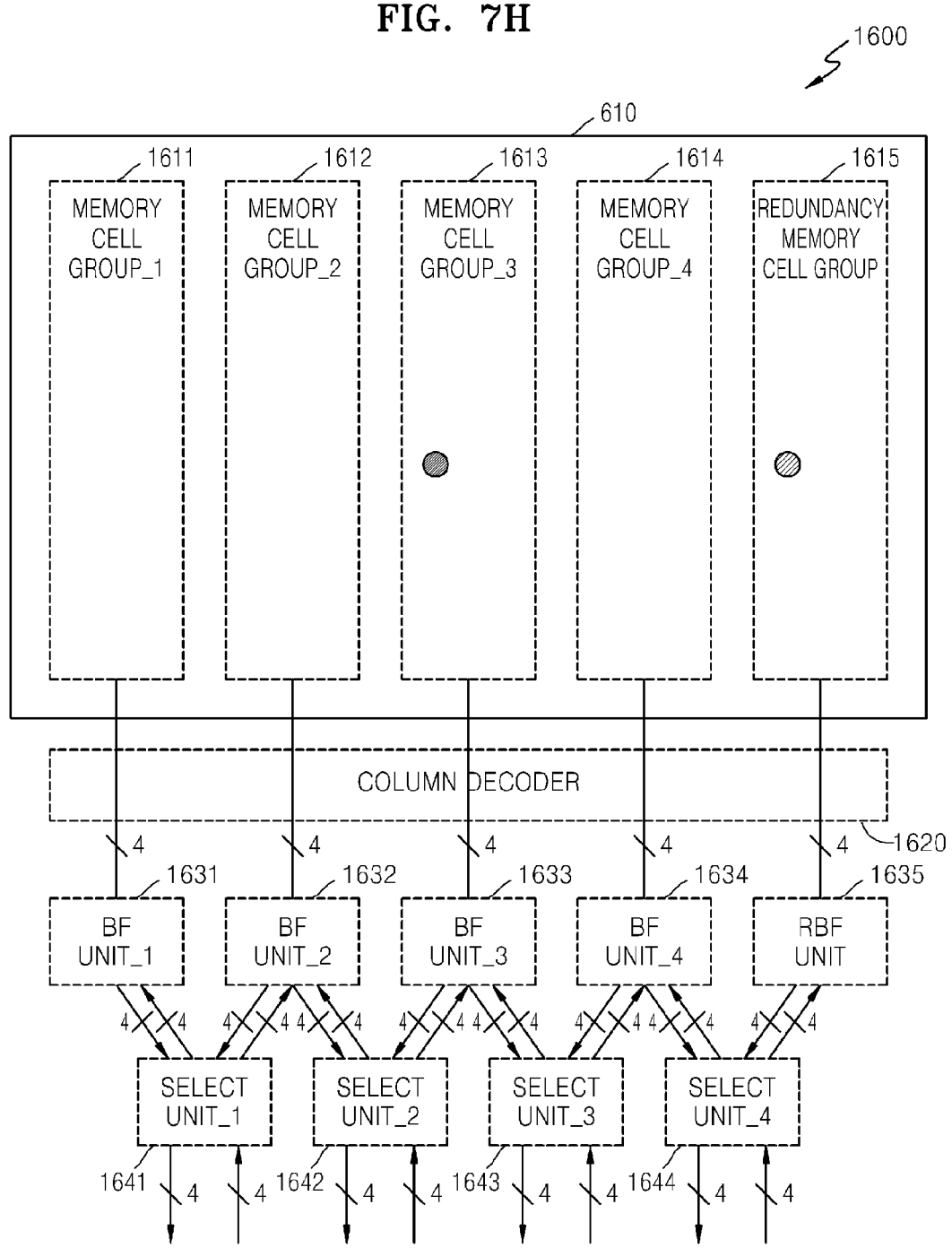
FIG. 7H is a block diagram of an example in which the design of the semiconductor memory device of FIGS. 7F and 7G is modified.

A semiconductor memory device 1600 of FIG. 7H is the same as the semiconductor memory device 1500 of FIGS. 7F and 7G except for locations of selection units and buffer units. For example, as illustrated in FIG. 7H, the semiconductor memory device 1600 may include a memory cell array 1610 and a column decoder 1620, and the memory cell array 1610 may include first through fourth memory cell groups 1611 through 1614 and a redundancy memory cell group 1615. At least one buffer unit, namely, first through fourth buffer units 1631 through 1634 and a redundancy buffer unit 1635, may be connected to global data lines and a redundancy global data line of the memory cell array 1610, and data output via the first through fourth buffer units 1631 through 1634 and the redundancy buffer unit 1635 may be provided to the outside via at least one selection unit, namely, first through fourth selection units 1641 through 1644, or externally input data may be provided to the first through fourth buffer units 1631 through 1634 and the redundancy buffer unit 1635 via the first through fourth selection units 1641 through 1644. The first through fourth buffer units 1631 through 1634 correspond to the first through fourth memory cell groups 1611 through 1614, and the redundancy buffer unit 1635 corresponds to the redundancy memory cell group 1615. The first through fourth selection units 1641 through 1644 of FIG. 7H may operate in the same or similar manner as the first through eighth selection units 430_1 through 430_8 of FIG. 6B.

According to the embodiment of FIG. 7H, lines that transmit data converted into a CMOS level via the first through fourth buffer units 1631 through 1634 and the redundancy buffer unit 1635 are shifted. In other words, defective cells may be replaced by redundancy cells by shifting of data lines between the first through fourth buffer units 1631 through 1634 and the redundancy buffer unit 1635 and I/O pads for an external interface of a semiconductor memory device.

Figure 8:
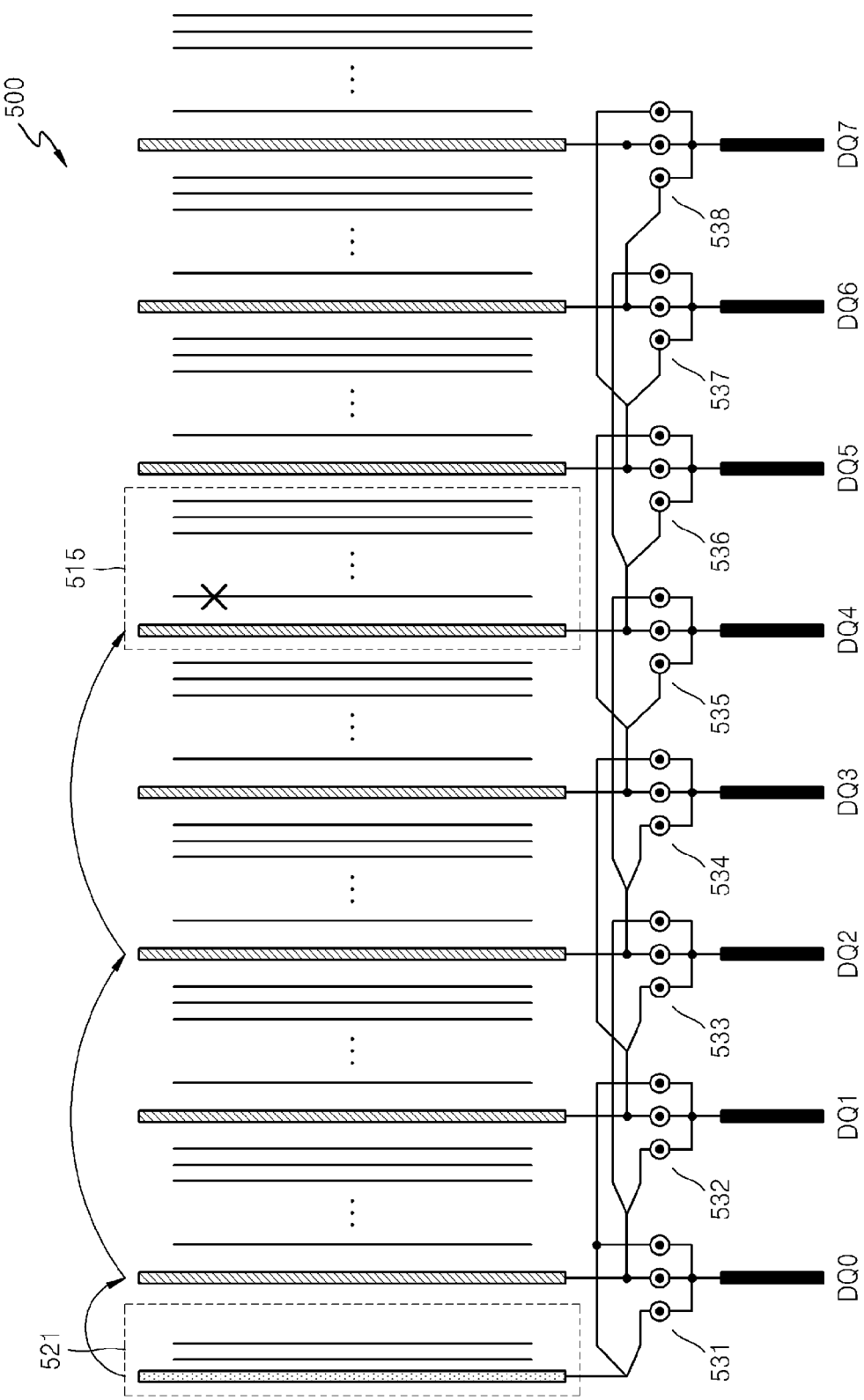
FIG. 8 is a circuit diagram illustrating a repair operation in correspondence with various data width options, according to an embodiment of the inventive concepts.

FIG. 8 is a circuit diagram illustrating a repair operation in correspondence with various data width options, according to an embodiment of the inventive concepts. As shown in FIG. 8, a semiconductor memory device 500 may include a plurality of memory cell groups, e.g., first to eighth memory cell groups, a redundancy cell group 521, and a plurality of selection units, e.g., first to eighth selection units 531 to 538, for repairing defective cells by shifting data lines. FIG. 8 shows an example in which a single bit line of each of the first to eighth memory cell groups is selected by the same column selection signal to output first to eighth data DQ0 to DQ7. In addition, FIG. 8 shows an example in which a defective cell in the first to eighth memory cell groups is repaired. In addition, FIG. 8 shows an example in which each of the first to eighth selection units 531 to 538 includes a 3:1 MUX.

Although FIG. 8 shows an example in which first to eighth data output from the first to eighth memory cell groups are transferred through first to eighth input/output nodes DQ0 to DQ7, when the X16 data width option is set, ninth to sixteenth data (not shown) may be output from eight additional memory cell groups and a redundancy memory cell group corresponding thereto. In this case, in response to an address from the outside, the entire sixteen memory cell groups may be selected to simultaneously output sixteen pieces of data.

A connection structure between global data lines and first to eighth selection units 531 to 538 in the semiconductor memory device 500 of FIG. 8 will now be described. For convenience of description, global data lines for transferring data in the first to eighth memory cell groups are named as first to eighth global data lines, respectively, and global data lines for transferring data in the redundancy memory cell group 521 are named as redundancy global data lines. Although each global data line is shown as a single solid line in FIG. 8, a single global data line in FIG. 8 may substantially include a plurality of global data lines. For example, in the first memory cell group, any one of eight bit lines is selected in response to a single column selection signal, wherein the first global data line may include eight global data lines corresponding to the eight bit lines. According to the selected bit line, data is output through any one of the eight global data lines included in the first global data line.

Each of the first to eighth selection units 531 to 538 may be connected to at least three global data lines. Exceptionally, the first selection unit 531 located at the edge is connected to the first global data line and twice to a redundancy global data line. According to the 3:1 MUX structure, the redundancy global data line may be connected to two selection nodes of the first selection unit 531.

Similarly, the second selection unit 532 is connected to the redundancy global data line and the first and second global data lines. In addition, the third selection unit 533 is connected to the first to third global data lines, . . . , the eighth selection unit 538 is connected to the sixth to eighth global data lines.

When the semiconductor memory device 500 operates in the X8 data width option, according to the switch arrangement pattern shown in FIG. 8, only two switches from the left of a MUX included in each of the first to eighth selection units 531 to 538 may operate, wherein the remaining switch to the right may maintain an off state. Accordingly, when a defective cell is repaired, a shifting operation may be performed in units of single global data lines.

For example, when data in the first to eighth memory cell groups is accessed by the same column selection signal, in which a defective cell in the fifth memory cell group 515 is accessed, data in the redundancy memory cell group 521 and the first to fourth memory cell groups 511 to 514 is output as first to fifth data to DQ0 to DQ4. In addition, a data output from the fifth memory cell group 515 is blocked, and data in the sixth to eighth memory cell groups 516 to 518 is output as sixth to eighth data to DQ5 to DQ7.

When the semiconductor memory device 500 operates in the X4 data width option, only two switches from the right of a MUX included in each of the first to eighth selection units 531 to 538 may operate. When a defective cell is accessed, a data line shifting operation for repairing the defective cell is performed. In the case of FIG. 8, the shifting operation may be performed in a group unit of two global data lines.

Examples of the data line shifting operation will now be described in detail with reference to FIGS. 9A to 9C and 10.

Figure 9A:
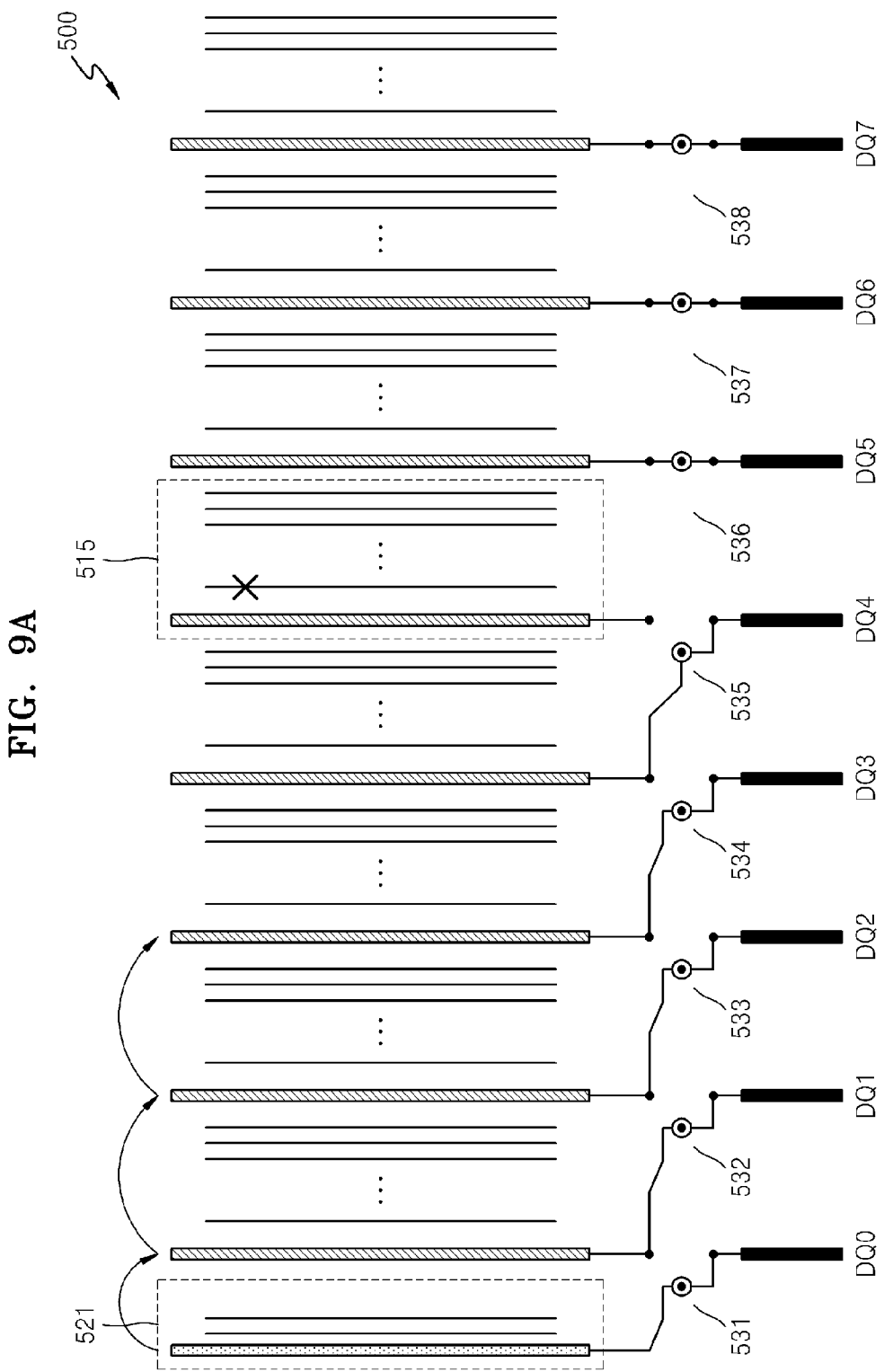

FIGS. 9A to 9C are circuit diagrams for describing operations of the semiconductor memory device 500 of FIG. 8. FIG. 9A shows a case where the semiconductor memory device 500 operates in the X8 data width option, wherein a defective cell in the fifth memory cell group 515 is accessed.

According to a switching operation of the first to eighth selection units 531 to 538, a shifting operation with respect to the redundancy global data line and the first to fourth global data lines is performed. For example, the first selection unit 531 selectively outputs data received through the redundancy global data line, and the second to fifth selection units 532 to 535 selectively output data received through the first to fourth global data lines.

In addition, a data output through the fifth global data line is blocked, and data received through the sixth to eighth global data lines is output as sixth to eighth data to DQ5 to DQ7 without a shifting operation. According to the example of FIG. 9A, even though a defective cell occurs in any one of the first to eighth memory cell groups, the weak cell may be repaired by the single redundancy memory cell group 521.

FIG. 9B shows a case where the semiconductor memory device 500 operates in the X4 data width option, wherein a defective cell in the fifth memory cell group 515 is accessed.

According to the X4 data width option, data is transmitted and received through four of the eight selection units. For example, data transferred through oddth global data lines may be output as first to fourth data to the first, third, fifth and seventh input/output nodes DQ0, DQ2, DQ4 and DQ6, also referred to as the first to fourth odd mode input/output nodes DQO0, DQO1, DQO2 and DQO3. In this case, for a memory access, an eleventh column address CA11 may be additionally used, and for example, the first, third, fifth, and seventh memory cell groups 511, 513, 515, and 517 may be accessed.

According to the example described above, a plurality of memory cell groups (e.g., the first to eighth memory cell groups) may be classified into an even area and an odd area, and a defective cell in the even area or the odd area may be repaired using a single redundancy cell. That is, on the basis of a shifting operation, a defective cell in any one of four memory cell groups may be repaired using a single redundancy global data line.

When a defective cell in the fifth memory cell group 515 of the odd area is accessed, a data line shifting operation is performed by a switching operation of the first, third, fifth, and seventh selection units 531, 533, 535, and 537. For example, data transferred through the redundancy global data line is output as first data to DQ0 by a switching operation of the first selection unit 531.

Since the first global data line is shifted in a group unit of two global data lines, data transferred through the first global data line is output as second data to DQ2 (DQ01) by a switching operation of the third selection unit 533. Similarly, data transferred through the third global data line is output as third data to DQ4 (DQ02) by a switching operation of the fifth selection unit 535. However, an output of data through the fifth global data line corresponding to the fifth memory cell group 515 is blocked, and data in the seventh memory cell group 517 is output as fourth data to DQ6 (DQ03) through the seventh global data line and the seventh selection unit 537.

According to the X4 data width option shown in FIG. 9B, data in the second, fourth, sixth, and eighth memory cell groups 512, 514, 516, and 518 of the even area is not accessed. Although FIG. 9B shows an example in which the second, fourth, sixth, and eighth selection units 532, 534, 536, and 538 corresponding to the even area select corresponding global data lines, since access to the second, fourth, sixth, and eighth memory cell groups 512, 514, 516, and 518 is blocked, and data transfer through corresponding input and output pins DQ is also blocked, the second, fourth, sixth, and eighth selection units 532, 534, 536, and 538 may select the second, fourth, sixth, and eighth global data lines, respectively. As another example, the second, fourth, sixth, and eighth selection units 532, 534, 536, and 538 may select no global data lines in a switching operation.

FIG. 9C shows a case where the semiconductor memory device 500 operates in the X4 data width option, wherein a defective cell in the fourth memory cell group 514 is accessed.

According to the X4 data width option, the memory cell groups in the even area (e.g., the second, fourth, sixth, and eighth memory cell groups 512, 514, 516, and 518) may be accessed (e.g., even operation mode), and accordingly, data transferred through the eleventh global data lines may be output at the second, fourth, sixth and eighth input/output nodes DQ1, DQ3, DQ5 and DQ7, also referred to as the first to fourth even input/output nodes DQE0 to DQE3. The eleventh column address CA11 may be additionally used for memory access according to the X4 data width option, and in this case, a defective cell in the second, fourth, sixth, and eighth memory cell groups 512, 514, 516, and 518 may be flexibly repaired using a single redundancy global data line.

When a defective cell in the fourth memory cell group 514 is accessed, a data line shifting operation is performed by a switching operation of the second, fourth, sixth, and eighth selection units 532, 534, 536, and 538. For example, data transferred through the redundancy global data line is output as first data to DQE0 by a switching operation of the second selection unit 532. In addition, data transferred through the second global data line is output as second data to DQE1 by a switching operation of the fourth selection unit 534.

However, a data output through the fourth global data line is blocked, and data through the sixth and eighth global data lines is output as third and fourth data to DQE2 and DQE3 through the sixth and eighth selection units 536 and 538 without a shifting operation.

Figure 10:
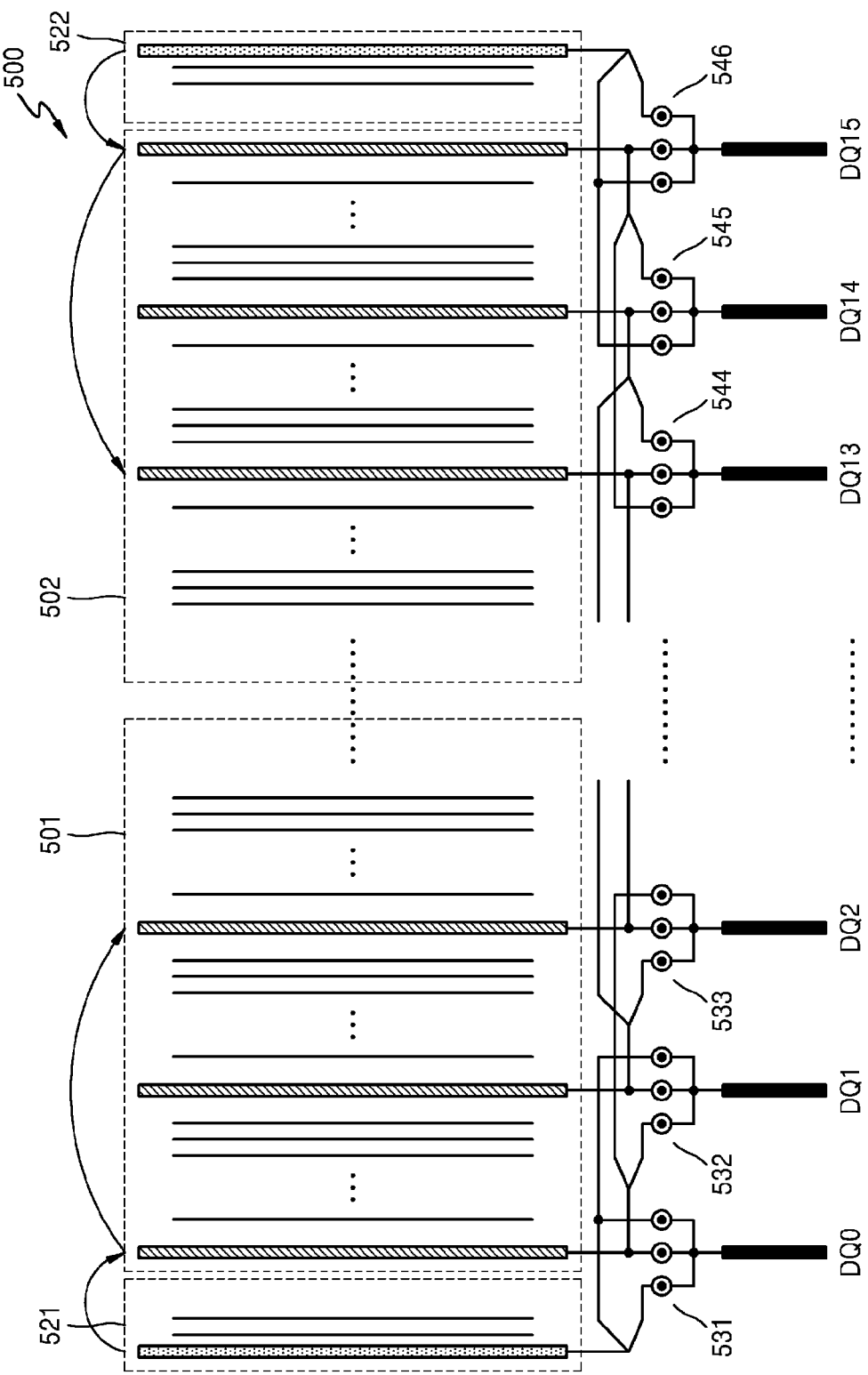
FIG. 10 is a circuit diagram for describing an operation of a semiconductor memory device in an X16 data width option of operation.

FIG. 10 shows a case where the semiconductor memory device 500 operates in the X16 option. As shown in FIG. 10, first to sixteenth data are output to input/output nodes DQ0 to DQ15 by accessing sixteen memory cell groups, wherein a defective cell in eight memory cell groups included in a first memory cell array 501 may be repaired using one redundancy memory cell group 521, and a defective cell in eight memory cell groups included in a second memory cell array 502 may be repaired using another redundancy memory cell group 522. When the semiconductor memory device 500 operates in the X16 data width option, access to the sixteen memory cell groups is performed, and accordingly, data in the sixteen memory cell groups may be output as first to sixteenth data DQ0 to DQ15. However, when the semiconductor memory device 500 operates in the X8 data width option, only one of the first and second memory cell arrays 501 and 502 may be accessed. For example, the first memory cell array 501 is accessed, and accordingly, data in memory cell groups included in the first memory cell array 501 may be output.

In the current embodiment, in both the X16 data width option and the X8 data width option, a defective cell in eight memory cell groups may be flexibly repaired through a single redundancy global data line. That is, when a defective cell occurs in a particular memory cell group, repair may be performed by performing a shifting operation in units of single global data line even though a defective cell occurs in any location of eight memory cell groups. In addition, in the X4 data width option, a defective cell in four memory cell groups may be flexibly repaired through a single redundancy global data line according to selected memory cell groups. For example, a defective cell in an even area or an odd area may be repaired through a single redundancy global data line.

Figure 11:
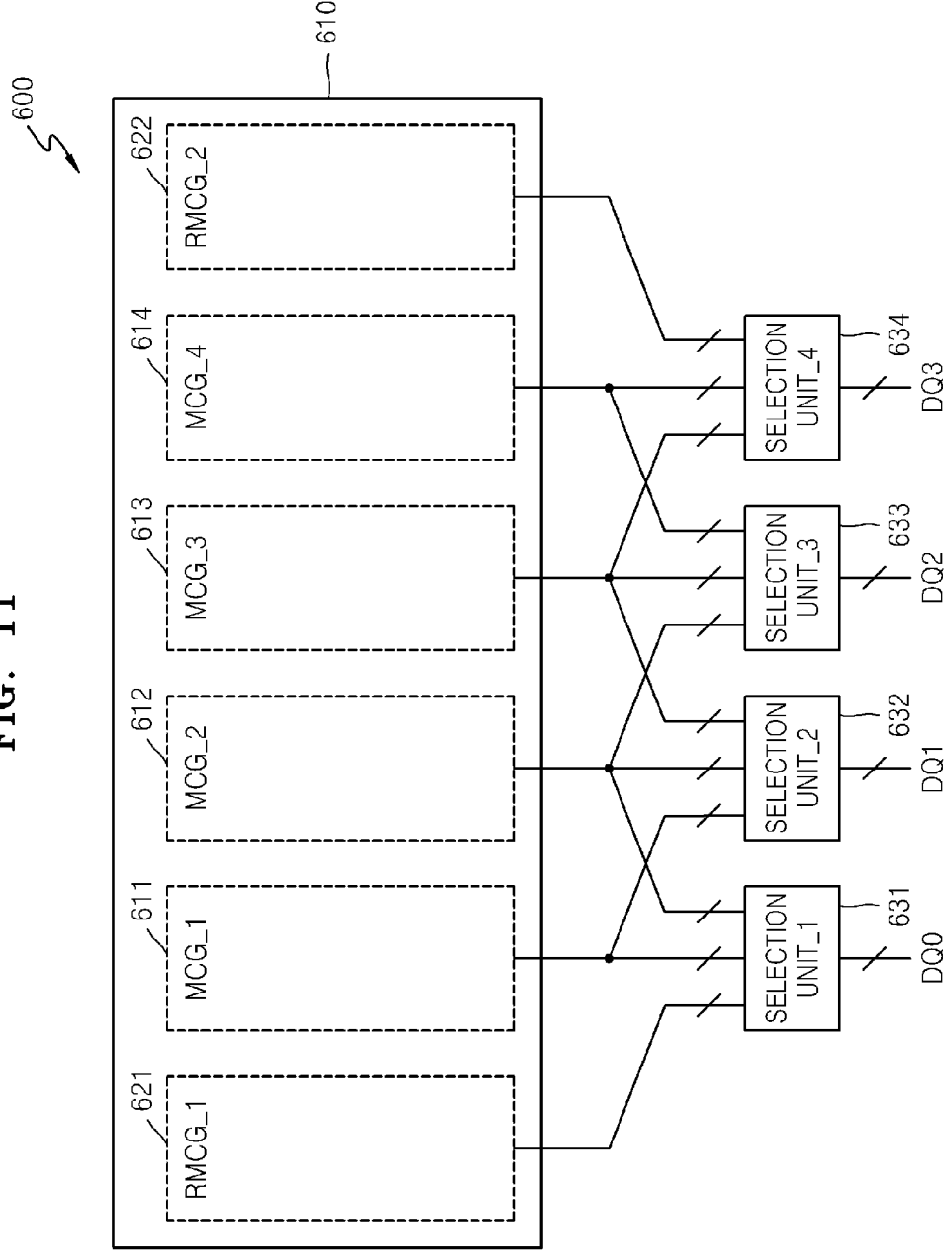
FIG. 11 is a block diagram of a semiconductor memory device according to another embodiment of the inventive concepts.

FIG. 11 is a block diagram of a semiconductor memory device 600 according to another embodiment of the inventive concepts. FIG. 11 shows an example in which a repair operation is performed in correspondence with various data width options, and a data line shifting operation for repair is performed in both directions unlike the one-directional shifting in the embodiments described above. In addition, FIG. 11 shows an example in which four memory cell groups 611 to 614 and two redundancy memory cell groups 621 and 622 are included in a memory cell array 610 and first to fourth selection units 631 to 634 are arranged in correspondence with the four memory cell groups 611 to 614.

As shown in FIG. 11, first to fourth input/output nodes DQ0 to DQ3 are connected to the first to fourth selection units 631 to 634. A switching operation of the first selection unit 631 is performed with a first redundancy global data line and first and second global data lines connected thereto. Similarly, first to third global data lines are connected to the second selection unit 632, second to fourth global data lines are connected to the third selection unit 633, and third and fourth global data lines and a second redundancy global data line are connected to the fourth selection unit 634.

In the embodiment of FIG. 11, since the two redundancy memory cell groups 621 and 622 are arranged in correspondence with a desired (or, alternatively a predetermined) number of memory cell groups, defective cells in at least two memory cell groups may be simultaneously repaired. That is, even when a fault simultaneously occurs in two of memory cells accessed in response to a single column selection signal, the two memory cells may be simultaneously repaired. In more detail, a defective cell in memory cell groups corresponding to a half of the entire memory cell groups may be repaired using one redundancy memory cell group, and a defective cell in memory cell groups corresponding to the remaining half may be repaired using the other redundancy memory cell group. Operations of the semiconductor memory device 600 of FIG. 11 will now be described in detail with reference to FIGS. 12 to 14.

Figure 12:
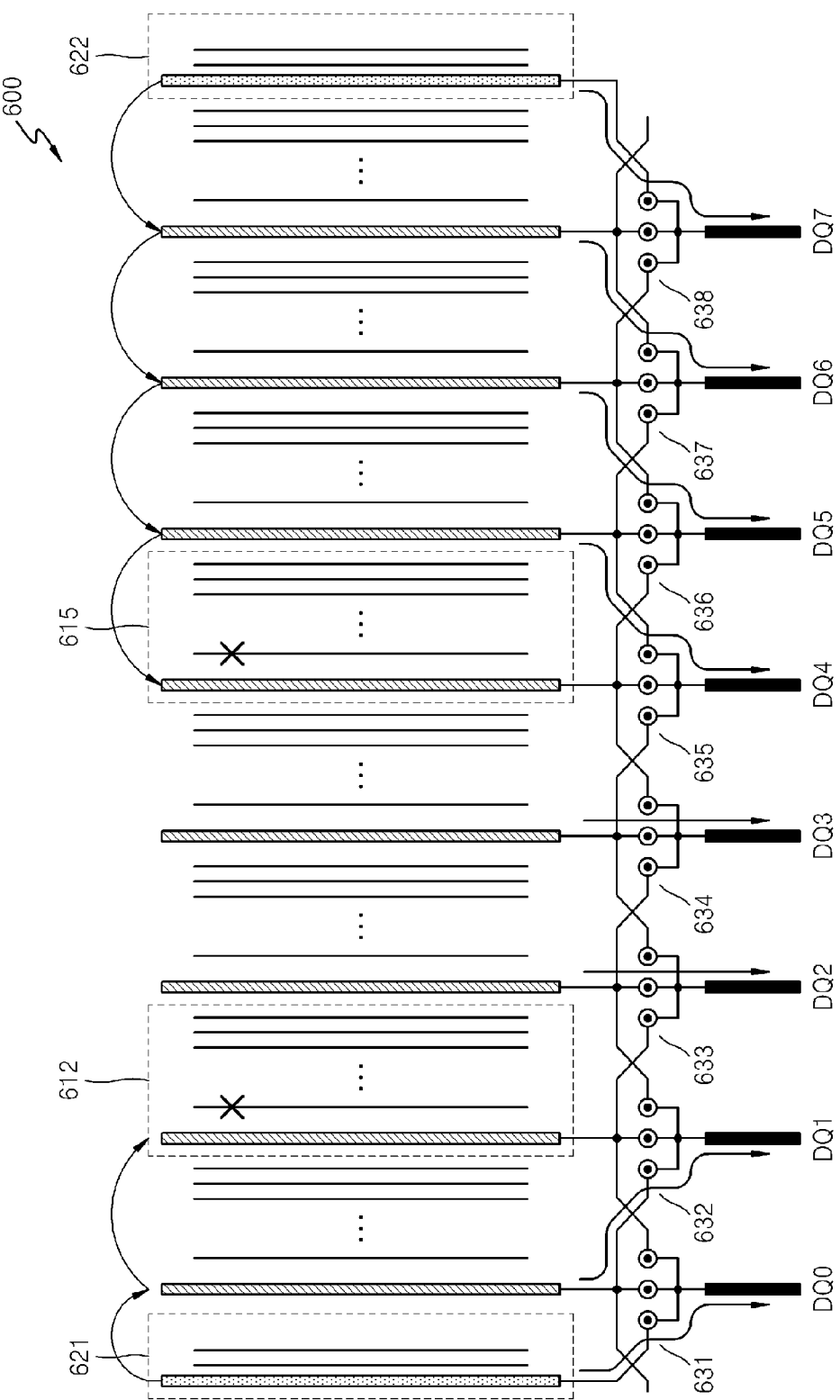
FIG. 12 is a circuit diagram of the semiconductor memory device of FIG. 11.

FIG. 12 is a circuit diagram of an example of the semiconductor memory device 600 of FIG. 11. FIG. 12 shows an example in which the first and second redundancy memory cell groups 621 and 622 are arranged in correspondence with first to eighth memory cell groups. In addition, first to eighth selection units 631 to 638 are arranged in correspondence with the first to eighth memory cell groups, and when the X8 option is selected, first to eighth data to first eighth input/output nodes DQ0 to DQ7 are output through the first to eighth selection units 631 to 638. As in the embodiment described above, when the semiconductor memory device 600 operates in the X16 option, ninth to sixteenth data (not shown) are output by accessing other eight memory cell groups (not shown).

The first redundancy memory cell group 621 is used to repair a defective cell in four memory cell groups. For example, the first redundancy memory cell group 621 is used to repair a defective cell in the first to fourth memory cell groups, and the second redundancy memory cell group 622 is used to repair a defective cell in the fifth to eighth memory cell groups. As shown in FIG. 12, a defective cell in the second memory cell group 612 is repaired using the first redundancy memory cell group 621, and a defective cell in the fifth memory cell group 615 is repaired using the second redundancy memory cell group 622.

Figure 13A:
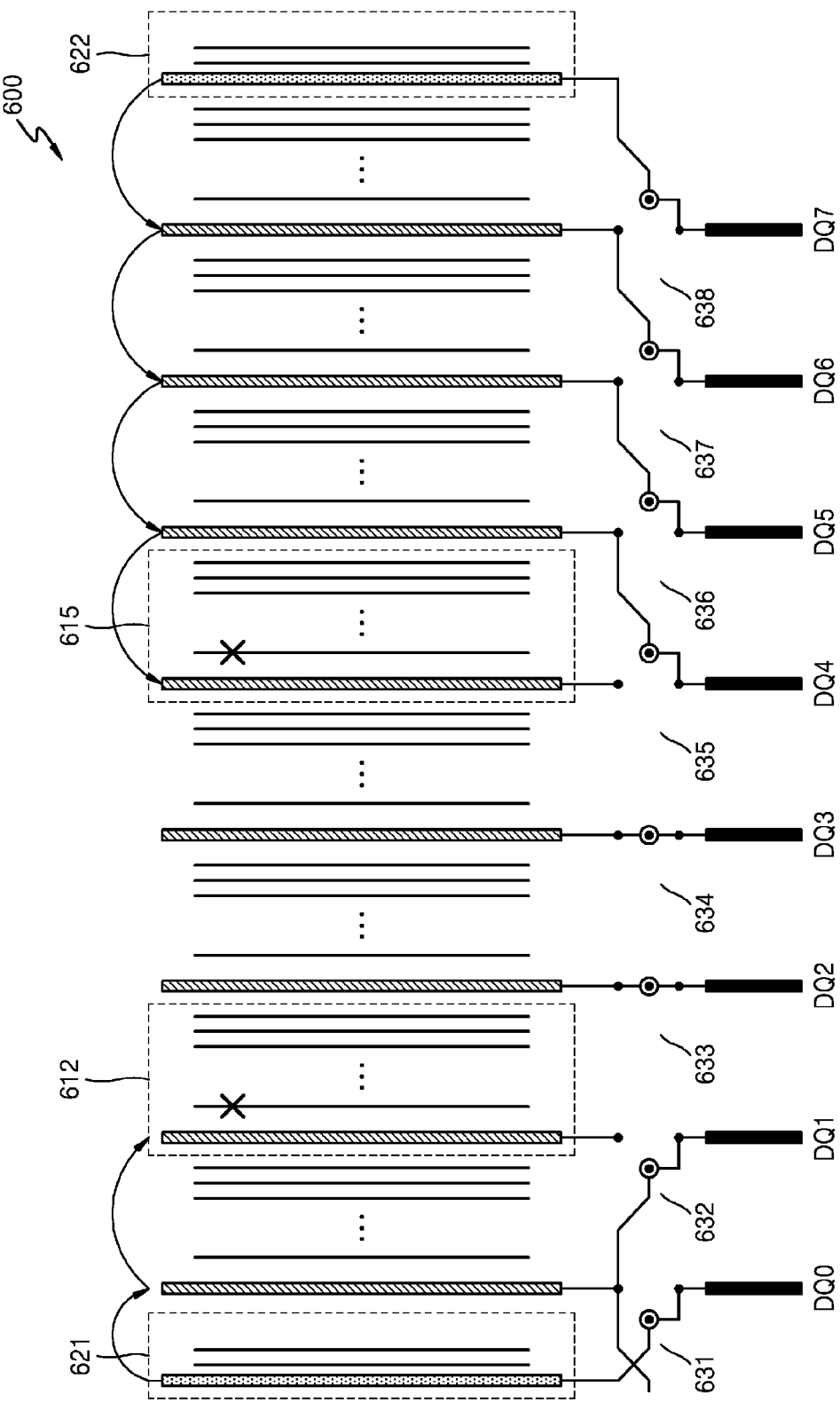
FIGS. 13A to 13C are circuit diagrams for describing operations of the semiconductor memory device of FIG. 12 in X8 and X4 data width options.
Figure 13B:
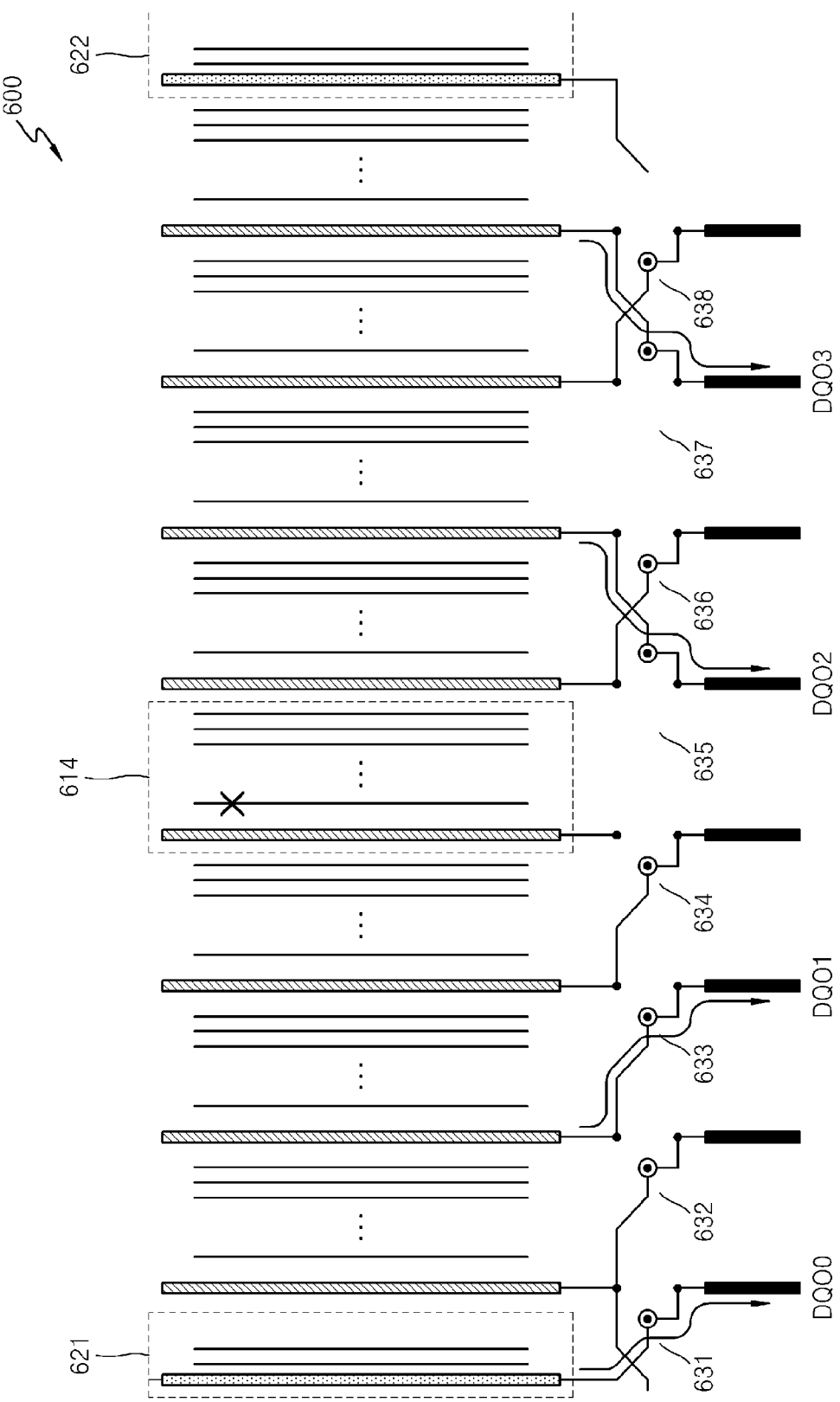
Figure 13C:
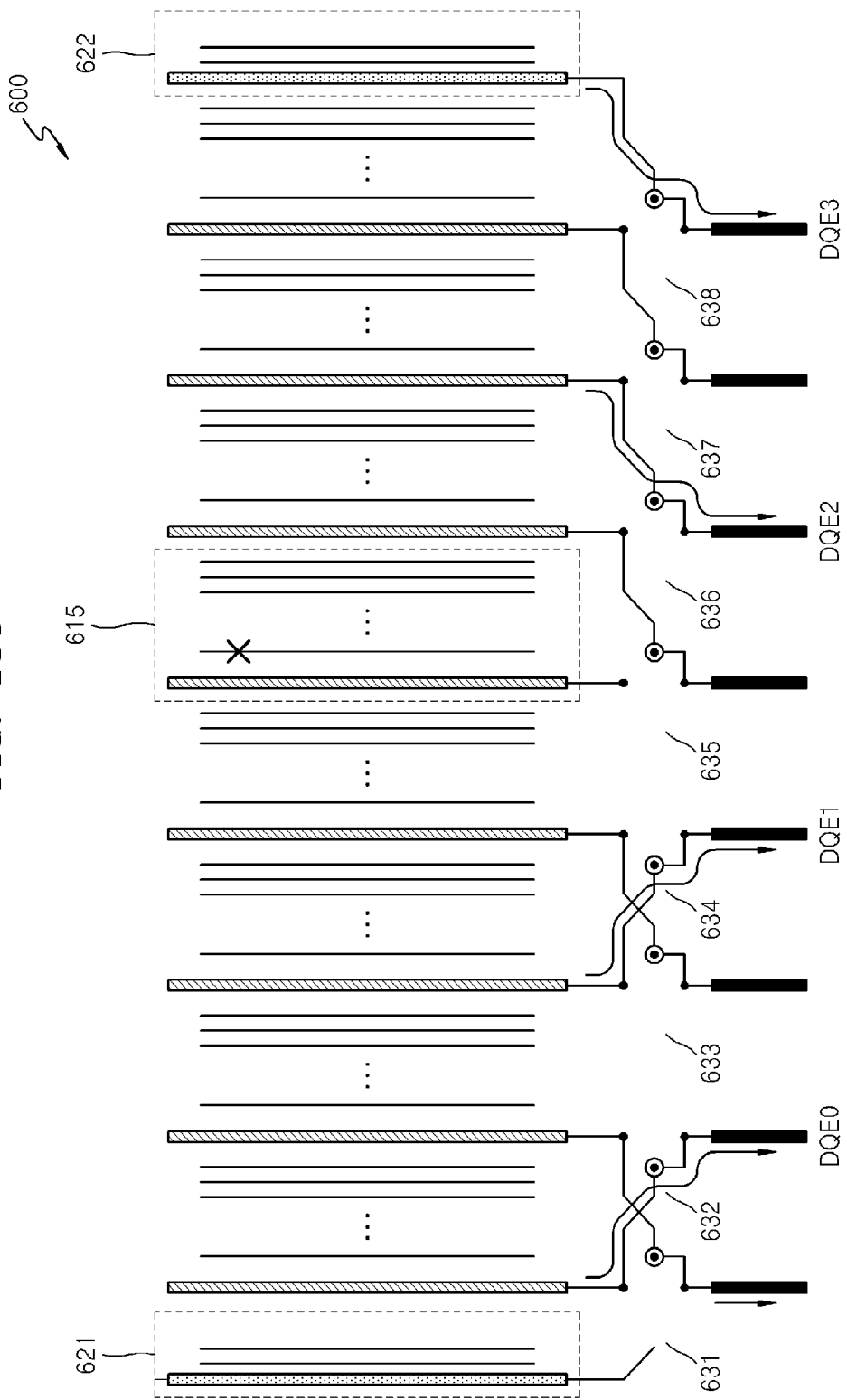

FIGS. 13A to 13C are circuit diagrams for describing operations of the semiconductor memory device 600 of FIG. 12 in the X8 and X4 data width options. FIG. 13A shows an example in which the X8 data width option is set. When a defective cell in the second memory cell group 612 is accessed, an output of data in the second memory cell group 612 is blocked, and instead, data transferred through a first redundancy global data line corresponding to the first redundancy memory cell group 621 is output as first data DQ0 through the first selection unit 631. Similarly, data transferred through a first global data line is output as second data DQ1 through the second selection unit 632 by a shifting operation of the first global data line. Data transferred through third and fourth global data lines is output as third and fourth data to DQ2 and DQ3 without a shifting operation.

A defective cell in the fifth memory cell group 615 is repaired using the second redundancy memory cell group 622. Data transferred through the second redundancy global data line corresponding to the second redundancy memory cell group 622 is output as eighth data to DQ7 through the eighth selection unit 638. Similarly, a shifting operation of sixth to eighth global data lines is performed, and accordingly, data transferred through the sixth to eighth global data lines is output as fifth to seventh data to DQ4 to DQ6 through the fifth to seventh selection units 635 to 637.

FIGS. 13B and 13C show examples in which the semiconductor memory device 600 operates in the X4 data width option. As shown in FIG. 13B, when a defective cell in any one of four memory cell groups on the left is accessed, the defective cell is repaired using the first redundancy memory cell group 621. However, as shown in FIG. 13C, when a defective cell in any one of four memory cell groups on the right is accessed, the defective cell is repaired using the second redundancy memory cell group 622.

Referring to FIG. 13B, when the X4 option is set, four memory cell groups may be simultaneously accessed. For example, eight memory cell groups are classified into an even area and an odd area. Data in the second, fourth, sixth, and eighth memory cell groups included in the even area may be accessed, and the accessed data is output as first to fourth data DQO0 to DQO3. As shown in FIG. 13B, a defective cell in the fourth memory cell group 614 of the even area is repaired using the first redundancy memory cell group 621, and an output of data in the fourth memory cell group 614 is blocked by a data line shifting operation. Data transferred through the first redundancy global data line corresponding to the first redundancy memory cell group 621 is output as first data to DQO0 through the first selection unit 631. In addition, data transferred through the second global data line connected to the second memory cell group 612 is output as second data to DQO1 through the third selection unit 633.

The global data lines arranged in the right of FIG. 13B are shifted in the opposite direction (e.g., the left direction in FIG. 13B), and accordingly, data transferred through the sixth and eighth global data lines respectively connected to the sixth and eighth memory cell groups is output as third and fourth data to DQO2 and DQO3 through the fifth and seventh selection units 635 and 637.

FIG. 13C shows an example in which the first, third, fifth, and seventh memory cell groups in the odd area are accessed, and a defective cell in the fifth memory cell group 615 is repaired. As shown in FIG. 13C, to repair the defective cell in the fifth memory cell group 615, data transferred through the second redundancy global data line corresponding to the second redundancy memory cell group 622 is output as fourth data to DQE3 through the eighth selection unit 638. In addition, data in the first, third, and seventh memory cell groups in which no defective cell occurs is output as first to third data to DQE0 to DQE2 through the second, fourth, and sixth selection units 632, 634, and 636, respectively.

Figure 14:
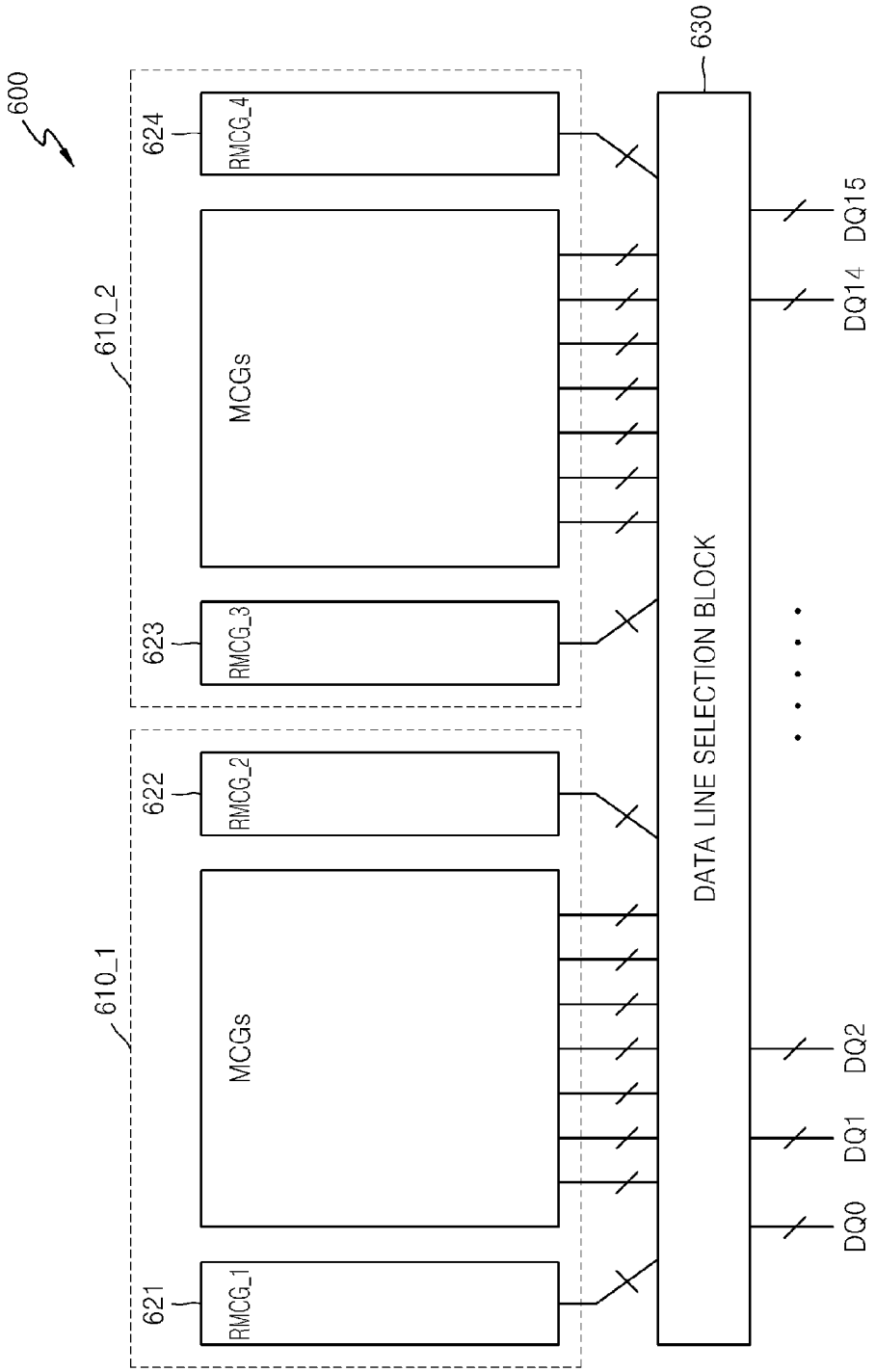
FIG. 14 is a block diagram for describing an operation of the semiconductor memory device of FIG. 12 in the X16 data width option.

FIG. 14 shows an example in which the semiconductor memory device 600 operates in the X16 data width option, wherein data from a first cell array 610_1 and a second cell array 610_2 is accessed and output as first to sixteenth data to DQ0 to DQ15. The first cell array 610_1 includes a plurality of memory cell groups and the first and second redundancy memory cell groups 621 and 622. Similarly, the second cell array 610_2 includes a plurality of memory cell groups and third and fourth redundancy memory cell groups 623 and 624.

A data line selection block 630 includes a plurality of selection units (not shown) that may perform the switching operations as described in FIGS. 13A, 13B, and 13C. Accordingly, a defective cell is blocked from being accessed and output to the outside on the basis of a data line selection operation, and instead, data obtained by accessing the first to fourth redundancy memory cell groups 621 to 624 is output. When the semiconductor memory device 600 operates in the X8 data width option, any one of the first and second cell arrays 610_1 and 610_2 may be accessed, and when the semiconductor memory device 600 operates in the X4 data width option, a half of the plurality of memory cell groups in any one of the first and second cell arrays 610_1 and 610_2 may be accessed.

According to the embodiment described above, redundancy memory cell groups are arranged on both sides (e.g., the left and right) of one cell array, and repair may be performed using any one of the redundancy memory cell groups according to a location of a defective cell. In addition, two defective cells may be simultaneously accessed, and in this case, the two defective cells may be simultaneously repaired using the two redundancy memory cell groups. For example, a defective cell in memory cell groups of an even area may be repaired using any one of the two redundancy memory cell groups according to a location of a memory cell group including the defective cell.

Figure 15:
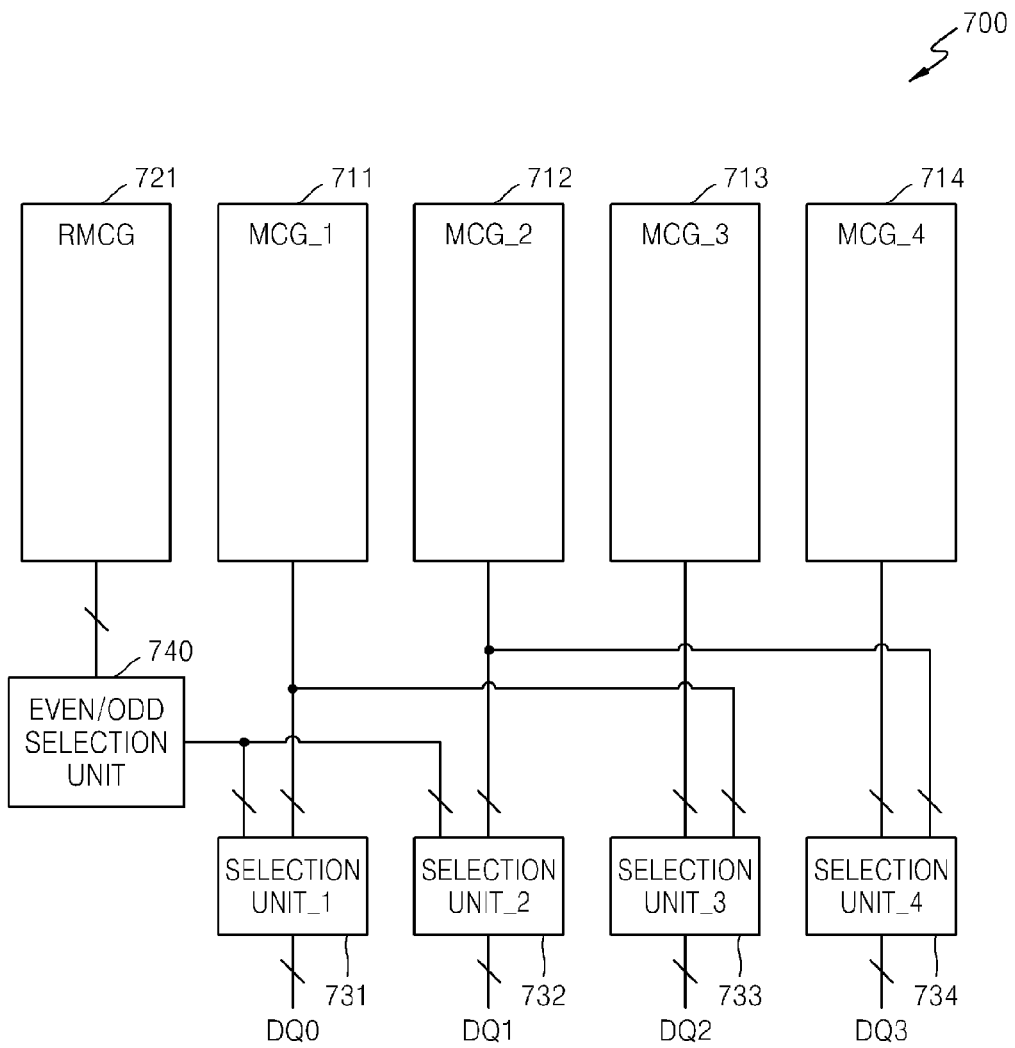
FIG. 15 is a block diagram of a semiconductor memory device according to another embodiment of the inventive concepts.

FIG. 15 is a block diagram of a semiconductor memory device 700 according to another embodiment of the inventive concepts. FIG. 15 shows an example in which a defective cell is repaired in various data width options even when a data line selection block uses 2:1 MUXs.

As shown in FIG. 15, the semiconductor memory device 700 may include a plurality of memory cell groups (e.g., first to fourth memory cell groups 711 to 714), wherein the first to fourth memory cell groups 711 to 714 may be classified into a plurality of areas (e.g., an even area and an odd area). In addition, the semiconductor memory device 700 may include a redundancy memory cell group 721 for repairing a defective cell in the first to fourth memory cell groups 711 to 714. In addition, the semiconductor memory device 700 may include first to fourth selection units 731 to 734 as the data line selection block and an even/odd selection unit 740 for selecting repair of the even area or the odd area. A redundancy global data line may be connected to the first or second selection unit 731 or 732 on the basis of a switching operation of the even/odd selection unit 740.

In the embodiment of FIG. 15, since repair is performed on the basis of even or odd areas, a data line shifting operation may be performed in a group unit of two global data lines. Accordingly, the third selection unit 733 is connected to first and third global data lines connected to the first and third memory cell groups 711 and 713, and the fourth selection unit 734 is connected to second and fourth global data lines connected to the second and fourth memory cell groups 712 and 714. The first selection unit 731 is connected to the redundancy global data line connected to the redundancy memory cell group 721 and the first global data line connected to the first memory cell group 711, and the second selection unit 732 is connected to the redundancy global data line connected to the redundancy memory cell group 721 and the second global data line connected to the second memory cell group 712.

According to the embodiment of FIG. 15, when a defective cell in the odd area (e.g., the first and third memory cell groups 711 and 713) is repaired, the redundancy global data line is connected to the first selection unit 731 on the basis of a switching operation of the even/odd selection unit 740, and when a defective cell in the even area (e.g., the second and fourth memory cell groups 712 and 714) is repaired, the redundancy global data line is connected to the second selection unit 732 on the basis of a switching operation of the even/odd selection unit 740. Accordingly, a defective cell may be repaired in various data width options, such as the X4, X8, and X16 data width options, using 2:1 MUXs, and operations related thereto will now be described in detail with reference to FIGS. 16, 17A, and 17B.

Figure 16:
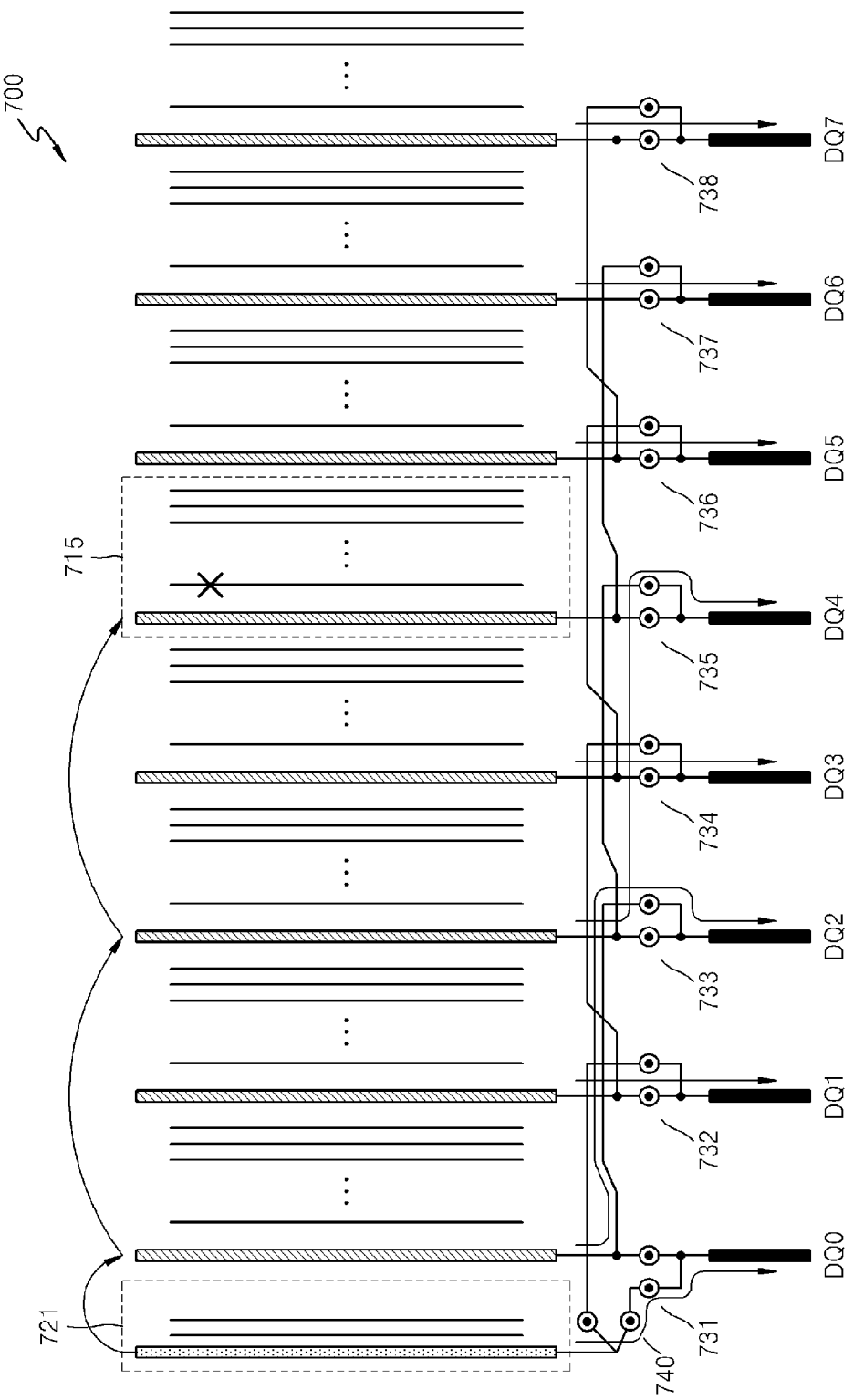
FIGS. 16, 17A, and 17B are circuit diagrams for describing operations of the semiconductor memory device of FIG. 15.

As shown in FIG. 16, the semiconductor memory device 700 may include a plurality of memory cell groups, the redundancy memory cell group 721, and first to eighth selection units 731 to 738 for shifting data lines to repair a defective cell. The semiconductor memory device 700 may further include the even/odd selection unit 740 for selecting the even area or the odd area, wherein each of the first to eighth selection units 731 to 738 and the even/odd selection unit 740 may include at least one 2:1 MUX. Alternatively, the even/odd selection unit 740 may include a pair of transistors. The even/odd selection unit 740 may be controlled based on the even/odd operation mode indicated, for example, by the CA11 bit stored in the selection control logic 270. Still further, the even/odd selection unit 740 may be eliminated in favor of direct connections of the redundant global data line to the first and second selection units 731 and 732; however, use of the even/odd selection unit 740 reduces load on the selection units 731 and 732.

FIG. 16 shows an example in which first to eighth data DQ0 to DQ7 are output from eight memory cell groups according to the X8 or X16 data width options. If a defective cell in a fifth memory cell group 715 of the odd area is accessed, data transferred through a redundancy global data line is input to the first selection unit 731 on the basis of a switching operation of the even/odd selection unit 740 and is output as first data to DQ0.

A shifting operation between global data lines corresponding to memory cell groups in the odd area is performed on the basis of a switching operation of the selection units 731 to 738, and accordingly, the defective cell in the fifth memory cell group 715 is repaired. For example, data transferred through a first global data line is output as third data to DQ2 through the third selection unit 733, and data transferred through a third global data line is output as fifth data to DQ4 through the fifth selection unit 735. An output of data transferred through a fifth global data line connected to the defective cell is blocked, and data transferred through a seventh global data line is output as seventh data to DQ6 through the seventh selection unit 737.

A shifting operation of global data lines corresponding to memory cell groups in the even area does not have to be performed, and accordingly, data transferred through second, fourth, sixth, and eighth global data lines corresponding to second, fourth, sixth, and eighth memory cell groups may be output through the second, fourth, sixth, and eighth selection units 732, 734, 736, and 738.

Figure 17A:
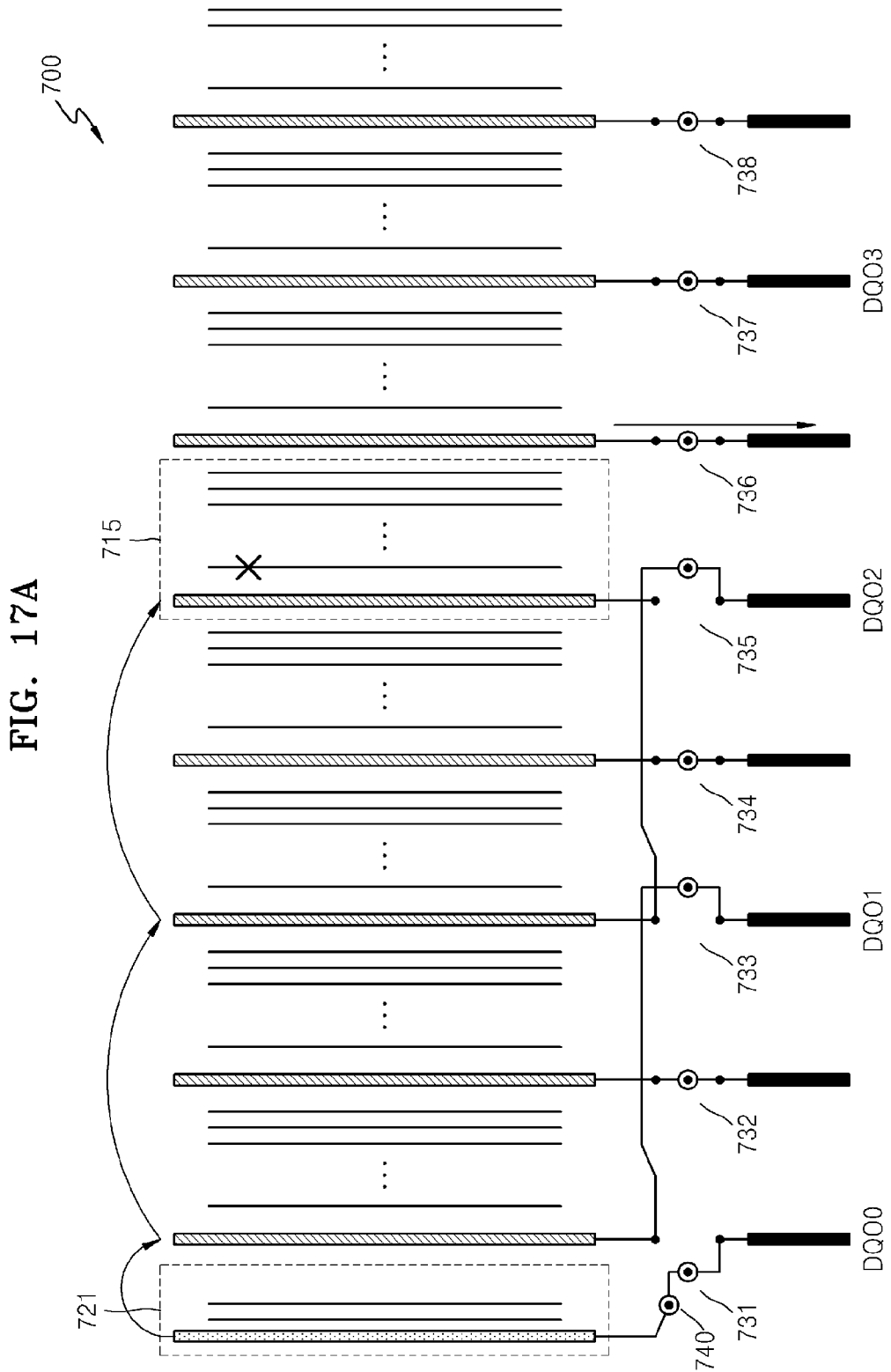
Figure 17B:
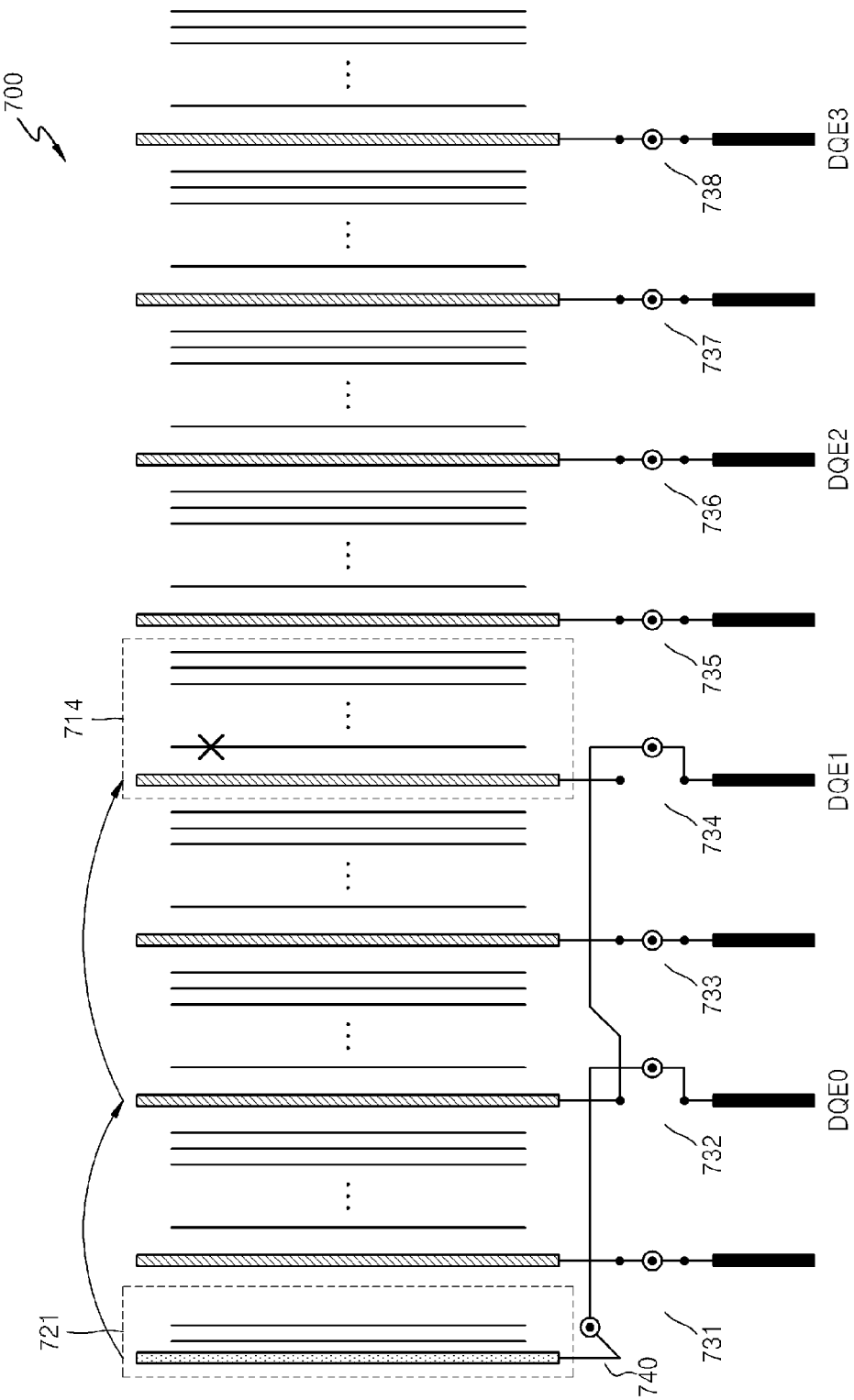

FIGS. 17A and 17B show examples in which the semiconductor memory device 700 operates in the X4 data width option. FIG. 17A shows an example in which a defective cell occurs in a memory cell group of the odd area, and FIG. 17B shows an example in which a defective cell occurs in a memory cell group of the even area.

As shown in FIG. 17A, when a defective cell occurs in the fifth memory cell group 715 belonging to the odd area, data transferred through the redundancy global data line is output as first data to DQO0 through the first selection unit 731 on the basis of a switching operation of the even/odd selection unit 740. In addition, a shifting operation is performed up to the fifth memory cell group 715 including the defective cell, and accordingly, data transferred through the first and third global data lines are output as second and third data to DQO1 and DQO2 through the third and fifth selection units 733 and 735, respectively. Data transferred through the seventh global data line is output as fourth data to DQO3 through the seventh selection unit 737.

Access to the memory cell groups belonging to the even area is not performed, and accordingly, the selection units corresponding to the even area (e.g., the second, fourth, sixth, and eighth selection units 732, 734, 736, and 738) may maintain a switching connection state of the corresponding global data lines (e.g., the second, fourth, sixth, and eighth global data lines) or may block connections thereof.

As shown in FIG. 17B, when a defective cell occurs in a fourth memory cell group 714 belonging to the even area, data transferred through the redundancy global data line is output as first data to DQE0 through the second selection unit 732 on the basis of a switching operation of the even/odd selection unit 740. In addition, a shifting operation is performed up to the fourth memory cell group 714 including the defective cell, and accordingly, data transferred through the second global data line is output as second data to DQE1 through the fourth selection unit 734. Data transferred through the sixth and eighth global data lines are output as third and fourth data to DQE2 and DQE3 through the sixth and eighth selection units 736 and 738, respectively.

Figure 18:
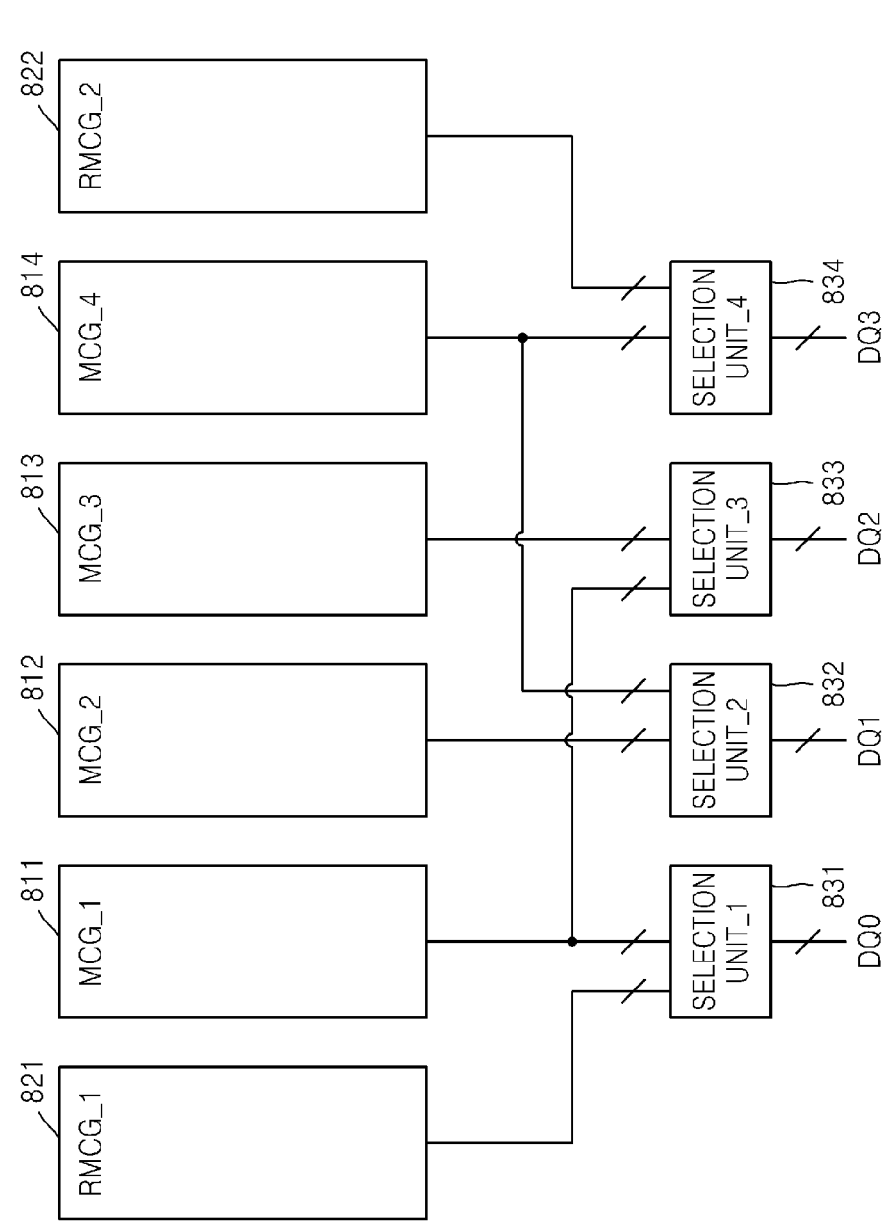
FIG. 18 is a block diagram of a semiconductor memory device according to another embodiment of the inventive concepts.

FIG. 18 is a block diagram of a semiconductor memory device 800 according to another embodiment of the inventive concepts. FIG. 18 shows an example in which a weak cell is repaired in various data width modes even when a data line selection block uses 2:1 MUXs, wherein weak cells in two memory cell groups are simultaneously repaired.

As shown in FIG. 18, the semiconductor memory device 800 may include a plurality of memory cell groups (e.g., first to fourth memory cell groups 811 to 814) and a plurality of redundancy memory cell groups (e.g., first and second redundancy memory cell groups 821 and 822). In addition, the first to fourth memory cell groups 811 to 814 may be classified into a plurality of areas, e.g., an even area and an odd area. In addition, the first and second redundancy memory cell groups 821 and 822 include the first redundancy memory cell group 821 for repairing a defective cell in the odd area (e.g., the first and third memory cell groups 811 and 813) and the second redundancy memory cell group 822 for repairing a defective cell in the even area (e.g., the second and fourth memory cell groups 812 and 814). In addition, the semiconductor memory device 800 may include first to fourth selection units 831 to 834 as a data line selection block.

Although repair of the even or odd area is performed using a single redundancy memory cell group on the basis of a switching operation of the even/odd selection unit 740 in the previous embodiment, according to the current embodiment, repair of any one memory cell group belonging to one of the even and odd areas is performed using the first redundancy memory cell group 821, and repair of any one memory cell group belonging to the other one area is performed using the second redundancy memory cell group 822. Accordingly, as shown in FIG. 18, a data line shifting operation for repair may be performed in a group unit of two global data lines.

A first redundancy global data line corresponding to the first redundancy memory cell group 821 is connected to the first selection unit 831, and a first global data line corresponding to the first memory cell group 811 is commonly connected to the first and third selection units 831 and 833. In addition, a second redundancy global data line corresponding to the second redundancy memory cell group 822 is connected to the fourth selection unit 834, and a fourth global data line corresponding to the fourth memory cell group 814 is commonly connected to the second and fourth selection units 832 and 834. Operations of the semiconductor memory device 800 of FIG. 18 will now be described in detail with reference to FIGS. 19A to 19C.

Figure 19A:
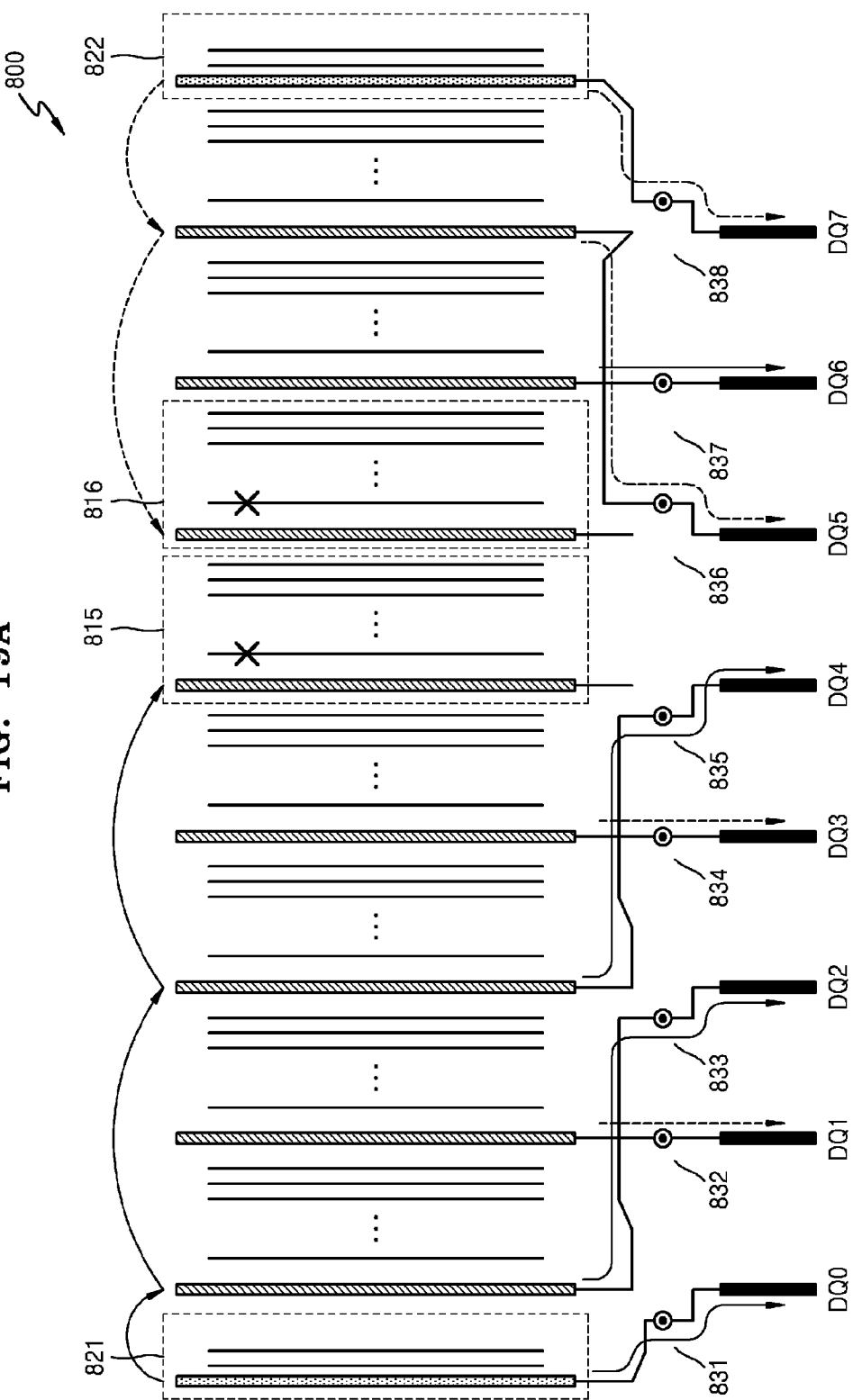

As shown in FIG. 19A, the semiconductor memory device 800 may include a plurality of memory cell groups, the first and second redundancy memory cell groups 821 and 822, and first to eighth selection units 831 to 838 for repairing weak cells by shifting data lines. Each of the first to eighth selection units 831 to 838 may include at least one 2:1 MUX.

FIG. 19A shows an example in which first to eighth data on input/output nodes DQ0 to DQ7 are output from eight memory cell groups according to the X8 or X16 options, wherein when defective cells in fifth and sixth memory cell groups 815 and 816 are accessed, the defective cells are repaired.

A defective cell in the fifth memory cell group 815 belonging to the odd area is repaired using the first redundancy memory cell group 821. To do so, a data line shifting operation is performed, and as shown in FIG. 19A, data transferred through the first redundancy global data line is output as first data to DQ0 through the first selection unit 831. In addition, data transferred through a first global data line is output as third data to DQ2 through the third selection unit 833 by a shifting operation, and data transferred through a third global data line is output as fifth data to DQ4 through the fifth selection unit 835 by a shifting operation. An output of data transferred through a fifth global data line is blocked, and data transferred through a seventh global data line is output as seventh data to DQ6 through the seventh selection unit 837.

A defective cell in the sixth memory cell group 816 belonging to the even area is repaired using the second redundancy memory cell group 822. To do so, a data line shifting operation is performed, and as shown in FIG. 19A, data transferred through the second redundancy global data line is output as eighth data to DQ7 through the eighth selection unit 838. In addition, data transferred through an eighth global data line is output as sixth data to DQ5 through the sixth selection unit 836, and an output of data transferred through a sixth global data line is blocked. In addition, data transferred through second and fourth global data lines are output as second and fourth data to DQ1 and DQ3 through the second and fourth selection unit 832 and 834, respectively.

Figure 19C:
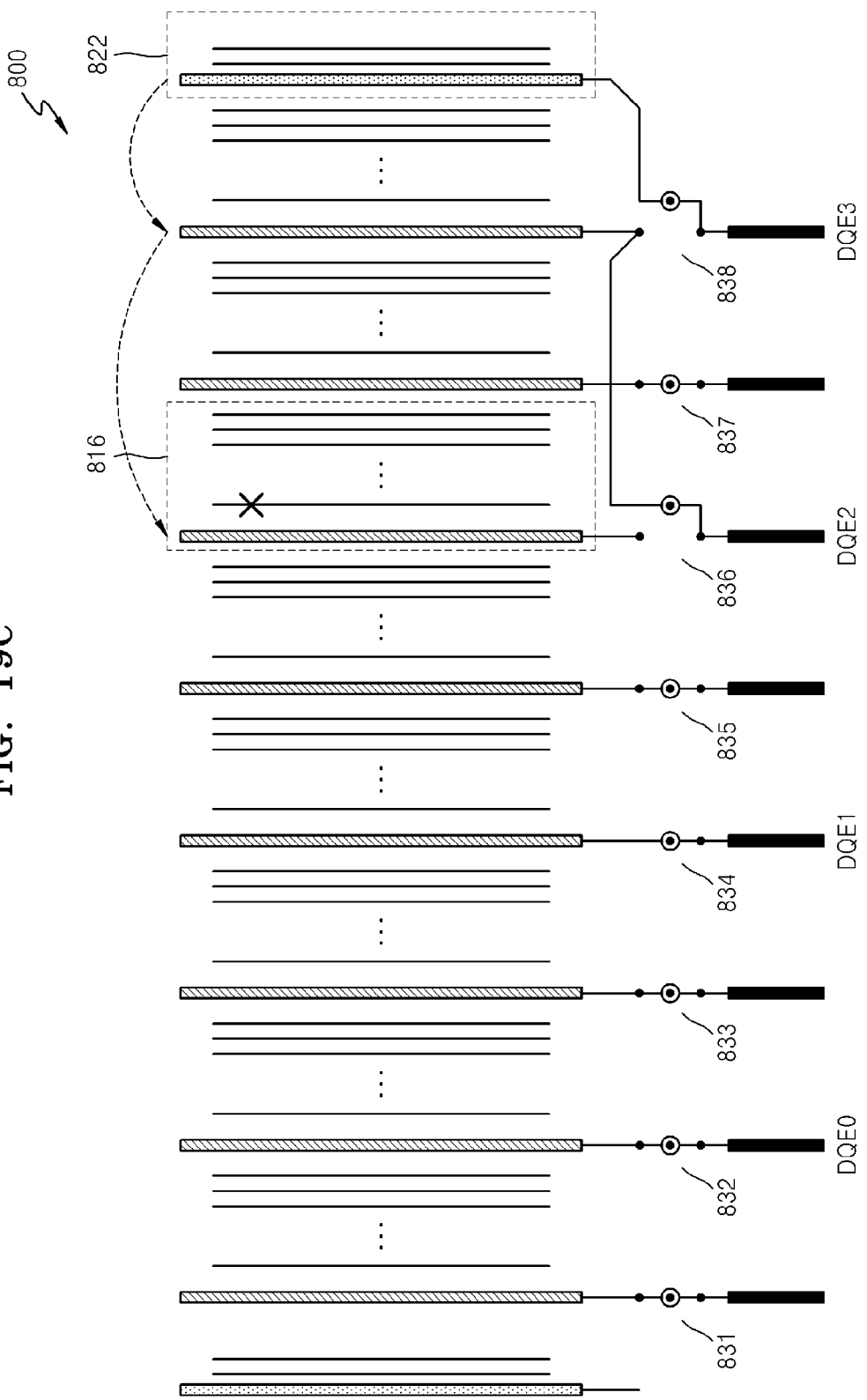

FIGS. 19B and 19C show examples in which the semiconductor memory device 800 of 19A operates in the X4 data width option. FIG. 19B shows an example in which a defective cell occurs in a memory cell group belonging to the odd area, and FIG. 19C shows an example in which a defective cell occurs in a memory cell group belonging to the even area.

As shown in FIG. 19B, when a defective cell occurs in the fifth memory cell group 815 belonging to the odd area, data transferred through the first redundancy global data line is output as first data to DQO0 through the first selection unit 831. In addition, a shifting operation is performed up to the fifth memory cell group 815 including the defective cell, and accordingly, data transferred through the first and third global data lines are output as second and third data to DQO1 and DQO2 through the third and fifth selection units 833 and 835, respectively. An output of data transferred through the fifth global data line is blocked, and data transferred through the seventh global data line is output as fourth data to DQO3 through the seventh selection unit 837.

As shown in FIG. 19C, when a defective cell occurs in the sixth memory cell group 816 belonging to the even area, data transferred through the second redundancy global data line is output as fourth data to DQE3 through the eighth selection unit 838. In addition, a shifting operation is performed up to the sixth memory cell group 816 including the defective cell, and accordingly, data transferred through the eighth global data line is output as third data to DQE2 through the sixth selection unit 836. An output of data transferred through the sixth global data line is blocked, and data transferred through the second and fourth global data lines are output as first and second data to DQE0 and DQE1 through the second and fourth selection units 832 and 834, respectively.

According to the embodiments described above, even though a semiconductor memory device operates using various options, such as the X16, X8, and X4 data width options, defective cells may be repaired, and a defective cell in a plurality of memory cell groups may be repaired using a single redundancy memory cell group. In addition, by arranging at least two redundancy memory cell groups per cell array including a plurality of memory cell groups, even when two or more defective cells are simultaneously accessed, the defective cells may be simultaneously repaired. For example, the plurality of memory cell groups may be classified into a plurality of areas, such as even and odd areas, and repair may be performed using a separate redundancy memory cell group in each area.

Figure 20:
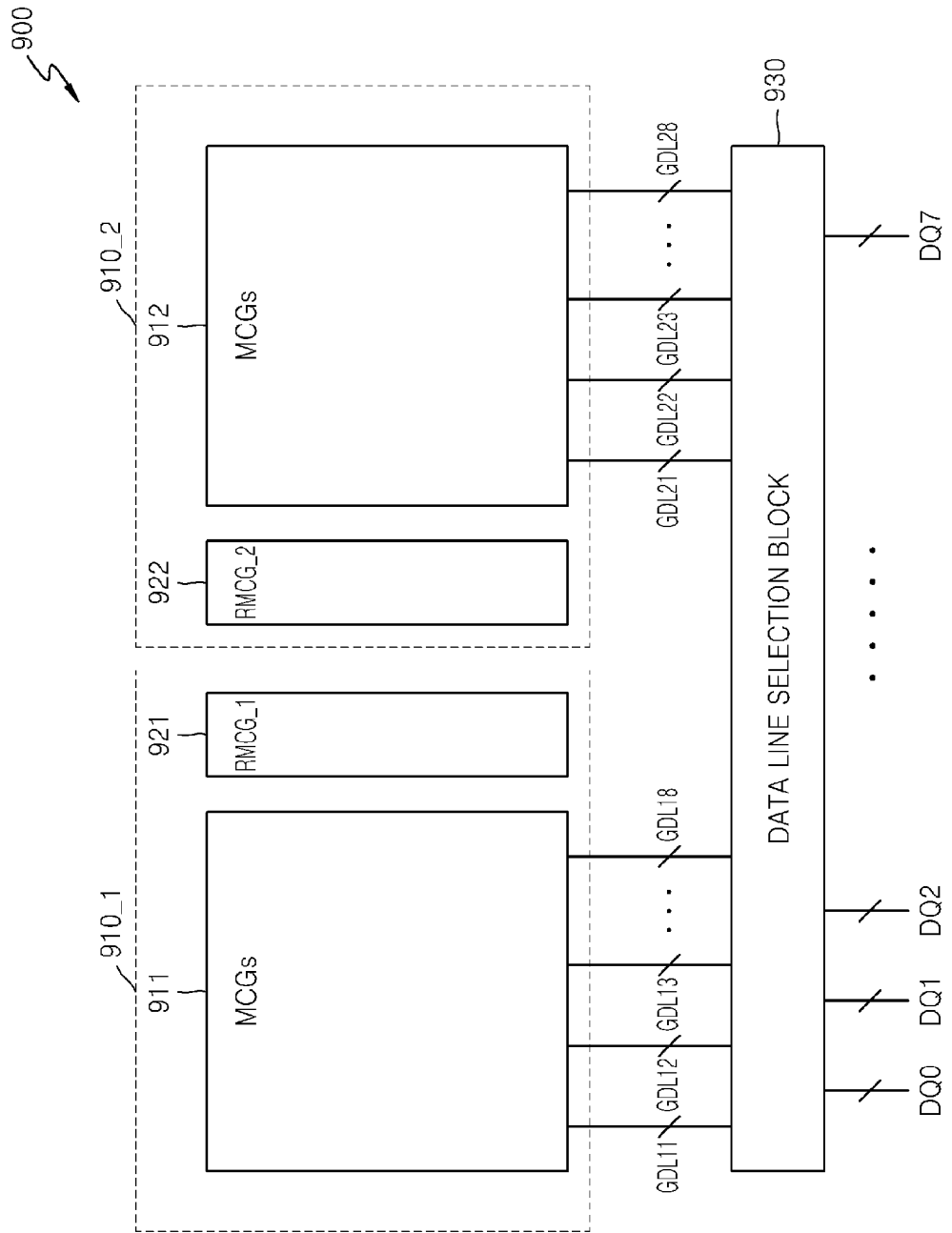
FIG. 20 is a block diagram of a semiconductor memory device according to another embodiment of the inventive concepts.

FIG. 20 is a block diagram of a semiconductor memory device 900 according to another embodiment of the inventive concepts. As shown in FIG. 20, the semiconductor memory device 900 may include one or more cell arrays 910_1 and 910_2 and a data line selection block 930. The memory cell arrays 910_1 and 910_2 may be on separate chips. A row decoder, a column decoder, and other peripheral circuits for a memory operation are not shown for convenience of description.

Each of the one or more cell arrays 910_1 and 9102 may include a plurality of memory cell groups MCGs and a redundancy memory cell group RMCG. For example, a first cell array 910_1 may include a plurality of memory cell groups 911 and a first redundancy memory cell group 921 corresponding to the plurality of memory cell groups 911, and a second cell array 910_2 may include a plurality of memory cell groups 912 and a second redundancy memory cell group 922 corresponding to the plurality of memory cell groups 912. When eight memory cell groups are arranged in each of the first and second cell arrays 910_1 and 910_2, the eight memory cell groups in the first cell array 910_1 are connected to first to eighth global data lines GDL11 to GDL18, respectively.

Repair is performed on the basis of a data line selection operation of the data line selection block 930. The data line selection block 930 is connected to a plurality of global data lines GDL11 to GDL18 and GDL21 to GDL28 connected to the first and second cell arrays 910_1 and 910_2, respectively, and blocks data in a defective cell from being output and controls data in a redundancy cell to be output instead by a data line selection operation. When a data width option is set to X8, the data line selection block 930 outputs first to eighth data DQ0 to DQ7 of which repair has been performed.

According to the current embodiment, the data line selection block 930 performs a selection operation of global data lines corresponding to memory cell groups without separately having redundancy global data lines corresponding to the first and second redundancy memory cell groups 921 and 922. In addition, the first redundancy memory cell group 921 may be used to repair a defective cell in the second cell array 910_2, and the second redundancy memory cell group 922 may be used to repair a defective cell in the first cell array 910_1. For example, when a defective cell occurs in the first cell array 910_1, data obtained by accessing the second redundancy memory cell group 922 is transferred to any one global data line in the second cell array 910_2 (e.g., the ninth global data line GDL21) according to a column selection operation, and the data line selection block 930 blocks data in the defective cell from being output by performing a data line selection operation and outputs the data in the second redundancy memory cell group 922 instead. When a defective cell occurs in a third memory cell group of the first cell array 910_1, the data line selection block 930 blocks data transferred through the third global data line GDL13 from being output and outputs data transferred through the ninth global data line GDL21 instead.

According to the embodiment of FIG. 20, an overhead area for arranging separate redundancy global data lines corresponding to the first and second redundancy memory cell groups 921 and 922 is not produced. Each of the first and second redundancy memory cell groups 921 and 922 is connected to any one of the global data lines by a column selection operation. Thus, a defective cell may be repaired by a selection operation of global data lines corresponding to any one of the first and second cell arrays 910_1 and 910_2 and a global data line connected to a redundancy memory cell group in the other one of the first and second cell arrays 910_1 and 910_2. Although not shown in FIG. 20, when the second cell array 910_2 is accessed, the data line selection block 930 outputs first to eighth data to DQ0 to DQ7 by performing a selection operation of the ninth to sixteenth global data lines GDL21 to GDL28 and the eighth global data line GDL18.

FIGS. 21A to 21D are circuit diagrams and block diagrams for describing the semiconductor memory device 900 of FIG. 20.

Figure 21A:
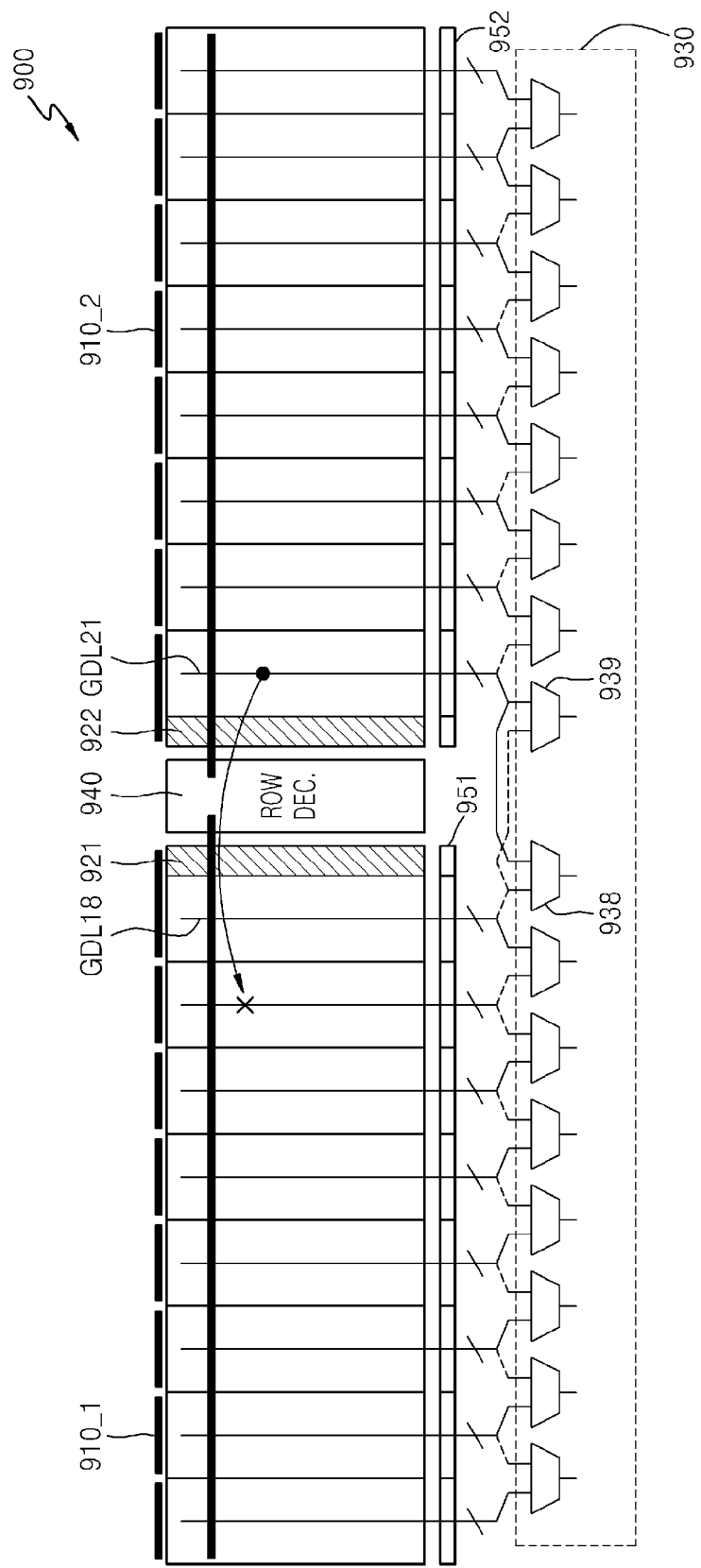
FIGS. 21A to 21D are circuit diagrams and block diagrams for describing the semiconductor memory device of FIG. 20.

As shown in FIG. 21A, the first cell array 910_1 may include a plurality of memory cell groups and the first redundancy memory cell group 921, and the second cell array 910_2 may include a plurality of memory cell groups and the second redundancy memory cell group 922. In addition, a row decoder 940 for operating word lines in the first and second cell arrays 910_1 and 910_2 and column decoders 951 and 952 for column selection operations may be further arranged. In addition, the data line selection block 930 may include a plurality of selection units. Each of the selection units includes at least one MUX, and FIG. 21A shows an example in which 2:1 MUXs are used. As shown, selection unit 938 is connected to the eighth global data line GDL18 in the first array 910_1 and the first global data line GDL21 in the second array 910_2. Similarly, the selection unit 939 is connected to the eighth global data line GDL18 in the first array 910_1 and the first global data line GDL21 in the second array 910_2

As described above, a defective cell in the first cell array 910_1 may be repaired using the second redundancy memory cell group 922 in the second cell array 910_2, and data in the second redundancy memory cell group 922 may be transferred through a global data line corresponding to the second cell array 910_2 on the basis of a column selection operation. For example, the data in the second redundancy memory cell group 922 is transferred through the ninth global data line GDL21 that is connected to the eighth selection unit 938 corresponding to the first cell array 910_1. The reverse of this operation, where the first redundancy memory cell group 921 repairs a defect in the second cell array 910_2 via the selection unit 939 may also be performed.

Figure 21B:
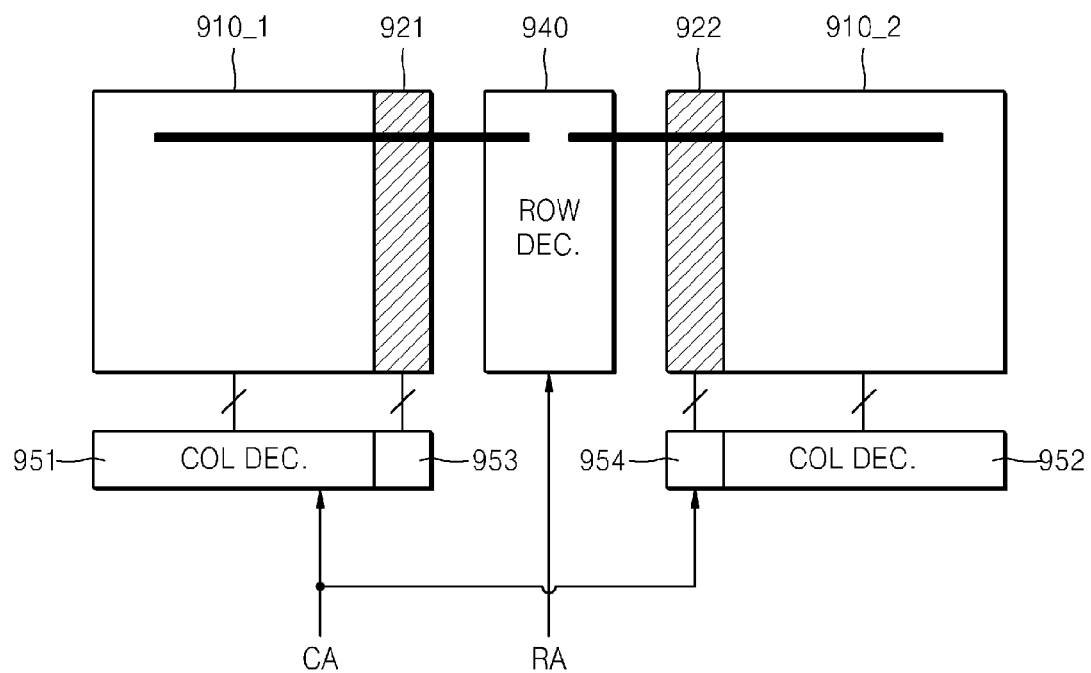

FIG. 21B shows an example in which the semiconductor memory device 900 of FIG. 21A performs row and column selection operations. As shown in FIG. 21B, the row decoder 940 operates the word lines in the first and second cell arrays 910_1 and 910_2, and the column decoder 950 may include first and second column decoders 951 and 952 that respectively correspond to the first and second cell arrays 910_1 and 910_2, and first and second redundancy column decoders 953 and 954 that respectively correspond to the first and second redundancy memory cell groups 921 and 922. A row address RA or a decoded row address is provided to the row decoder 940, and a column address CA of a decoded column address is provided to the column decoder 950.

The row decoder 940 simultaneously enables the word lines in the first and second cell arrays 910_1 and 910_2 in response to the row address RA. Accordingly, memory cells (e.g., normal memory cells) in any one of the first and second cell arrays 910_1 and 910_2 and redundancy cells in the other one of the first and second cell arrays 910_1 and 910_2 may be simultaneously selected.

Data in the normal memory cells and data in the redundancy cells may be transferred through data lines by a column selection operation according to the column address CA. For example, the column address CA may be provided to the first column decoder 951 corresponding to the first cell array 910_1 and the second redundancy column decoder 954 corresponding to the second redundancy memory cell group 922. As described above, according to enabling of a redundancy column selection line, data in redundancy cells may be transferred through a global data line. For example, data in the second redundancy memory cell group 922 may be transferred through the ninth global data line GDL21. In addition, whether the redundancy column selection line is enabled may be controlled by the column address matching operation in the embodiment described above.

Figure 21C:
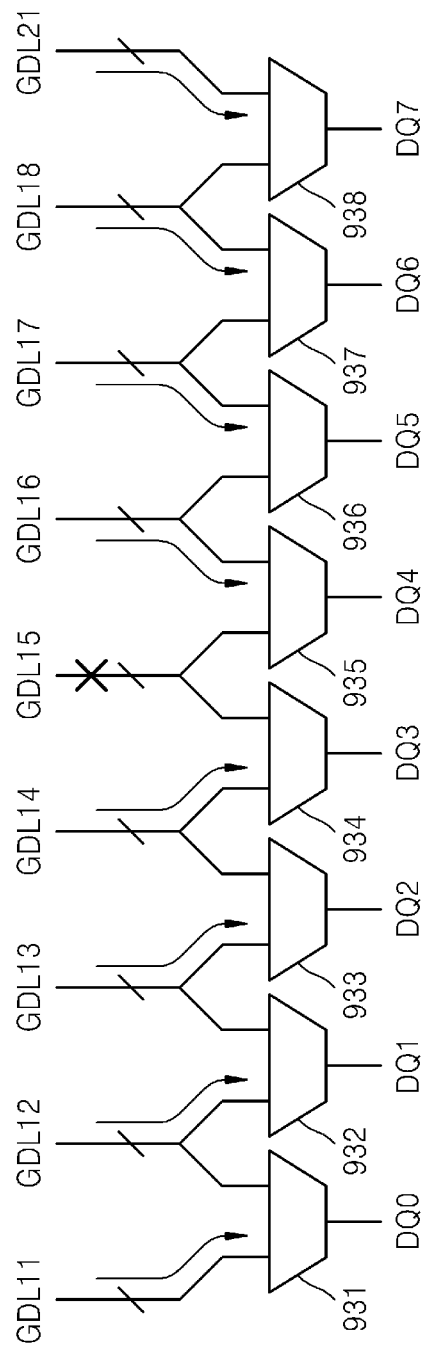

FIG. 21C shows an example of a data line shifting operation of the data line selection block 930 included in the semiconductor memory device 900 of FIG. 21A. As in the embodiment described above, on the basis of a data line selection operation of the data line selection block 930, instead of blocking data in a defective cell from being output, data in a redundancy cell is controlled to be output. FIG. 21C shows a case where a memory cell connected to the fifth global data line GDL15 is a defective cell, and in this case, data transferred through the first to fourth global data lines GDL11 to GDL14 are output as first to fourth data to DQ0 to DQ3 through the first to fourth selection units 931 to 934, and an output of data transferred through the fifth global data line GDL15 is blocked. In addition, data transferred through the sixth to eighth global data lines GDL16 to GDL18 are output as fifth to seventh data to DQ4 to DQ6 through the fifth to seventh selection units 935 to 937, and data in the second redundancy memory cell group 922 is output as eighth data to DQ7 through the ninth global data line GDL21 and the eighth selection unit 938.

Figure 21D:
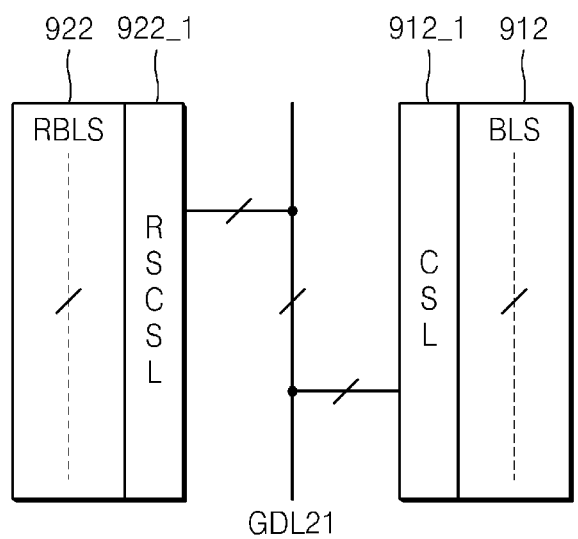

FIG. 21D shows an example in which a global data line GDL21 is connected to a redundancy cell. Only one memory cell group 912 is shown in FIG. 21D, and the memory cell group 912 includes a plurality of bit lines BLs connected to memory cells therein. The plurality of bit lines BLs are connected to the global data line GDL21 on the basis of a column selection operation of a column selection area 912_1.

Similarly, a redundancy memory cell group 922 includes a plurality of redundancy bit lines RBLs connected to redundancy cells therein. A redundancy column selection area 922_1 for connecting the redundancy memory cell group 922 to the global data line GDL21 is further included, and data in the redundancy cells is transferred through the global data line GDL21 on the basis of a column selection operation of the redundancy column selection area 922_1.

Furthermore, in one embodiment, the first set of the plurality of input/output nodes for the first array 910_1 and the second set of the plurality of input/output nodes for the second array 910_2 share same input/output nodes.

Figure 22:
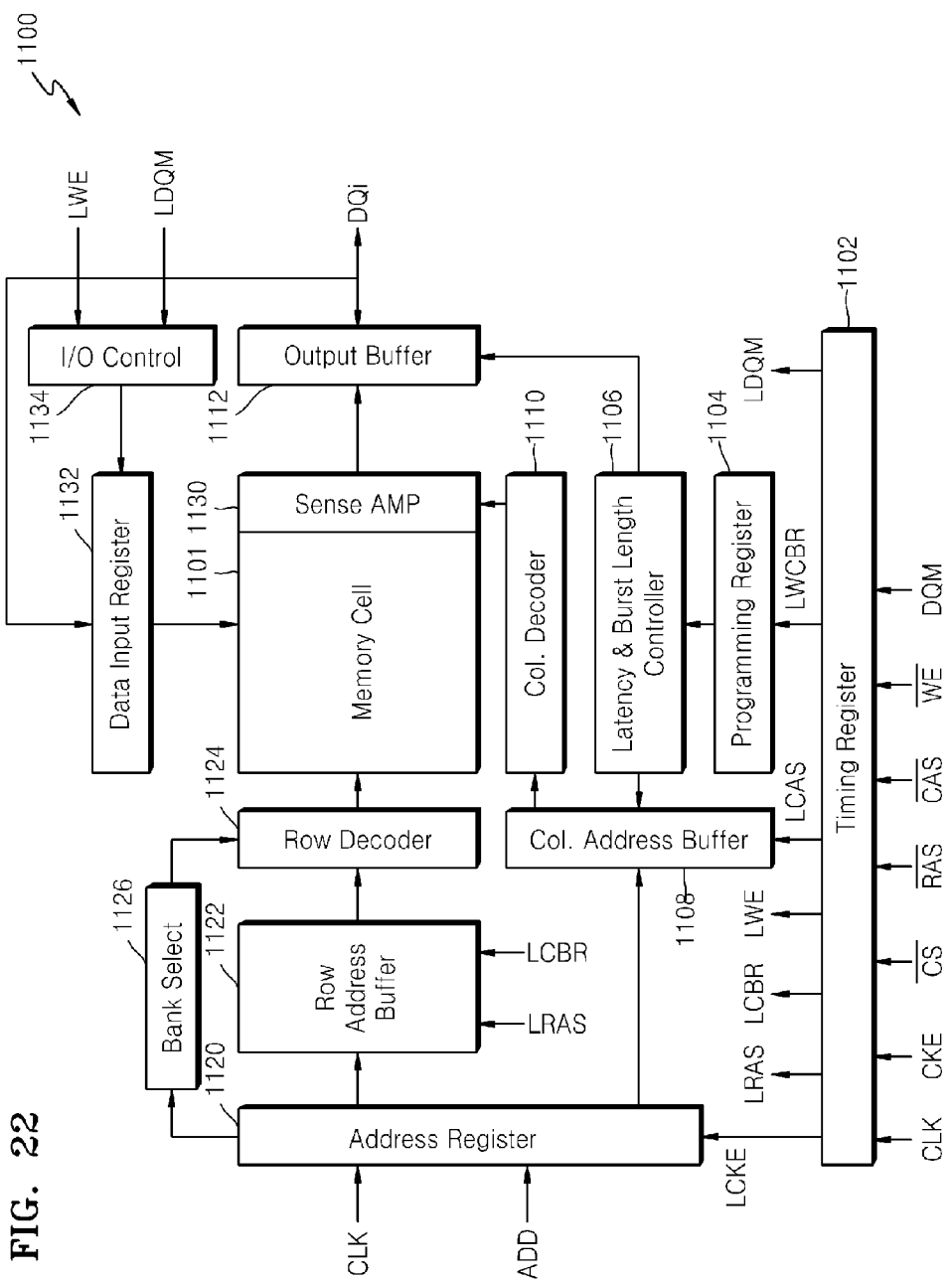
FIG. 22 is a detailed block diagram of a semiconductor memory device according to an embodiment of the inventive concepts.

FIG. 22 shows a semiconductor memory device 1100 including one of the embodiments of the inventive concepts. Referring to FIG. 22, the semiconductor memory device 1100 may include various kinds of circuit blocks for driving a memory cell array and a DRAM cell, and may be modified to include the repair structure and operation of one of the above described embodiments.

A timing register 1102 may be enabled when a chip select signal CS changes from a disable level (e.g., logic high) to an enable level (e.g., logic low). The timing register 1102 may receive command signals, such as a clock signal CLK. A clock enable signal CKE, a chip select bar signal $\overline{CS}$, a row address strobe bar signal $\overline{RAS}$, a column address strobe bar signal $\overline{CAS}$, a write enable bar signal $\overline{WE}$, and a data input/output mask signal DQM, and generate various kinds of internal command signals LRAS, LCBR, LWE, LCAS, LWCBR, LDQM for controlling the circuit blocks by processing the received command signals.

Some of the internal command signals generated by the timing register 1102 are stored in a programming register 1104. For example, latency information, burst length information, and so forth that are related to a data output may be stored in the programming register 1104. The internal command signals stored in the programming register 1104 may be provided to a latency & burst length controller 1106, and the latency & burst length controller 1106 may provide a control signal for controlling latency or a burst length in a data output to a column decoder 1110 via a column buffer 1108 or to an output buffer 1112.

An address register 1120 may receive an address ADD from the outside. A row address may be provided to a row decoder 1124 via a row address buffer 1122. In addition, a column address may be provided to the column decoder 1110 via the column buffer 1108. The row address buffer 1122 may further receive a refresh address generated by a refresh counter (not shown) therein in response to refresh commands LRAS and LCBR and may provide any one of the row address and the refresh address to the row decoder 1124. In addition, the address register 1120 may provide a bank signal for selecting a bank to a bank selection unit 1126.

The row decoder 1124 may decode the row address or the refresh address received from the row address buffer 1122 and enable word lines in a memory cell array 1101. The column decoder 1110 may decode the column address and perform a selection operation of bit lines in the memory cell array 1101. For example, a column selection line may be applied to the semiconductor memory device 1100 to perform a selection operation for the column selection line.

A sense amplifier 1130 may amplify data in a memory cell selected by the row decoder 1124 and the column decoder 1110 and provide the amplified data to the output buffer 1112. Data to be written in a memory cell may be provided to the memory cell array 1101 via a data input register 1132, and an input/output controller 1134 may control a data transfer operation through the data input register 1132.

Figure 23:
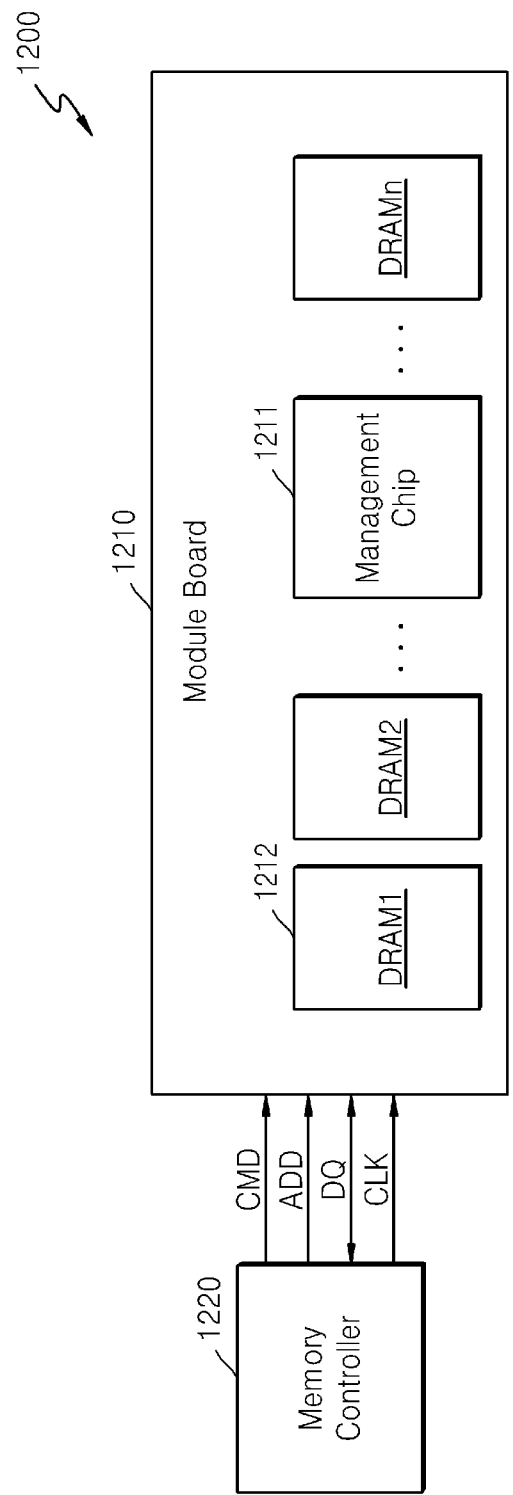
FIG. 23 is a block diagram of a memory system according to an embodiment of the inventive concepts.

FIG. 23 is a block diagram of a memory system 1200 according to an embodiment of the inventive concepts. As shown in FIG. 23, the memory system 1200 may include a memory module 1210 and a memory controller 1220. The memory module 1210 may include at least one semiconductor device mounted on a module board, e.g., at least one semiconductor memory device 1212 and a memory management chip 1211 for managing a memory operation. FIG. 23 shows DRAM chips as the at least one semiconductor memory device 1212, wherein the DRAM chips are structured to perform a repair operation disclosed in any of the embodiments described above. For example, each of the DRAM chips may include redundancy cells to block data in a weak cell from being output and output data in a redundancy cell instead on the basis of a data line shifting operation. The memory controller 1220 provides various signals, e.g., a command/address CMD/ADD and a clock signal CLK, for controlling the at least one semiconductor device included in the memory module 1210 and provides or receives data DQ to or from the memory module 1210 by communicating with the memory module 1210.

In the embodiment described above, some of the configurations and operations performed for a repair operation may be performed by the memory management chip 1211. For example, address information related to a weak cell may be stored in the memory management chip 1211, and accordingly, row and column addresses for enabling a redundancy cell may be provided from the memory management chip 1211 to the at least one semiconductor memory device 1212. In addition, the memory management chip 1211 may output control codes, such as thermometer codes, for controlling a data line shifting operation and provide the control codes to the at least one semiconductor memory device 1212.

Figure 24:
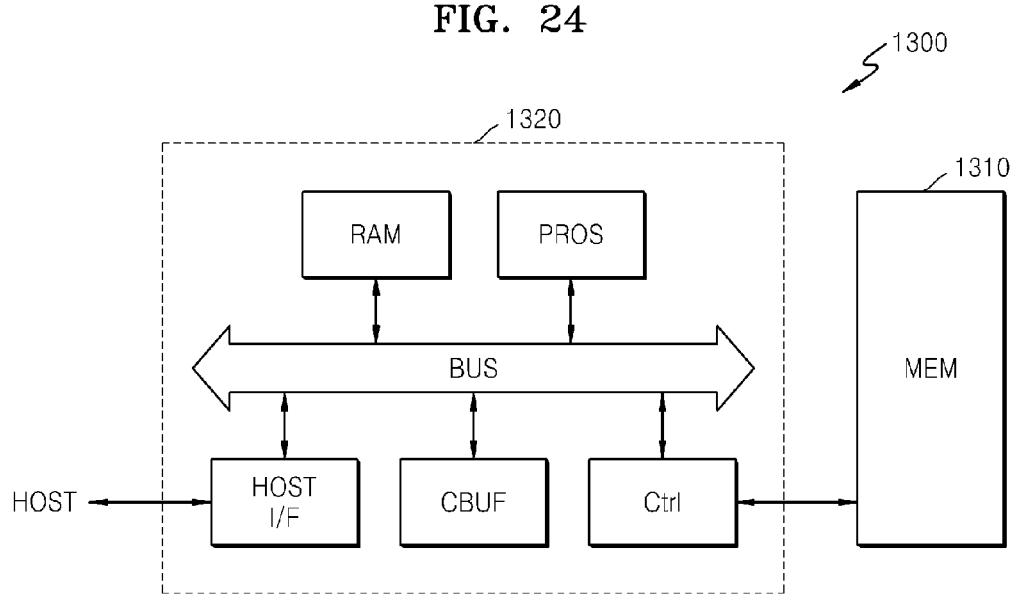
FIG. 24 is a block diagram of a semiconductor storage system according to an embodiment of the inventive concepts.

FIG. 24 is a block diagram of a semiconductor storage system 1300 according to an embodiment of the inventive concepts. The semiconductor storage system 1300 may include a semiconductor memory device according to an embodiment of the inventive concepts.

Referring to FIG. 24, the semiconductor storage system 1300 may include a non-volatile memory device 1310 and various function blocks 1320 related thereto. The non-volatile memory device 1310 may include a semiconductor memory device such as a flash memory device and may employ the structure and operation of any of the above described repair embodiments. As the various function blocks 1320, a processor (PROS), a RAM, a cache buffer (CBUF), a memory controller (Ctrl), and a host interface (HOST I/F) that are connected via a bus may be included. The RAM may include a semiconductor memory device according to an embodiment of the inventive concepts. The processor PROS controls the memory controller Ctrl to transmit and receive data to and from the non-volatile memory device 1310 in response to a request (command, address, or data) of a host. The processor PROS and the memory controller (Ctrl) in the semiconductor storage system 1300 may be implemented as a single ARM processor. Data required to operate the processor PROS may be loaded in the RAM.

The host interface HOST I/F receives a request of the host and transmits the request of the host to the processor PROS, or transmits data received from the non-volatile memory device 1310 to the host. The host interface HOST I/F may interface with the host using various protocols, such as Universal Serial Bus (USB), Man Machine Communication (MMC), Peripheral Component Interconnect-Express (PCI-E), Serial Advanced Technology Attachment (SATA), Parallel Advanced Technology Attachment (PATA), Small Computer System Interface (SCSI), Enhanced Small Device Interface (ESDI), and Intelligent Drive Electronics (IDE). Data to be transmitted to the non-volatile memory device 1310 or data received from the non-volatile memory device 1310 may be temporarily stored in the cache buffer CBUF.

The non-volatile memory device 1310 may be packaged using various types of packages, e.g., Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Figure 25:
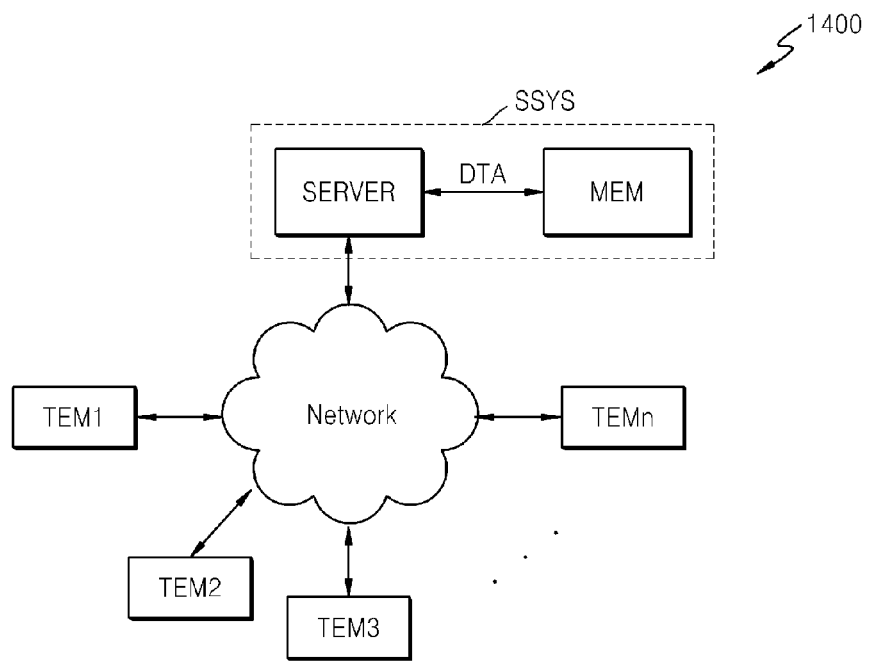
FIG. 25 is a block diagram of a network system according to an embodiment of the inventive concepts.

FIG. 25 is a block diagram of a network system 1400 according to an embodiment of the inventive concepts. The network system 1400 may include a semiconductor memory device according to of any of the above described repair embodiments.

Referring to FIG. 25, the network system 1400 may include a server system SSYS and a plurality of terminals TEM1 to TEMn that are connected to each other over a network. The server system SSYS may include a server for processing requests received from the plurality of terminals TEM1 to TEMn connected to the network and a semiconductor memory device MEM (e.g., Solid State Drive) for storing data corresponding to the received requests. Also, the server may include a semiconductor memory device (not shown) according to an embodiment of the inventive concepts.

Figure 26:
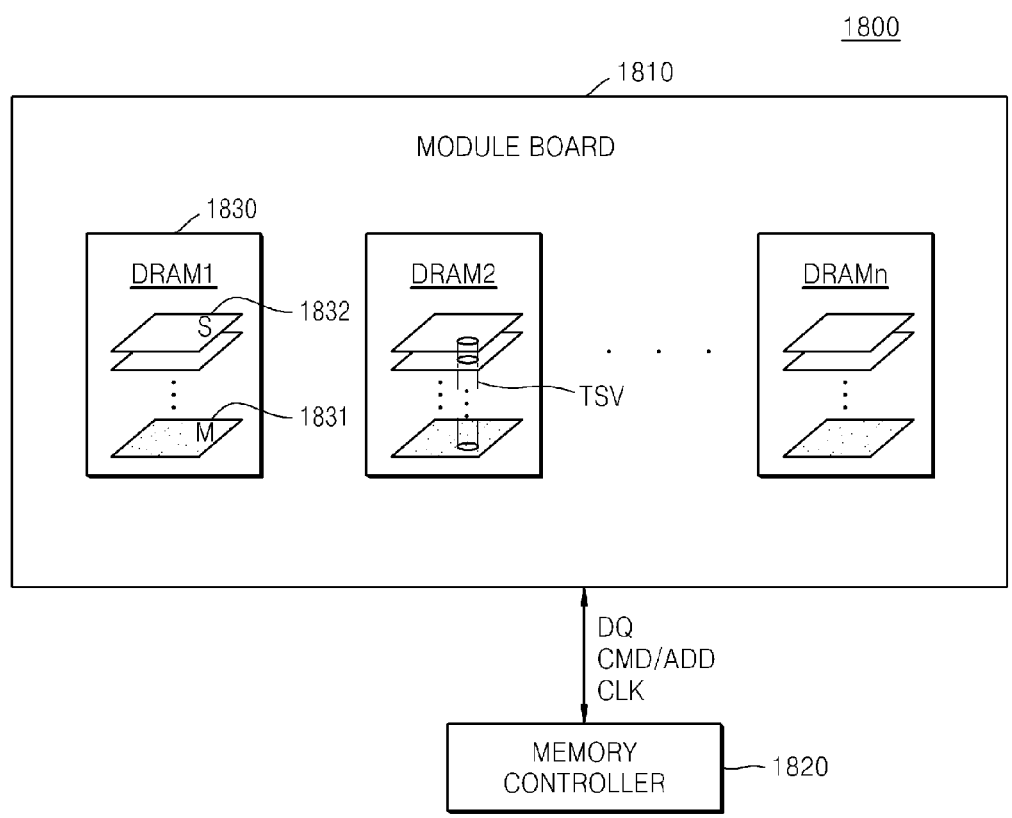
FIG. 26 is a block diagram of another memory system to which a semiconductor memory device according to an embodiment of the inventive concepts is applied.

FIG. 26 is a block diagram of another memory system 1800 to which a semiconductor memory device according to an embodiment of the inventive concepts is applied.

Referring to FIG. 26, the memory system 1800 may include a memory module 1810 and a memory controller 1820. The memory module 1810 may include at least one semiconductor memory device 1830 mounted on a module board. The at least one semiconductor memory device 1830 may be implemented by a DRAM chip, and each of the at least one semiconductor memory device 1830 may include a plurality of semiconductor layers. The plurality of semiconductor layers may include at least one master chip 1831 and at least one slave chip 1832. A signal may be transmitted between the plurality of semiconductor layers through a through-silicon via (TSV).

Although a structure in which a signal transfer between semiconductor layers is performed through the TSV is described in the current embodiment, the current embodiment is not limited thereto, and may also be applied to a structure layered through wire bonding, interpose, or wire-formed tapes.

In addition, a signal transfer between semiconductor layers may be performed by an optical input/output connection. For example, the semiconductor layers may be connected to each other using a radiative method using a radio frequency (RF) wave or an ultrasound wave, an inductive coupling method using magnetic induction, or a non-radiative method using magnetic field resonance.

The radiative method is a method of transferring a signal in a wireless manner by using an antenna, such as a monopole antenna or a planar inverted-F antenna (PIFA). Radiation occurs while an electric field and a magnetic field varying over time affect each other, and when an antenna of the same frequency exists, a signal may be received to meet a polarization characteristic of an incident wave. The inductive coupling method is a method of generating a magnetic field that is strong in one direction by winding a coil several times and generating coupling by approaching a coil resonating at a similar frequency to the wound coil. The non-radiative method is a method using evanescent wave coupling by which an electronic wave moves between two media resonating with the same frequency through a near distance magnetic field. Each of the master chip 1831 and the slave chip 1832 may include a reference voltage generator (not shown) according to the embodiments of the inventive concepts. The memory module 1810 may communicate with the memory controller 1820 via a system bus. Data DQ, command/address CMD/ADD, a clock signal CLK, and so forth may be transmitted and received between the memory module 1810 and the memory controller 1820 via the system bus.

While the inventive concepts has been particularly shown and described with reference to exemplary embodiments thereof, it will be understood that various changes in form and details may be made therein without departing from the spirit and scope of the following claims.

We claim:

1. A memory device, comprising:
  a memory cell array having at least a first memory cell group, a second memory cell group, a first redundancy memory cell group and a second redundancy memory cell group, the first memory cell group including a plurality of first memory cells associated with a first data line, the second memory cell group including a plurality of second memory cells associated with a second data line, the first redundancy memory cell group including a plurality of redundancy memory cells associated with a first redundancy data line, and the second redundancy memory cell group including a plurality of redundancy memory cells associated with a second redundancy data line; and
  a data line selection circuit configured to provide a data path between an input/output node and one of the first data line, the second data, the first redundancy data line, and the second redundancy data line, wherein the data line selection circuit includes a first selection unit corresponding to a first memory cell group and a second selection unit corresponding to a second memory cell group, the first redundancy data line is connected to the first selection unit and the second redundancy data line is connected to the second selection unit, data from the first redundancy data line and the second redundancy data line are output through the first selection unit or the second selection unit according to a selected output data width, and one or more of the first data line and the second data line are simultaneously replaced with the one or more of the first redundancy data line and the second redundancy data line, respectively, based on the selected output data width.

2. The memory device of claim 1, further comprising:
selection control logic configured to control the data line selection circuit based on the selected output data width for the memory device.

3. The memory device of claim 2, wherein the selection control logic is configured to control the data line selection circuit based on the selected output data width for the memory device and whether a defective memory cell in one of the first and second memory cell groups is detected.

4. The memory device of claim 1, further comprising:
selection control logic configured to control the data line selection circuit based on whether a defective memory cell in one of the first and second memory cell groups is detected.

5. The memory device of claim 1, wherein the data line selection circuit includes a multiplexer configured to provide the data path between the input/output node and one of the first data line, the second data line, the first redundancy data line and the second redundancy data line.

6. The memory device of claim 1, wherein
the memory cell array includes first to nth memory cell groups, where n is greater than or equal to 2, each of the first to nth memory cell groups is associated with first to nth data lines, respectively; and the data line selection circuit is configured to provide data paths between (i) the first redundancy data line, the second redundancy data line and the first to nth data lines and (ii) first to nth input/output nodes.

7. The memory device of claim 6, wherein
the data line selection circuit includes first to nth selection units, each of the first to nth selection units is configured to selectively provide a data path between a connection node and one of a set of selection nodes, the connection node of each of the first to nth selection units being associated with a respective one of the first to nth input/output nodes;

the first selection unit having at least one selection node connected to the first redundancy data line and having at least another selection node connected to the first data line;

the second selection unit having one selection node connected to the second redundancy data line, and having at least another selection node connected to the first data line and having yet another selection node connected to the second data line; and a ith selection unit having three selection nodes respectively connected to a (i−2)th data line-a the (i−1th) data line and the ith data line where i is 3 to n.

8. The memory device of claim 7, further comprising:
selection control logic configured to control the data line selection circuit based on the selected output data width for the memory device and whether a defective memory cell in one of the first to nth memory cell groups is detected.

9. The memory device of claim 8, wherein the selection control logic is configured to control the data line selection circuit to provide a data path between a ith memory cell group and the ith input/output node if the selected output data width is eight, wherein i is between 1 and 8.

10. The memory device of claim 9, wherein the selection control logic is configured to replace access via one of the first to eighth data lines with access via the first redundancy data line and the second redundancy data line if a detected defective memory cell exists in the one of the first to eight memory cell groups.

11. The memory device of claim 10, wherein
k is a whole number between 1 and n, and
if a kth memory cell group includes the detected defective memory cell, then the selection control logic is configured to control the data line selection circuit such that the first though kth input/output nodes are connected to the first redundancy data line, the second redundancy data line and the first through (k−1)th data lines, and the (k+1)th to the eighth input/output nodes are connected to the (k+1)th to eighth data lines.

12. The memory device of claim 10, wherein if the kth memory cell group includes the detected defective memory cell, then the selection control logic is configured to control the data line selection circuit such that the first though (k−1)th input/output nodes are connected to the first through (k−1)th input/output nodes, and the kth to the eighth input/output nodes are connected the (k+1)th to eighth data lines, the first redundancy data line and the second redundancy data line.

13. The memory device of claim 9, wherein
m is one of 1, 3, 5 and 7 in an odd operation mode and m is one of 2, 4, 6 and 8 in an even operation mode, and
the selection control logic controls the data lines selection circuit to provide a data path between a mth data line and a mth input/output node if the selected output data width is four.

14. The memory device of claim 13, wherein the selection control logic is configured to replace access via one of the first, third, fifth and seventh data lines with access via the first redundancy data line and the second redundancy data line if a detected defective memory cell exists in the one of the first, third, fifth and seventh memory cell groups in the odd operation mode, and the selection control logic is configured to replace access via one of the second, fourth, sixth and eighth data lines with access via the first redundancy data line and the second redundancy data line if a detected defective memory cell exists in the one of the second, fourth, sixth and eighth memory cell groups in the even operation mode.

15. The memory device of claim 8, wherein
i is between 1 and one of 16, 32 and 64, and
the selection control logic is configured to control the data line selection circuit to provide a data path between the ith memory cell group and the ith input/output node if the selected output data width is one of 16, 32 and 64.

16. The memory device of claim 15, wherein
p is one of 16, 32 and 64, and
the selection control logic is configured to replace access via one of a first to pth data lines with access via the first redundancy data line and the second redundancy data line if a detected defective memory cell exists in the one of the first to pth memory cell groups.

17. The memory device of claim 8, wherein
the data line selection circuit is configured to provide data paths between (i) the first redundancy data line, the second redundancy data lines and the first to nth data lines and (ii) the first to nth input/output nodes.

18. The memory device of claim 7, wherein each of the first to nth selection units includes a 3:1 multiplexer.

19. The memory device of claim 7, wherein at least one of the first to nth data lines is connected to a sense amplifier arranged in a lengthwise direction of the memory cell array, and the first redundancy data line and the second redundancy data line are connected to a sense amplifier arranged in a widthwise direction of the memory cell array.

20. The memory device of claim 1, wherein at least one of the first and second data lines is connected to a sense amplifier arranged in a lengthwise direction of the memory cell array, and the first redundancy data line and the second redundancy data line are connected to a sense amplifier arranged in a widthwise direction of the memory cell array.

21. A memory device, comprising:
- a memory cell array having at least first through nth memory cell groups and first and second redundancy memory cell groups, where n is greater than or equal to four, the first through nth memory cell groups associated with respective first through nth data lines, the first redundancy memory cell group associated with a first redundancy data line and the second redundancy memory cell group associated with a second redundancy data line; and
- a data line selection circuit configured to replace access to one of the first through nth memory cell groups via a respective one of the first through nth data lines with access to the first redundancy memory cell group via the first redundancy data line, and configured to simultaneously replace access to another of the first through nth memory cell groups via a respective one of the first through nth data lines with access to the second redundancy memory cell group via the second redundancy data line, wherein
    - the first through nth memory cell groups are classified into a first region and a second region,
    - when a first data width option is set, two data lines are simultaneously replaced with the first and second redundancy data lines, and
    - when a second data width option is set, one data line among a plurality of data lines corresponding to the first region is replaced with the first redundancy data line, or one data line among a plurality of data lines corresponding to the second region is replaced with the second redundancy data line.

22. The memory device of claim 21, further comprising:
selection control logic configured to control the data line selection circuit based on the selected output data width for the memory device and whether a defective memory cell in one of the first to nth memory cell groups is detected.

23. The memory device of claim 22, wherein
i is between 1 and 8, and n is at least 8, and
the selection control logic is configured to control the data line selection circuit to provide a data path between a ith memory cell group and a ith input/output node if the selected output data width is eight.

24. The memory device of claim 23, wherein
m is between 1 and n, and
the selection control logic is configured to replace access via one of a first to mth data lines with access via the first redundancy data line if a detected defective memory cell exists in the one of the first to mth memory cell groups, and the selection control logic is configured to replace access via one of a (m+1)th to nth data lines via the second redundancy data if a detected defective memory cell exists in one of a (m+1)th to nth memory cell groups.

25. The memory device of claim 23, wherein m is 1, 3, 5 and 7 in an odd operation mode and m is 2, 4, 6 and 8 in an even operation mode, and
the selection control logic controls the data lines selection circuit to provide a data path between a mth data line and a mth input/output node if the selected output data width is four.

26. The memory device of claim 25, wherein the selection control logic is configured to simultaneously replace access via two of the first, third, fifth and seventh data lines with access via the first and second redundancy data lines if a detected defective memory cell exists in the two of the first, third, fifth and seventh memory cell groups in the odd operation mode, and the selection control logic is configured to replace access via two of the second, fourth, sixth and eighth data lines with access via the first and second redundancy data lines if a detected defective memory cell exist in the two of the second, fourth, sixth and eighth memory cell groups in the even operation mode.

27. The memory device of claim 22, wherein
i is between 1 and one of 16, 32 and 64, and n is at least one of 32 and 64, and
the selection control logic is configured to control the data line selection circuit to provide a data path between a ith memory cell group and a ith input/output node if the selected output data width is one of 16, 32 and 64.

28. The memory device of claim 27, wherein
p is one of 16, 32 and 64, and
the selection control logic is configured to replace access via two of the first to pth data lines with access via the first and second redundancy data line if a detected defective memory cell exists in the one of a first to pth data lines.

29. The memory device of claim 21, wherein at least one of the first to nth data lines is connected to a sense amplifier arranged in a lengthwise direction of the memory cell array, and at least one of the first to nth data lines is connected to a sense amplifier arranged in a widthwise direction of the memory cell array.

30. A memory device, comprising:
- a memory array having a plurality of memory cell groups and a redundancy memory cell group, each memory cell group associated with a respective data line, the redundancy memory cell group associated with a redundancy data line;
- a plurality of input/output nodes; and
- a data line selection circuit configured to provide data paths between (i) the plurality of input/output nodes and (ii) the data lines and the redundancy data line, the data line selection circuit including a selection unit associated with each of the plurality of input/output nodes, each selection unit associated with only two of the redundancy data line and the data lines, and
the data line selection circuit configured to,
    provide data paths between odd ones of the plurality of input/output nodes and odd ones of the data lines in an odd mode of operation,
    provide data paths between even ones of the plurality of input/output nodes and even ones of the data lines in an even mode of operation, and
    replace access via one of the data lines with access via the redundancy data line such that a detected defective memory cell in one of the plurality of memory cell groups is replaced with one of the plurality of redundancy memory cells regardless of the even and odd operating mode, wherein
the data line selection circuit includes,
a first selection unit configured to transmit data in the even mode of operation,
a second selection unit configured to transmit data in the odd mode of operation, and
even/odd selection unit configured to provide data from the redundancy data line with the first selection unit in the even mode of operation and provide data from the redundancy data line with the second selection unit in the odd mode of operation.

31. The memory device of claim 30, wherein
the plurality of memory cell groups includes first to nth memory cell groups associated with first to nth data lines;
the plurality of input/output nodes includes first to nth input/output nodes;
the plurality of selection units includes first to nth selection units, each of the first to nth selection units configured to provide a data path between a connection node and one of two selection nodes, the connection node of each of the first to nth selection units associated with a respective one of the first to nth input/output nodes;
the first selection unit having one of the two selection nodes associated with the redundancy data line and another of the two selection nodes associated with the first data line;
the second selection unit having one of the two selection nodes associated with the redundancy data line and another of the two selection nodes associated with the second data line; and
a ith selection unit having one of the two selection nodes associated with a (i−2)th data line and another of the two selection nodes associated with a ith data line.

32. The memory device of claim 31, wherein each of the first to nth selection units is a 2:1 multiplexer.

33. The memory device of claim 31, wherein the even/odd selection unit is connected to the redundancy data line and configured to provide a data path between the redundancy data line and one of an even redundancy data line and an odd redundancy data line based on the even and odd operating mode;
the first selection unit having one of the two selection nodes associated with the odd redundancy data line; and
the second selection unit having one of the two selection nodes associated with the even redundancy data line.

34. The memory device of claim 33, wherein the even/odd selection unit includes a demultiplexer.

35. The memory device of claim 33, wherein the even/odd selection unit includes a first switch selectively connecting the redundancy data line and the odd redundancy data line, and the even/odd selection unit includes a second switch selectively connecting the redundancy data line and the even redundancy data line.

36. The memory device of claim 33, further comprising:
selection control logic configured to control the data line selection circuit and the even/odd selection unit based on whether the even or odd operation mode has been selected.

37. The memory device of claim 36, wherein the selection control logic is configured to control the data line selection circuit based on whether the even or odd operation mode has been selected and whether a defective memory cell in one of the first to nth memory cell groups is detected.

38. The memory device of claim 37, wherein the selection control logic includes a storage device storing a mode indicator indicating whether the even or odd operation mode has been selected.

39. The memory device of claim 31, further comprising:
selection control logic configured to control the data line selection circuit based on a selected output data width for the memory device and whether a defective memory cell in one of the first to nth memory cell groups is detected.

40. The memory device of claim 31, wherein
m is 1 to 8;
the selection control logic controls the data lines selection circuit to provide a data path between a mth data line and a mth input/output node if the selected output data width is eight;
the selection control logic controls the data lines selection circuit to provide a data path between the kth data line and the kth input/output node if the selected output data width is four, wherein k is 1, 3, 5 and 7 in the odd operation mode and k is 2, 4, 6 and 8 in the even operation mode.

41. A memory device, comprising:
a first memory cell array including a first plurality of memory cell groups and a first redundancy memory cell group, each of the first plurality of memory cell groups associated with respective first data lines, the first redundancy memory cell group associated with one of the first data lines;
a second memory cell array including a second plurality of memory cell groups and a second redundancy memory cell group, each of the second plurality of memory cell group associated with respective second data lines, and the second redundancy memory cell group associated with one of the second data lines; and
a data line selection circuit configured to selectively provide data paths between the first data lines and a first set of a plurality of input/output nodes, and configured to selectively provide data paths between the second data lines and a second set of the plurality of input/output nodes, the data line selection circuit configured to selectively replace a detected defective memory cell in the first plurality of memory groups with a redundancy memory cell in the second redundancy memory cell group, wherein
the data line selection circuit includes a plurality of first selection units corresponding to the first memory cell array and a plurality of second selection units corresponding to the second memory cell array,
at least one redundancy data line corresponding to the first and second redundancy memory cell groups is shifted according to a data line shifting operation, and
data from the second redundancy memory cell group is transmitted through one of the second data lines and one of the first selection units.

42. The memory device of claim 41, wherein further comprising:
a first column decoder associated with the first memory cell array;
a second column decoder associated with the second memory cell array;
a row decoder associated with both the first and second memory cell array.

43. The memory device of claim 41, wherein at least one of the selection units associated with an input/output node of the first set connected to at least one of the first data lines and connected to the second data line associated with the second redundancy memory cell group.

44. The memory device of claim 43, wherein at least one of the selection units associated with an input/output node of the second set is connected to at least one of the second data lines and connected to the first data line associated with the first redundancy memory cell group.

45. The memory device of claim 41, wherein the data line selection circuit is configured to selectively replace a detected defective memory cell in the second plurality of memory groups with a redundancy memory cell in the first redundancy memory cell group.

46. The memory device of claim 41, wherein the first and second memory cell arrays are on different chips.

47. The memory device of claim 41, wherein the first set of the plurality of input/output nodes and the second set of the plurality of input/output nodes share same input/output nodes.

48. A method of replacing defective memory cells in a memory cell array having at least a first memory cell group, a second memory cell group, a first redundancy memory cell group and a second redundancy memory cell group, the first memory cell group including a plurality of first memory cells associated with a first data line, the second memory cell group including a plurality of second memory cells associated with a second data line, the first redundancy memory cell group including a plurality of redundancy memory cells associated with a first redundancy data line, and the second redundancy memory cell group including a plurality of redundancy memory cells associated with a second redundancy data line, the method comprising:
providing, via a data line selection circuit, a data path between an input/output node and one of the first data line, the second data, the first redundancy data line and the second redundancy data line, wherein
the data line selection circuit includes a first selection unit corresponding to a first memory cell group and a second selection unit corresponding to a second memory cell group,
the first redundancy data line is connected to the first selection unit and the second redundancy data line is connected to the second selection unit,
data from the first redundancy data line and the second redundancy data line are output through the first selection unit or the second selection unit according to a selected output data width, and
one or more of the first data line and the second data line are simultaneously replaced with the one or more of the first redundancy data line and the second redundancy data line, respectively, based on the selected output data width.

49. A method of replacing defective memory cells in a memory cell array having at least first through nth memory cell groups and first and second redundancy memory cell groups, where n is greater than or equal to four, the first through nth memory cell groups associated with respective first through nth data lines, the first redundancy memory cell group associated with a first redundancy data line and the second redundancy memory cell group associated with a second redundancy data line, the method comprising:
replacing access to one of the first through nth memory cell groups via a respective one of the first through nth data lines with access to the first redundancy memory cell group via the first redundancy data line; and
simultaneously replacing access to another of the first through nth memory cell groups via a respective one of the first through nth data lines with access to the second redundancy memory cell group via the second redundancy data line, wherein
the first through nth memory cell groups are classified into a first region and a second region,
when a first data width option is set, two data lines are simultaneously replaced with the first and second redundancy data lines, and
when a second data width option is set, one data line among a plurality of data lines corresponding to the first region is replaced with the first redundancy data line, or one data line among a plurality of data lines corresponding to the second region is replaced with the second redundancy data line.

50. A method of replacing defective memory cells in a memory array having a plurality of memory cell groups and a redundancy memory cell group, each memory cell group associated with a respective data line, the redundancy memory cell group associated with a redundancy data line, the method comprising:
providing data paths between (i) a plurality of input/output nodes and (ii) the data lines and the redundancy data line using a plurality of selection units included in a data line selection circuit, each selection unit associated with one of the plurality of input/output nodes, each selection unit associated with only two of the redundancy data line and the data lines, the providing including,
providing data paths between odd ones of the plurality of input/output nodes and odd ones of the data lines in an odd mode of operation,
providing data paths between even ones of the plurality of input/output nodes and even ones of the data lines in an even mode of operation, and
replacing access via one of the data lines with access via the redundancy data line such that a detected defective memory cell in one of the plurality of memory cell groups is replaced with one of the plurality of redundancy memory cells regardless of the even and odd operating mode, wherein
the data line selection circuit includes,
a first selection unit configured to transmit data in the even mode of operation,
a second selection unit configured to transmit data in the odd mode of operation, and
even/odd selection unit configured to provide data from the redundancy data line with the first selection unit in the even mode of operation and provide data from the redundancy data line with the second selection unit in the odd mode of operation.

51. A method of replacing defective memory cells in a memory device include a first memory cell array and a second memory cell array,
the first memory cell array including a first plurality of memory cell groups and a first redundancy memory cell group, each of the first plurality of memory cell groups associated with respective first data lines, the first redundancy memory cell group associated with one of the first data lines,
the second memory cell array including a second plurality of memory cell groups and a second redundancy memory cell group, each of the second plurality of memory cell groups associated with respective second data lines, and the second redundancy memory cell group associated with one of the second data lines,
the method comprising:
selectively replacing, via a data line selection circuit, a detected defective memory cell in the first plurality of memory groups with a redundancy memory cell in the second redundancy memory cell group, wherein the data line selection circuit includes a plurality of first selection units corresponding to the first memory cell array and a plurality of second selection units corresponding to the second memory cell array, at least one redundancy data line corresponding to the first and second redundancy memory cell groups is shifted according to a data line shifting operation, and data from the second redundancy memory cell group is transmitted through one of the second data lines and one of the first selection units.

\* \* \* \* \*